United States Patent
Smith et al.

(10) Patent No.: US 7,363,099 B2
(45) Date of Patent: Apr. 22, 2008

(54) INTEGRATED CIRCUIT METROLOGY

(75) Inventors: Taber H. Smith, Fremont, CA (US); David White, Cambridge, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 2 days.

(21) Appl. No.: 10/200,660

(22) Filed: Jul. 22, 2002

(65) Prior Publication Data

US 2003/0229410 A1    Dec. 11, 2003

Related U.S. Application Data

(63) Continuation-in-part of application No. 10/165,214, filed on Jun. 7, 2002, and a continuation-in-part of application No. 10/164,844, filed on Jun. 7, 2002, and a continuation-in-part of application No. 10/164,847, filed on Jun. 7, 2002, and a continuation-in-part of application No. 10/164,842, filed on Jun. 7, 2002.

(51) Int. Cl.
   *G06F 19/00*       (2006.01)
(52) U.S. Cl. .......................... 700/121; 702/57; 438/14
(58) Field of Classification Search ............... 700/117, 700/121; 216/59, 84; 702/57; 438/7–9, 438/11, 14; 716/4
   See application file for complete search history.

(56) References Cited

U.S. PATENT DOCUMENTS 5,124,927 A   6/1992  Hopewell
5,581,475 A   12/1996 Majors
5,597,668 A   1/1997  Nowak et al.
5,663,076 A   9/1997  Rostoker et al.

(Continued)

FOREIGN PATENT DOCUMENTS

EP    0 453 753    10/1991

(Continued)

OTHER PUBLICATIONS

Boning, Duane et al., "Statistical metrology of interlevel dielectric thickness variation," *Proceedings of the SPIE Symposium on Microelectronic Manufacturing*, Oct. 1994, SPIE vol. 2334, pp. 316-327.

(Continued)

*Primary Examiner*—Leo Picard
*Assistant Examiner*—Sean Shechtman
(74) *Attorney, Agent, or Firm*—Bingham McCutchen LLP

(57) ABSTRACT

Sites to be measured on a device that is to be fabricated using at least one fabrication process, are selected based on a pattern-dependent model of the process. A metrology tool to measure a parameter of a semiconductor device includes a control element to select sites for measurement based on a pattern dependent model of a process with respect to the device. Problematic areas, within a chip or die and within a wafer, are identified that result from process variation. The variation is identified and characterized, and the location of each site is stored. The sites may be manually entered into a metrology tool or the method will automatically generate a measurement plan. Process variation and electrical impact are used to direct the measurement of within-die and wafer-level integrated circuit locations.

102 Claims, 38 Drawing Sheets

U.S. PATENT DOCUMENTS

| | | | |
|---|---|---|---|
| 5,705,301 A | 1/1998 | Garza et al. | |
| 5,763,955 A | 6/1998 | Findley et al. | |
| 5,798,298 A | 8/1998 | Yang et al. | |
| 5,821,621 A | 10/1998 | Jeng | |
| 5,854,125 A | 12/1998 | Harvey | |
| 5,861,342 A | 1/1999 | Gabriel et al. | |
| 5,903,469 A | 5/1999 | Ho | |
| 5,920,487 A | 7/1999 | Reich et al. | |
| 5,923,563 A | 7/1999 | Lavin et al. | |
| 5,923,947 A | 7/1999 | Sur | |
| 5,948,573 A | 9/1999 | Takahashi | |
| 5,972,541 A | 10/1999 | Sugasawara et al. | |
| 6,049,789 A | 4/2000 | Frison et al. | |
| 6,081,272 A | 6/2000 | Morimoto | |
| 6,093,631 A | 7/2000 | Jaso | |
| 6,109,775 A | 8/2000 | Tripathi et al. | |
| 6,118,137 A | 9/2000 | Fulford et al. | |
| 6,124,197 A * | 9/2000 | Fulford | 438/618 |
| 6,157,947 A | 12/2000 | Watanabe et al. | |
| 6,176,992 B1 | 1/2001 | Talieh | |
| 6,230,299 B1 | 5/2001 | McSherry et al. | |
| 6,249,904 B1 | 6/2001 | Cobb | |
| 6,255,125 B1 | 7/2001 | Schmidt et al. | |
| 6,259,115 B1 | 7/2001 | You et al. | |
| 6,263,476 B1 * | 7/2001 | Browen et al. | 716/4 |
| 6,289,499 B1 | 9/2001 | Rieger et al. | |
| 6,309,956 B1 | 10/2001 | Chiang et al. | |
| 6,323,113 B1 | 11/2001 | Gabriel et al. | |
| 6,327,555 B1 | 12/2001 | Shimizu et al. | |
| 6,328,872 B1 | 12/2001 | Talieh et al. | |
| 6,343,370 B1 | 1/2002 | Taoka et al. | |
| 6,344,408 B1 | 2/2002 | Chen et al. | |
| 6,344,409 B1 | 2/2002 | Jaso | |
| 6,352,623 B1 | 3/2002 | Volodarsky et al. | |
| 6,355,387 B1 | 3/2002 | Fujinaga et al. | |
| 6,380,087 B1 | 4/2002 | Gupta et al. | |
| 6,396,158 B1 | 5/2002 | Travis | |
| 6,486,066 B2 | 11/2002 | Cleeves et al. | |
| 6,539,321 B2 | 3/2003 | Bruce et al. | |
| 6,550,041 B1 | 4/2003 | McBride | |
| 6,556,884 B1 * | 4/2003 | Miller et al. | 700/121 |
| 6,556,947 B1 * | 4/2003 | Scheiner et al. | 702/172 |
| 6,562,639 B1 | 5/2003 | Minvielle et al. | |
| 6,567,964 B2 | 5/2003 | Shin et al. | |
| 6,578,174 B2 | 6/2003 | Zizzo | |
| 6,578,188 B1 | 6/2003 | Pang et al. | |
| 6,611,045 B2 | 8/2003 | Travis et al. | |
| 6,613,688 B1 | 9/2003 | Brown et al. | |
| 6,625,801 B1 | 9/2003 | Pierrat et al. | |
| 6,651,226 B2 | 11/2003 | Houge et al. | |
| 6,660,569 B1 | 12/2003 | Barthelmess et al. | |
| 6,665,856 B1 | 12/2003 | Pierrat et al. | |
| 6,671,570 B2 * | 12/2003 | Schulze | 700/121 |
| 6,691,297 B1 | 2/2004 | Misaka et al. | |
| 6,704,920 B2 | 3/2004 | Brill et al. | |
| 6,708,129 B1 * | 3/2004 | Pasadyn et al. | 702/81 |
| 6,708,318 B2 | 3/2004 | Satoh et al. | |
| 6,751,785 B1 | 6/2004 | Oh | |
| 6,866,974 B2 | 3/2005 | Kim et al. | |
| 6,873,720 B2 | 3/2005 | Cai et al. | |
| 6,893,800 B2 | 5/2005 | Jessen et al. | |
| 6,904,581 B1 | 6/2005 | Oh | |
| 7,174,520 B2 | 2/2007 | White et al. | |
| 7,243,316 B2 | 7/2007 | White et al. | |
| 2001/0031506 A1 | 10/2001 | Plat et al. | |
| 2001/0052107 A1 | 12/2001 | Anderson et al. | |
| 2002/0045110 A1 | 4/2002 | Ohnuma | |
| 2002/0051567 A1 | 5/2002 | Ganz et al. | |
| 2002/0083401 A1 | 6/2002 | Breiner et al. | |
| 2002/0106837 A1 | 8/2002 | Cleeves et al. | |
| 2002/0157076 A1 | 10/2002 | Asakawa | |
| 2002/0162082 A1 | 10/2002 | Cwynar et al. | |
| 2003/0084416 A1 | 5/2003 | Dai et al. | |
| 2003/0107134 A1 | 6/2003 | Lee | |
| 2003/0199150 A1 | 10/2003 | Permana et al. | |
| 2003/0228714 A1 | 12/2003 | Smith et al. | |
| 2003/0229412 A1 | 12/2003 | Smith et al. | |
| 2003/0229479 A1 | 12/2003 | Smith et al. | |
| 2003/0229868 A1 | 12/2003 | White et al. | |
| 2003/0229875 A1 | 12/2003 | Smith et al. | |
| 2003/0229880 A1 | 12/2003 | White et al. | |
| 2003/0229881 A1 | 12/2003 | White et al. | |
| 2003/0237064 A1 | 12/2003 | White et al. | |
| 2004/0044984 A1 | 3/2004 | Keogan et al. | |
| 2004/0058255 A1 | 3/2004 | Jessen et al. | |
| 2004/0076896 A1 | 4/2004 | Kim et al. | |
| 2004/0107410 A1 | 6/2004 | Misaka et al. | |
| 2005/0037522 A1 | 2/2005 | Smith et al. | |
| 2005/0132306 A1 | 6/2005 | Smith et al. | |
| 2005/0196964 A1 | 9/2005 | Smith et al. | |
| 2005/0235246 A1 | 10/2005 | Smith et al. | |
| 2005/0235248 A1 | 10/2005 | Smith et al. | |
| 2005/0289500 A1 | 12/2005 | Misaka et al. | |

FOREIGN PATENT DOCUMENTS

| | | |
|---|---|---|
| WO | WO 03/079240 A2 | 9/2003 |
| WO | WO 03/079240 A3 | 9/2003 |

OTHER PUBLICATIONS

Boning, Duane et al., "Models for Pattern Dependencies: Capturing Effects in Oxide, STI, and Copper CMP," Jul. 17, 2001, Semicon West.

Boning, D. et al., *"Pattern Dependent Modeling* for CMP Optimization and Control," MRS Spring Meeting, Proc. Symposium P: Chemical Mechanical Polishing, San Francisco, CA, Apr. 1999.

Boning, Duane S. et al., "A General Semiconductor Process Modeling Framework," *IEEE Transactions on Semiconductor Manufacturing*, vol. 5, No. 4, Nov. 1992, pp. 266-280.

Chen, Yu et al., "Monte-Carlo Algorithms for Layout Density Control," Asia and South Pacific Design Automation Conference, Jan. 2002, pp. 523-528.

Chen, Yu et al., "Hierarchical Dummy Fill for Process Uniformity," Asia and South Pacific Design Automation Conference, Jan. 2001, pp. 139-144.

Chen, Yu et al., "Practical Iterated Fill Synthesis for CMP Uniformity," ACM/IEEE Design Automation Conference, Jun. 2000, pp. 671-674.

Davis, Joseph C. et al., "Automatic Synthesis of Equipment Recipes from Specified Wafer-State Transitions," *IEEE Transactions on Semiconductor Manufacturing*, vol. 11, No. 4, Nov. 1998, pp. 527-536.

Hosack, Harold H. et al., "Recent Advances in Process Synthesis for Semiconductor Devices," *IEEE Transactions on Electron Devices*, vol. 45, No. 3, Mar. 1998, pp. 626-633.

Kahng, Andrew B. et al., "New and Exact Filling Algorithms for Layout Density Control," UCLA Department of Computer Science, Los Angeles, CA, 1999.

Kahng, Andrew B. et al., "Filling and Slotting: Analysis and Algorithms," International Symposium on Physical Design, Monterey, CA, 1998, pp. 95-102.

Kahng, Andrew B. et al., "New Multilevel and Hierarchical Algorithms for Layout Density Control," UCLA Department of Computer Science, Los Angeles, CA, 1999.

Kahng, Andrew B. et al., "Filling Algorithms and Analysis for Layout Density Control," *IEEE Transactions on Computer-Aided Design of Integrated Circuits and Systems*, vol. 18, No. 4, Apr. 1999, pp. 445-462.

Kim, Yoo-Hyon et al., "CHAMPS (CHemicAl-Mechnical Planarization Simulator)," International Conference on Simulation of Semiconductor Processes and Devices, Seattle, WA, Sep. 6-8, 2000.

Lee, Keun-Ho, "Analyzing the Effects of Floating Dummy-Fills: From Feature Scale Analysis to Full-Chip RC Extraction," Samsung Electronics Co., Ltd, Korea. 2001.

Lee, Brian et al, "Using Smart Dummy Fill and Selective Reverse Etchback for Pattern Density Equalization," *Proc. CMP-MIC*, Santa Clara, CA, Mar. 2000, pp. 255-258.

McGhee, John et al., "The MMST Computer-Integrated Manufacturing System Framework," *IEEE Transaction of Semiconductor Manufacturing*, vol. 7, No. 2, May 1994, pp. 107-116.

Mehrotra, V. and Duane Boning, "Technology Scaling Impact of Variation on Clock Skew and Interconnect Delay," *International Interconnect Technology Conference (IITC)*, San Francisco, CA, Jun. 2001.

Mehrotra, V. et al., "A Methodology for Modeling the Effects of Systematic Within-Die Interconnect and Device Variation on Curcuit Performance," Design Automation Conference, Los Angeles, CA, Jun 2000.

Mehrotra, V. et al., "Modeling the Effects of Manufacturing Variation on High-Speed Microprocessor Interconnect Performance," Annual ACM IEEE Design Automation Conference, Los Angeles, CA, 2000, pp. 168-171.

Moyne, William Patrick, "Enhancing MEMS Design Using Statistical Process Information," Massachusetts Institute of Technology, Department of Electrical Engineering and Computer Science, Apr. 7, 2000.

Ouma, Dennis et al., "An Integrated Characterization and Modeling Methodology for CMP Dielectric Planarization," International Interconnect Technology Conference, San Francisco, CA, Jun. 1998.

Park, Jin-Ku, "An Exhaustive Method for Characterizing the Interconnect Capacitance Considering the Floating Dummy-Fills by Employing an Efficient Field Solving Algorithm," International Conference on Simulation of Semiconductor Processes and Devices, 2000, pp. 98-101.

Park, Tae H. et al., "Pattern Dependent Modeling of Electroplated Copper Profiles," International Interconnect Technology Conference (IITC), Jun. 2001.

Park, T. et al., "Electrical Characterization of Copper Chemical Mechanical Polishing," SEMATECH, Austin, TX, Feb., 1999.

Park, T. et al., "Pattern and Process Dependencies in Copper Damascene Chemical Mechanical Polishing Processes," VLSI Multilevel Interconnect Conference (VMIC), Santa Clara, CA, Jun. 1998.

Peters, Laura, "Removing Barriers to Low-k Dielectric Adoption," *Semiconductor International*, May 1, 2002.

Sakurai, Takayasu, "Closed-Form Expressions for Interconnection Delay, Coupling, and Crosstalk in VLSI's," *IEEE Transactions on Electron Devices*, vol. 40, No. 1, Jan. 1993.

Saxena et al., "A methodology for the top-down synthesis of semiconductor process flows," Proc. 3rd IEEE/SEMI Int. Symp. Semiconductor Manufacturing, pp. 36-40, 1995.

Singer, Peter, "Progress in Copper: A Look Ahead," *Semiconductor International*, May 1, 2002.

Smith, Taber H., Thesis entitled "Device Independent Process Control of Dielectric Chemical Mechanical Polishing", MIT, Sep. 27, 1999.

Smith, Taber H. et al., "A CMP Model Combining Density and Time Dependencies," Proc. CMP-MIC, Santa Clara, CA, Feb. 1999.

Stine, Brian E., Thesis entitled "A General Methodology for Assessing and Characterizing Variation in Semiconductor Manufacturing", MIT, Sep. 1997.

Stine, Brian E. and Rakes Vallishayee, "On the Impact of Dishing in Metal CMP Processes on Circuit Performance," International Workshop on Statistical Metrology Technical Papers, 1998, pp. 64-67.

Stine, Brian E. et al., "A Simulation Methodology for Assessing the Impact of Spatical/Pattern Dependent Interconnect Parameter Variation on Circuit Performance," 1997 International Electron Devices Meeting, Washington, D.C., Dec. 1997, pp. 133-136.

Stine, B. et al, "A Closed-From Analytic Model for ILD Thickness Variation in CMP Processes," Proc. CMP-MIC, Santa Clara, CA, Feb. 1997.

Stine, Brian E. et al., "The Physical and Electrical Effects of Metal-Fill Patterning Practices for Oxide Chemical-Mechanical Polishing Processes," *IEEE Transactions of Electron Devices*, vol. 45, No. 3, Mar. 1998, pp. 665-679.

Tugbawa, Tamba et al., "A Mathematical Model of Pattern Dependencies Cu CMP Processes," CMP Symposium, Electrochemical Society Meeting, Honolulu, HA, Oct. 1999.

Tugbawa, Tamba E. et al., "Integrated Chip-Scale Simulation of Pattern Dependencies in Copper Electroplating and Copper Chemical Mechanical Polishing Processes," International Interconnect Technology Conference, San Francisco, CA, Jun. 2002.

Tugbawa, Tamba et al., "Framework for Modeling of Pattern Dependencies in Multi-Step Cu CMP Processes," SEMICON West 2000, Jul 11, 2000.

Tugbawa, Tamba et al., "Modeling of Pattern Dependencies for Multi-Level Copper Chemical-Mechanical Polishing Processes," Material Research Society Spring Meeting, San Francisco, CA, Apr. 2001.

Tuinhout, Hans P. and Maarten Vertregt, "Characterization of Systematic MOSFET Current Factor Mismatch Caused by Metal CMP Dummy Structures," *IEEE Transactions on Semiconductor Manufacturing*, vol. 14, No. 4, Nov. 2001, pp. 302-312.

Zaman, Mohammed H. et al., "Automatic Generation of Thin Film Process Flows—Part I: Basic Algorithms," *IEEE Transactions on Semiconductor Manufacturing*, vol 12, No. 1, Feb. 1999, pp. 116-128.

Zaman, Mohammed H. et al., "Automatic Generation of Thin Film Process Flows–Part II: Recipe Generation, Flow Evaluation, and System Framework," *IEEE Transactions on Semiconductor Manufacturing*, vol. 12, No. 1, Feb. 1999, pp. 129-138.

"MIT Statistical Metrology," Publications List, http://www-mtl.mit.edu/Metrology/PAPERS/, 1994-2003.

Conrad et al., "Modeling Considerations, Calibration Issues, and Metrology Methods for Resist-Bias Models", in Metrology, Inspection, and Process Control Microlithography XIII, ed.by B. Singh, Proc. SPIE 3677, pp. 940-955 (1999).

Baker, "Using Calibre In A Design for Manufacturing Environment", Deep Submicron Technical Publication, Mentor Graphics, Sep. 2001.

Ouma et al., "An Integrated Characterization and Modeling Methodology for CMP dielectric Planarization," Proc. Of Interconnect Technology Conference, pp. 67-69, Feb. 1998.

Lee et al., "Analyzing The Effects of Floating Dummy-Fills: From Feature Scale Analysis to Full-Chip RC Extraction," Proc. Of IEDM 2001, Dec. 2001.

Slide Presentation Exhibit A.

Slide Presentation Exhibit B1.

Slide Presentation Exhibit B2.

Praesagus Business Plan, Exhibit C.

Tian et al., "Model-Based Dummy Feature Placement for Oxide Chemical-Mechanical Polishing Manufacturability", Proceedings of the 37th Design Automation Conference, pp. 667-670.

Ohta, et al. "A New SP (simultaneous polishing) Model for Copper CMP Processes" International Conference on Simulation of Semiconductor Processes and Devices (SISPAD '02), Piscathaway, N.J. Sep. 4-6, 2002, pp. 257-260.

International Search Report dated Nov. 24, 2004 for PCT Appl. No. PCT/US03/17655.

Supplemental European Search Report dated Apr. 26, 2007 for Appl. No. 03741876.1.

Office Action dated Jun. 28, 2004 for U.S. Appl. No. 10/321,298.

Office Action dated Dec. 15, 2004 for U.S. Appl. No. 10/321,298.

Office Action dated jul. 12, 2005 for U.S. Appl. No. 10/321,298.

Notice of Allowance dated Jan. 19, 2006 for U.S. Appl. No. 10/321,298.

Notice of Allowance dated May 15, 2006 for U.S. Appl. No. 10/321,298.

Notice of Allowance dated Oct. 18, 2006 for U.S. Appl. No. 10/321,298.

Notice of Allowance dated May 7, 2007 for U.S. Appl. No. 10/321,298.

Office Action dated Jul. 14, 2004 for U.S. Appl. No. 10/321,777.

Office Action dated Jun. 2, 2005 for U.S. Appl. No. 10/321,777.

Office Action dated Mar. 1, 2006 for U.S. Appl. No. 10/321,777.
Office Action dated Dec. 4, 2006 for U.S. Appl. No. 10/321,777.
Notice of Allowance dated Jan. 18, 2005 for U.S. Appl. No. 10/321,777.
Notice of Allowance dated Apr. 10, 2007 for U.S. Appl. No. 10/321,777.
Office Action dated Aug. 25, 2005 for U.S. Appl. No. 10/321,290.
Office Action dated Mar. 21, 2006 for U.S. Appl. No. 10/321,290.
Notice of Allowance dated Oct. 25, 2006 for U.S. Appl. No. 10/321,290.
Notice of Allowance dated Jul. 3, 2007 for U.S. Appl. No. 10/321,290.
Notice of Allowance dated Jun. 15, 2007 for U.S. Appl. No. 11/005,651.
Notice of Allowance dated Oct. 2, 2007 for U.S. Appl. No. 10/321,298.
Notice of Allowance dated Aug. 24, 2007 for U.S. Appl. No. 10/321,777.
Notice of Allowance dated Sep. 5, 2007 for U.S. Appl. No. 10/321,290.
Notice of Allowance dated Dec. 14, 2007 for U.S. Appl. No. 11/005,651.

* cited by examiner

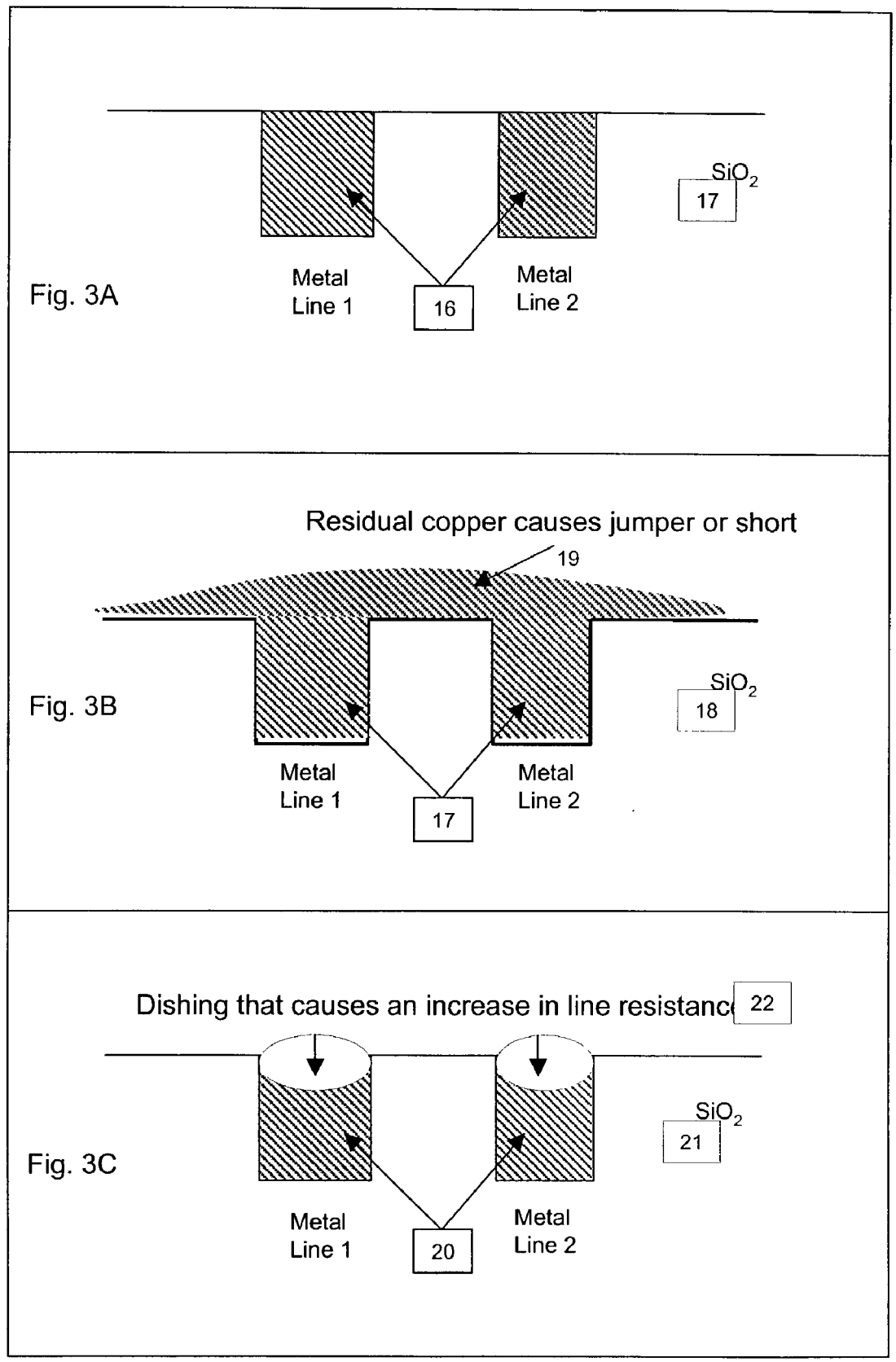

INTEGRATED CIRCUIT METROLOGY

CROSS-REFERENCE TO RELATED APPLICATIONS

This application is a continuation-in-part of, and claims the benefit of the filing date of prior filed copending U.S. patent applications Ser. Nos. 10/165,214, 10/164,844, 10/164,847, and 10/164,842, all filed Jun. 7, 2002, and assigned to the same assignee as this patent application. The contents of those patent applications are incorporated by reference here.

BACKGROUND

This description relates to integrated circuit metrology.

Metrology involves the measurement of silicon wafers, for example, in three different modes of operation: in-line operation in which wafer measurements are performed between process steps, in-situ operation in which the wafer is measured during processing, and off-line operation in which the wafer is removed from the process line for measurement. Metrology is an important operation in the introduction of new materials, processes, and structures associated with reduction of integrated circuit feature sizes. Metrology is also important for improving yield in mature fabrication lines. Through better characterization of variation due to process tools and processes, metrology can be used to reduce time-to-market and cost-of-manufacturing.

Measurements are often performed during the processing of an integrated circuit to gauge whether a process or process flow will result in the intended integrated circuit. The term metrology refers to the tools that make physical measurements on test and production wafers as well as the strategies for determining where on the wafer or die those measurements are to be taken. Measurement strategies may include measuring a particular group of sites on a die or across the wafer in a particular pattern or on particular structure within the die. Performing the measurements between process steps allows for easier isolation of a problem to a particular step and feature versus measuring the final circuit and then trying to diagnose which of 20 or 30 process steps caused the problem.

In determining which sites or locations to measure within a particular chip or die and which die to measure from among the multiple dies across the wafer, several factors come into play. Making too many measurements delays subsequent processing of the wafer, thus directly affecting manufacturing throughput and process yield. Making too many measurements may also produce too large a volume of raw data for a process engineer or diagnostic system to analyze in real-time.

As shown in FIG. 1A, test structures or devices 25 are sometimes created on the wafer outside the circuitry of the chip, normally in scribe or kerf lines 23, and the metrology is focused on those test structures or devices. The isolated test structure 25 may not resemble the features 29 in the IC design 24 that entail a problematic variation.

If pattern dependencies, such as density, linewidth, and linespace cause variation in electrical performance, a feature and its surrounding features may need to be measured. Interactions between vertical layers may also need to be considered. These considerations may grow in importance as different types of circuitry are consolidated densely onto a single chip, for example, in a mixed mode system-on-a-chip (SOC) design 24 in which analog, logic, I/O, and RAM components are designed into one chip.

SUMMARY

In general, in one aspect, the invention features selecting sites to be measured on a device that is to be fabricated using at least one fabrication process, the sites being selected based on a pattern-dependent model of the process.

In general, in another aspect, the invention features selecting sites to be measured on a device that is to be fabricated using at least one fabrication process, the sites being selected based on an electrical impact analysis of the process.

Implementations of the invention may include one or more of the following features.

The sites are selected based on an electrical impact analysis of the process. The process comprises chemical mechanical polishing. The selecting of sites is based on a measurement strategy. The selected sites are part of a measurement recipe. The process comprises electrical chemical deposition. The process comprises two or more stages. The two stages comprise two or more processes. The two stages comprise two or more steps of a single process. The two stages comprise deposition and chemical mechanical polishing. The selected sites include within-die and within-wafer (die-to-die) measurement sites. One of the two stages comprises lithography. One of the two stages comprises plasma etch. Patterned test wafers or test semiconductor devices are used to calibrate the pattern dependent model with respect to a preselected tool or process recipe. The pattern dependent model maps pattern dependent features to wafer-state parameters that include at least one of: resulting film thickness, film thickness variation, dishing, or erosion. The pattern dependent model maps pattern dependent features to electrical parameters that include at least one of sheet resistance, resistance, capacitance, crosstalk noise, voltage drop, drive current loss, dielectric constant, and effective dielectric constant. A cost function is used to determine which sites to measure. The selection of sites is based on more than one pattern dependent model. The cost function is used to select sites to measure the impact of dummy fill. At an internet server, a layout file and design specifications for the device are received from a client, the sites are selected at the server, and information identifying the selected sites is returned from the server to the client. A service is made available to a user on a network that enables the user to cause the selection of sites with respect to a semiconductor design, a fabrication process, and metrology device. The sites are selected with respect to a single interconnect level of the device. The measurement plan is generated with respect to multiple interconnect levels of the device. The device comprises at least one of a semiconductor wafer or a semiconductor chip within a wafer. The selecting of sites includes using dummy fill objects to improve a structural integrity of low-K dielectric features. The selecting of sites includes using dummy fill objects to maintain or improve an effective dielectric constant of low-K dielectric features. The effective dielectric constant is maintained through all steps of a damascene process flow. The effective dielectric constant is maintained through all steps of a damascene process flow. The selecting of sites includes using dummy fill objects to facilitate integration of low-k dielectric materials into a damascene process flow. A library of sites is maintained, the library is made available for use in connection with generating measurement strategies, and the library is updated with respect to new or improved metrology tools. Calibration information is stored with respect to at least one of the following: process tools, recipes, and flows, and updating the calibration information to reflect changes in the process tools, recipes or flows. A user is enabled to obtain selection of sites for a device using a single click of a user interface device through a user interface. A user is enabled to obtain selection of sites for a device over the Internet using web services. A service is made available to a user on a network that enables the user to verify sites with respect to the device and a fabrication process or flow. The sites are selected to characterize variation in electrical parameters. The electrical parameters comprise at least one of sheet resistance, resistance, capacitance, crosstalk noise, voltage drop, drive current loss, and effective dielectric constant. Pattern dependencies are extracted from a layout of the device. The pattern dependencies include dependencies with respect to line spacing, line width or line density. The selected sites are used to provide feedback to a process control system or a recipe synthesis tool. The sites are selected for a semiconductor die. The sites are selected for one or more die within a wafer. The sites are selected for one or more wafers within a lot. The sites are selected for one or more lots within a production run. The sites are selected within a metrology tool. The sites are selected within a process control or advanced process control system. The selected sites are electronically or optically communicated to a process or metrology tool across an extranet network, intranet network, Internet network or a virtual private network. The sites are selected based on criteria for electrical parameter variation tolerances for at least one of the following: capacitance and resistance, sheet resistance, outputs delay, skew, voltage drop, drive current loss, dielectric constant or crosstalk noise. The sites are selected based on criteria for wafer parameter variation tolerances for at least one of the following: film thickness, dishing and erosion.

In general, in another aspect, the invention features, a method comprising selecting measurement sites for an entire semiconductor chip, the sites being selected based upon a pattern-dependent model for a single interconnect level of the chip.

In general, in another aspect, the invention features selecting measurement sites for an entire semiconductor chip, the sites being selected based upon a pattern-dependent model for multiple interconnect levels of the chip.

In general, in another aspect, the invention features measuring a device under fabrication in accordance with a measurement plan that is based on a pattern-dependent model of the fabrication, and verifying predicted variations in wafer-state parameters during fabrication.

Implementations of the invention may include one or more of the following features. Predicted variations in electrical parameters are verified during fabrication.

In general, in another aspect, the invention features measuring a device that has been subjected to a chemical mechanical polishing process in accordance with a measurement plan that is based on a pattern-dependent model, and identifying areas of the device in which the chemical mechanical polishing process resulted in incomplete removal of material.

In general, in another aspect, the invention features measuring a semiconductor device in accordance with a measurement plan that is based on a pattern-dependent model in order to identify characteristics of residual copper remaining on the device after processing, and using results of the measurement as feedback to a process control system.

In general, in another aspect, the invention features measuring a semiconductor device in accordance with a measurement plan that is based on a pattern-dependent model in order to identify characteristics of residual copper remaining on the device after processing, and using results of the measurement as feedback to a process for recipe synthesis.

Implementations of the invention may include one or more of the following features. The sites are selected as part of an automatic generation of a measurement plan, a measurement recipe, or a sample plan for metrology equipment. The metrology equipment comprises optical metrology equipment or profilometry metrology equipment or electrical probe metrology equipment. The metrology equipment comprises in-situ or in-line metrology equipment within cluster tools or stations. Process control feedback is enabled within the cluster tools or stations.

In general, in another aspect, the invention features using test structures and reference materials and pattern-dependent models to correlate scribe line measurement and on-chip properties.

Implementations of the invention may include one or more of the following features. The sites are to be measured in at least one of in-line metrology, in-situ metrology, or off-line metrology. The process comprises part of a damascene process flow. The process comprises introduction of low-k materials into a damascene process flow. The process comprises introduction of low-k (inter-level dielectric) ILD materials into a damascene process flow. The process includes use of dummy fill to improve structural properties of low-k ILD. The electrical impact analysis comprises assessment of effective dielectric constant. The sites are selected to characterize pattern dependencies in a plasma etch process or tool. The sites are selected to characterize IC pattern dependencies in a lithography process or tool. The sites are selected to characterize IC pattern dependencies in a chemical mechanical polishing process or tool. The sites are selected to characterize IC pattern dependencies in the formation of interconnect structures.

In general, in another aspect, the invention features selecting sites to be measured on a semiconductor device that is being fabricated, measuring the sites, rejecting the device if the result of the measuring of the site indicates that the device does not meet a requirement, selecting other sites to be measured on the semiconductor device, measuring the other sites, and rejecting the device if the result of the measuring of the other sites indicates that the device does not meet a requirement.

Implementations of the invention may include one or more of the following features. The selecting, measuring, and rejecting the steps are repeated. The measuring is performed in-line with respect to a processing step. The measuring is performed in-situ with respect to a processing step. The measuring is performed off-line with respect to a processing step. The selecting is done by software included within a metrology tool. The selecting is based on a pattern-dependent model of the process with respect to the device. The model is calibrated with respect to a particular tool for the process. The model incorporates variation of the process over time, and the selecting is based on the model configured for a time associated with the time when the measurement is to be taken. The sites are selected at a die level. The sites are selected at a wafer level.

In general, in another aspect, the invention features selecting sites to be measured on a device that is to be fabricated using at least one fabrication process, the process including clearing of material from a surface of the device, the sites being selected based on a pattern-dependent model of the process to test whether clearing has occurred within an acceptable tolerance.

Implementations of the invention may include one or more of the following features. The process includes polishing and the acceptable tolerance includes clearance without overpolishing. A metrology tool is controlled in response to the selecting. The metrology tool comprises an optical reflectance, CD, profilometry, acoustic or eddy current metrology tool. Full-chip or wafer-level parametric yield is characterized using the measurements. The sites are selected based on minimum or maximum features that may violate design specifications of the device. Feedback is enabled to adapt settings or recipe parameters in a chemical mechanical polishing tool, or to adapt settings or recipe parameters in an electrical chemical mechanical deposition tool or a flow including an electrical chemical mechanical deposition tool, or to adapt differential pressures in a chemical mechanical polishing tool head, or to adapt recipe parameters in a process step, or to synthesize recipe parameters in a process flow, or to adapt settings or recipe parameters for a plasma etch process tool or a flow including a plasma etch tool. A comparison and selection among best-known process methods and consumables is enabled.

In general, in another aspect, the invention features measuring a semiconductor device in accordance with a measurement plan that is based on a plasma etch pattern-dependent model in order to identify critical dimensions of IC features. The pattern dependent model maps pattern dependent features to wafer-state parameters that include at least one of resulting critical dimension (CD), film thickness, aspect ratio or trench width or trench depth.

Implementations of the invention may include one or more of the following features. Feedback is enabled to adapt settings or recipe parameters for a lithography tool or a flow including a lithography tool. The adjustment of design rules, design specifications or control bands is enabled. The design of test structures or devices is enabled. The correlation of chip parameters with existing test structures or devices is enabled.

In general, in another aspect, the invention features apparatus that includes a metrology tool to measure a parameter of a semiconductor device, the metrology tool including a control element to select sites for measurement based on a pattern dependent model of a process with respect to the device.

Other advantages and features of the invention will become apparent from the following description and from the claims.

BRIEF DESCRIPTION OF THE DRAWINGS

FIG. 3A illustrates the ideal result of copper CMP in a damascene process.

FIG. 3B illustrates the formation of residual copper above two metal lines, forming a jumper or short between the two electrical structures.

FIG. 3C illustrates the dishing of copper material into two metal lines, resulting in an unwanted increase in the resistance of the metal line.

DETAILED DESCRIPTION

In what follows, we describe approaches that are useful to identify and characterize areas of a chip that are likely to be problematic due to predicted variation in film thickness, surface topography uniformity, and electrical impact resulting from pattern dependencies during processing of an integrated circuit. The approaches are applicable to the high density plasma (HDP) and chemical-mechanical polishing (CMP) processes used in the formation of shallow trench isolation (STI) structures, as well as the electroplated copper deposition (ECD) and chemical mechanical polishing (CMIP) processes used in the formation of single- and multi-level interconnect structures for integrated circuit (IC) devices. The approaches are also applicable to the processes and flows used to create oxide and low-k dielectric layers. The approaches are also applicable to plasma-etch processes and the measurement of critical dimensions. The approaches are also applicable to lithography processes. The approaches are also applicable to any step or steps that constitute damascene process flows. The approaches assemble the locations or coordinates of problematic areas into measurement plans and may also generate measurement recipes for use by metrology tools.

In fabricating integrated circuits, interconnect film thickness and surface topography uniformities are dependent on variation in circuit layout patterns (e.g. material density, linewidth and linespace). Surface non-uniformity often leads to subsequent manufacturability and process integration issues. These pattern dependencies may also affect device performance by introducing variation in capacitance and resistance depending on the location of a given structure on the device.

Film thickness variation in chemical mechanical polishing (CMP) processes can be separated into various components: lot-to-lot, wafer-to-wafer, wafer-level, and die-level. Often, the most significant component is the pattern dependent die-level component. Die-level film thickness variation is often due to differences in layout patterns on the chip. For example, in the CMP process, differences in the underlying metal pattern result in large long-range variation in the post CMP film thicknesses, even though a locally planar surface topography is achieved.

Figure 2A:
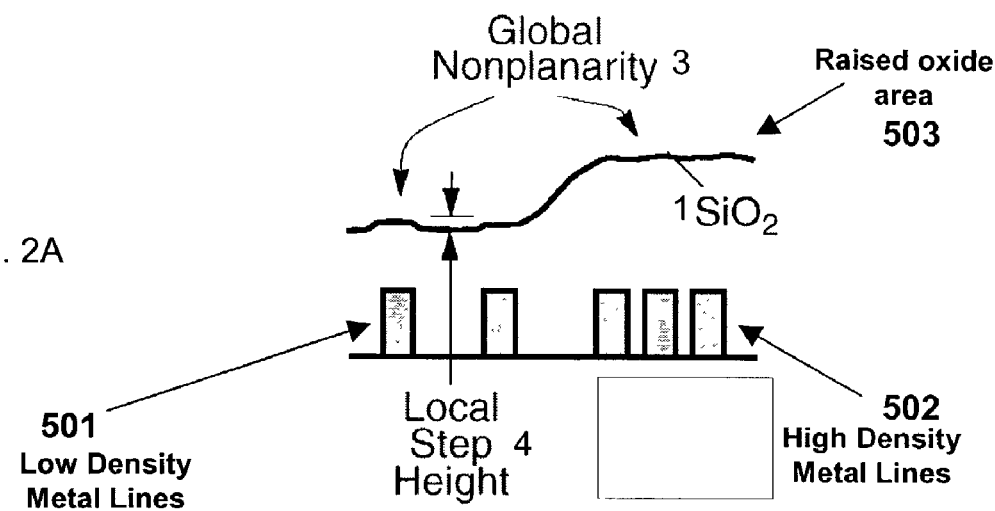
FIG. 2A illustrates film thickness variation that results from oxide CMP.

For oxide polishing, the major source of variation is caused by within-die pattern density, shown as two groups of metal lines in FIG. 2A. The metal lines 501 on the left side of FIG. 2A have a lower density in the direction of the plane of the integrated circuit than do the metal lines 502 on the right side of the figure. Pattern density, in this case, is the ratio of raised oxide area 503 divided by the total area of the region. The region may be taken as a square with the length of the sides equal to some length, the planarization length. The planarization length is usually determined by process factors such as the type of polishing pad, CMP tool, slurry chemistry, etc.

Figure 2B:
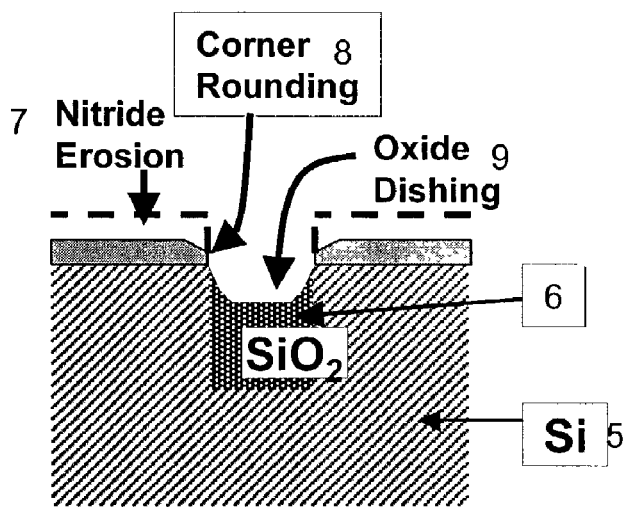
FIG. 2B illustrates erosion, dishing and corner rounding effects associated with the CMP step used in the process formation of shallow trench isolation (STI).
Figure 2C:
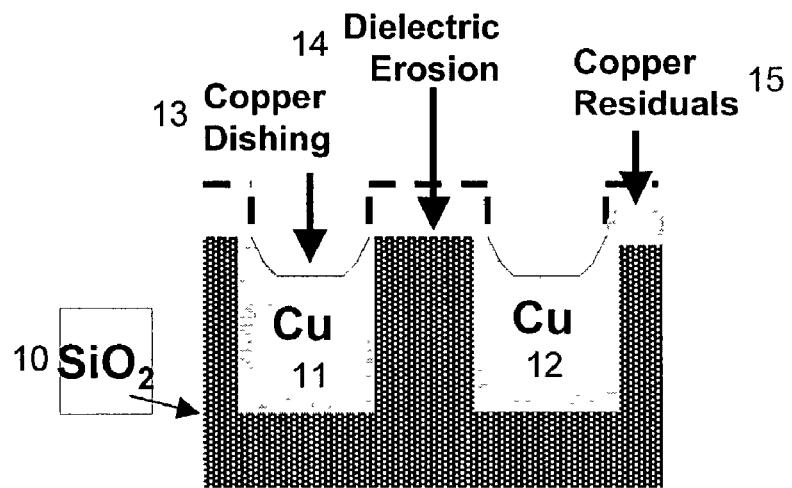
FIG. 2C illustrates copper dishing, dielectric erosion and residual copper effects associated with the copper CMP step used in damascene processes.
Figure 2D:
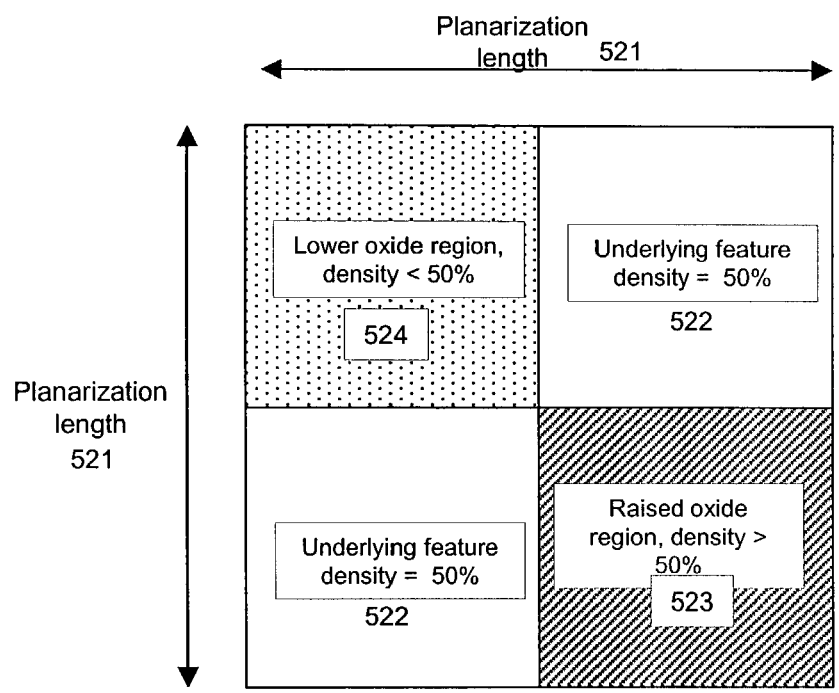
FIG. 2D illustrates top-down view of different density features within a square defined by the planarization length.
Figure 2E:
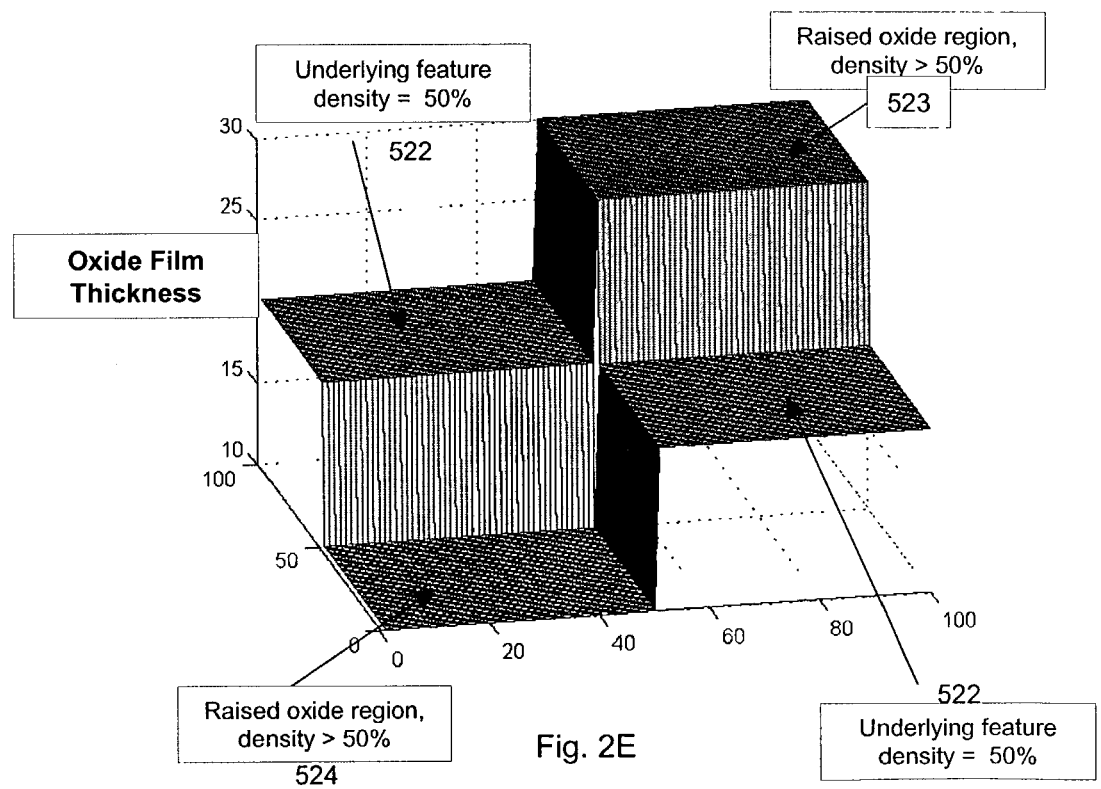
FIG. 2E illustrates the variation in oxide thickness for the features within the planarization length.

FIG. 2D illustrates an example of how the underlying feature density affects the film thickness variation. FIG. 2E plots the film thickness variation corresponding to each density type. For a given square area defined by planarization length 521, the higher the underlying feature density leads to larger film thickness variation 523 and the lower the underlying feature density leads to a reduced film thickness 524. Designers often try to maintain density tightly around 50% 522 to promote planarity. The effective pattern density may be computed for each location on the die by filtering the designed layout densities, often by using various two-dimensional filters of densities around the given location. FIGS. 2A, 2B, and 2C, illustrate how the underlying features 6, 11 and 12 cause variation in local surface topography (step height) 4 and global non-planarity 3.

In creating shallow trench isolation (STI) structures (shown in FIG. 2B), $SiO_2$ 6 is deposited in a trench etched in silicon 5 and planarized using CMP to electrically isolate devices. As with oxide inter-level dielectric (ILD) polishing, the underlying pattern of isolated trenches results in unwanted variation. Problematic areas often are created as a result of CMP such as nitride erosion 7 (where the nitride barrier is removed and possibly exposes the underlying Si to contaminants and damage), corner rounding 8 (which has the effect of potentially widening the trench and where the exposure of Si destroys the device) and oxide dishing 9 which results in topography variation which impacts subsequent lithography. In STI polishing, pattern density is an important feature with regard to topographical variation and other CMP effects.

FIG. 2C illustrates the effects of polishing metal features (e.g. copper lines 11 and 12) entrenched in a dielectric (e.g. $SiO_2$) 10, during a damascene CMP process. For metal polishing, computation of pattern density is important to characterizing full-chip pattern dependencies; however other physical layout effects such as the linewidth and linespace may also be required. Two effects known as dishing and erosion result from metal damascene CMP. Dishing 13 is measured as the difference in metal thickness at the edge of a line and its center. Erosion 14 is defined as the difference in oxide thickness above a metal line, typically within an array of lines, to an adjacent unpatterned region. In a third effect residual copper 15 has not been removed from field or up areas of the chip.

FIGS. 3B and 3C illustrate in more detail some of the electrical effects that result from copper CMP performed during the creation of interconnects. A goal of a damascene process is to achieve a globally and locally planar surface of deposited metal 16 in an oxide or ILD material 17, as shown in FIG. 3A. When the polish time is not sufficiently long enough, residual copper 19 may remain on the chip and in the case shown in FIG. 3B, form a jumper or electrical short 19 across two electrically active structures or lines 17. When the same structure is polished for too long (as shown in FIG. 3C), copper is removed from the lines 20 in an effect called dishing. The electrical impact of dishing is to increase the resistance 22 of the line, which subsequently affects the RC time-constant of this section of the chip.

Figure 1A:
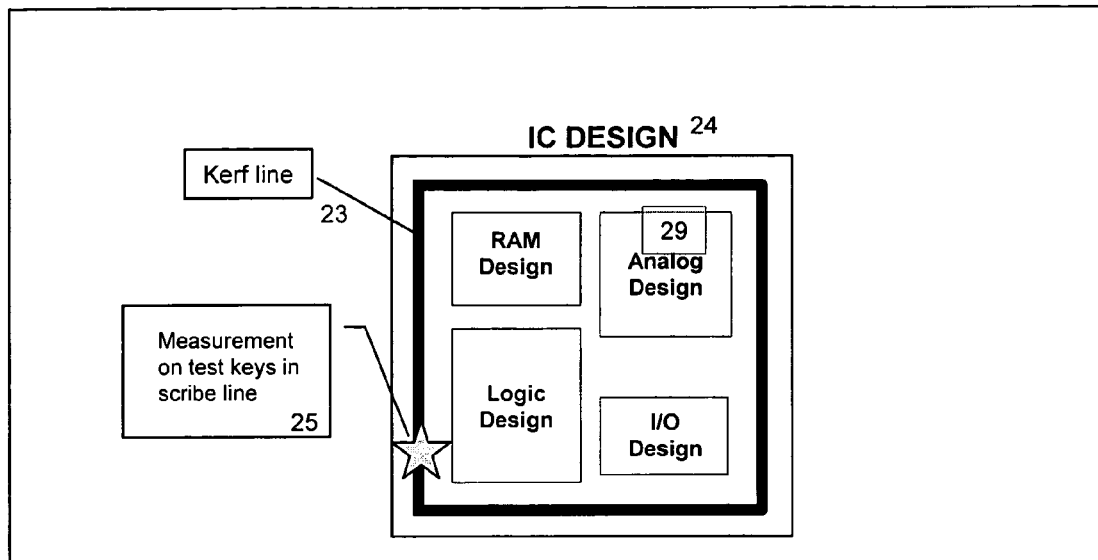
FIG. 1A illustrates where measurements are commonly taken without specific knowledge of problem areas across the chip. The problem is that the test key may not resemble problematic structures in the chip.
Figure 1B:
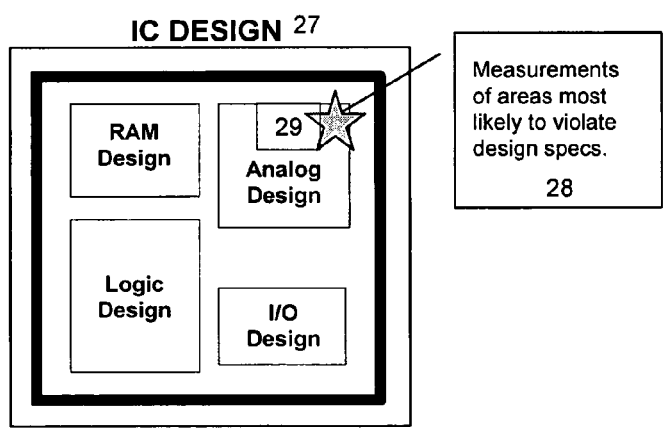
FIG. 1B illustrates a goal of dynamic measurement plan generation where specific structures that are likely problematic areas are identified for measurement.

As illustrated in FIG. 1B, One effective measurement technique is to measure 28 only those problematic areas 29 within the active area of an IC design 27 that are most likely to violate the design specifications or requirements. If those areas are measured to be within design specifications, then it can be assumed that all other areas of the chip are, too. The design specifications or requirements may be wafer-state parameters, such as minimum and maximum film thickness variation, or critical dimensions or electrical parameters such as maximum sheet resistance or maximum variation in sheet resistance across the chip. One approach uses the characterization of pattern dependencies during fabrication to identify such problematic areas by location and determine the appropriate measurement recipe for measuring the variation at that site. The approach may be used to match metrology recipes (i.e. settings on the metrology tool that describe where and how a measurement is to be made) with processes to characterize and minimize variation, thus reducing ramping times for pilot lines and factories. In general, however, this approach is difficult because designers generally do not know where the problem areas are, a priori.

The approach may also be used with pre-existing metrology recipes and measurement plans. In some cases, a pre-defined measurement pattern will be used for in-situ or in-line measurement. As the approach is introduced into the fab environment, it may be used to add likely problematic sites to pre-existing measurement plans that are accepted and qualified within some fab. As such, the approach may be used independently or with existing measurement plans and strategies.

The approach may also be used to generate complete measurement recipes, not just site locations. For example, from a predicted thickness variation across an array structure the approach may specify the scan location, scan start and scan end locations and the number of measurement samples to take along the scan length—all based upon the predicted thickness variation compared with the desired chip specifications. The approach may also be used to coordinate measurement sites and recipes across multiple metrology tools. For example to measure erosion in a copper CMP test wafer, the approach may specify a thickness measurement in a field area adjacent to an array structure and generate the appropriate recipe for a Metapulse optical measurement tool. The approach would also specify a profilometry scan to start at a location at or near the thickness measurement and end at a field location at the other side of the array, as well as the number of samples to be taken along the scan. All of these implementations may be considered as measurement strategies where the measurement site plan or measurement recipes are generated from the predicted chip and wafer level characteristics and transmitted to one or more metrology tools.

By choosing measurement sites and recipes based on pattern-dependent process variation and automatically generating measurement plans for metrology tools, the system may identify, for example, potentially problematic areas across a chip that may result during ECD or HDP and subsequent CMP of interconnect features used in semiconductor devices. As explained earlier, these problematic areas are often due to variation in wafer quality (e.g. film thickness variation and surface topography variation such as dishing and erosion) and electrical parameters (resistance R, capacitance C, and noise). This variation is modeled and simulated using semi-physical process models that may be calibrated to a particular process and tool for each step in a sequence of one or more steps within a process flow. An example of such a model and calibration for an ECD and CMP process flow is described in the prior filed United States patent applications referenced above, incorporated here by reference. In general, a semi-empirical model, based on some physical understanding of the process, is fit to a particular tool at a particular recipe condition using data measured from actual processed test or production wafers. This fit of a model to better represent a given tool and recipe is often referred to as a calibration.

Engineers must be judicious in how measurement sites are selected to confirm the effectiveness of process steps or sequences. Each measurement may delay subsequent process steps and negatively impact yield. For a new IC design, determining the areas of the chip most likely to be problematic can be difficult. In addition, dummy fill strictures may be placed in the layout to improve thickness and surface topography uniformity of the manufactured wafer while maintaining the electrical parameters at the intended or designed values. However, the introduction of dummy fill introduces further complexity by changing the topography of the chip and thus may shift problematic areas from one chip location to another. Using the approach discussed here, the metrology tool can be controlled to confirm that full-chip variation meets the design specifications for the actual manufactured device.

The approach illustrated in FIG. 4 includes sub-blocks 31, 33, 34 and 35 that will be described in greater detail in later sections. The approach may be used with in-line, in-situ, and off-line measurements. The figures illustrate the approach for use with in-line operation.

An IC design is commonly represented electronically (e.g. in a Graphical Data Stream or GDS format) in a library of files that define structures and their locations at each level of an integrated circuit 30. These files are typically large, although the features that are relevant to process variation could be described more efficiently. A process of layout extraction 31 involves summarizing discrete grids of IC designs in a compact set of such parameters such as linewidth, linespace, and density for each grid. A description of how to perform layout extraction is described in section a.

Figure 10:
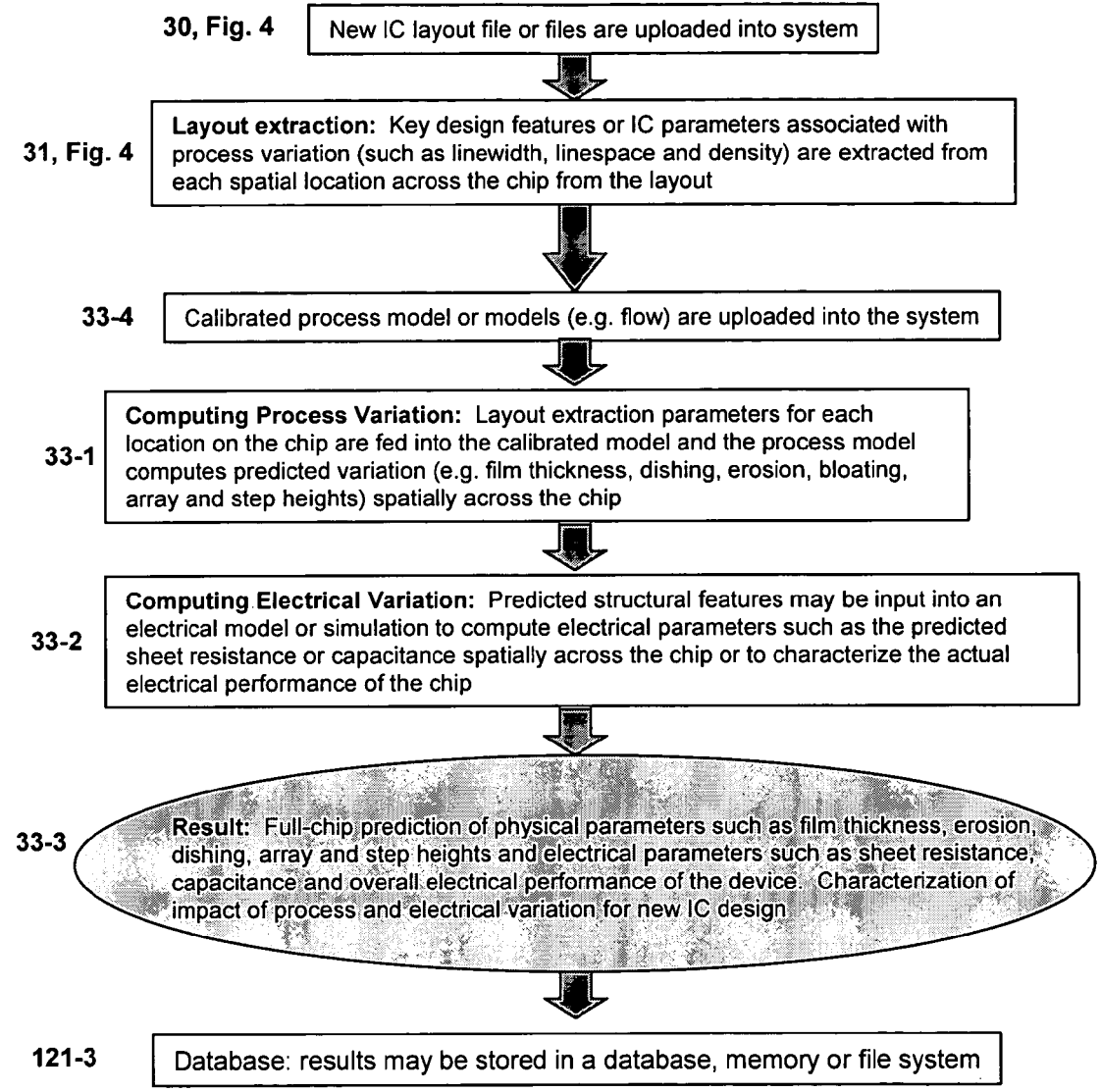
FIG. 10 describes the flow steps involved in using calibration models to predict the impact of process variation and subsequent variation in electrical parameters and performance.

The layout features are mapped to wafer quality, such as film thickness, or to electrical parameters, such as sheet resistance or capacitance. A flow description for this component is shown in FIG. 10. This information may be used with a process model (e.g. a CMP model) or set of process models (e.g. ECD and a multi-step CMP process or a more complex process flow) to predict or simulate the manufacturing results and corresponding variation 33-1 that will occur when the design represented by the layout features is manufactured on the modeled process. The resulting device variation can be measured physically, such as by optical measurement of the film thickness, or surface profiling of the wafer surface to measure topography (e.g. dishing or step height and erosion or array height). The variation can also be measured electrically, such as by measuring sheet resistance or capacitance 33-2 and may require the use of the original IC design specifications 32. The computed parameters from 33-1 and 33-2 relevant to the desired specifications for comparison are acquired for the full-chip, both within die and for multiple dies across the wafer 37. This information is stored in a database 121-3 and used for comparison to the desired chip and wafer specifications.

Using a combination of both process models and electrical simulations, the performance of a given IC design can be predicted and compared against the desired wafer quality and electrical parameters as well as design rule criteria 32. The dynamic measurement plan 35 component performs two basic functions. The first is to compare predicted and desired parameters and the second is to generate the wafer measurement plan for a particular metrology tool. The comparison can be a simple check to see if the predicted wafer or electrical parameters exceed the design threshold or are within a specified tolerance. If so, the location of that position on the die is entered into the measurement plan for a specific tool.

Often a measurement site may require multiple recipe settings to direct the tool appropriately. For example, a profilometry scan requires not only the scan location but also a start and end point as well as the number of sample to take along the scan length. As such, the approach could specify these recipe parameters based upon film thickness variation. The site locations and other parameters may be used to generate complete measurement recipes for one or more metrology tools to be used at a particular point in a process flow. The locations to be measured, the associated measurement plans and measurement recipes are stored in a database 35-7 for presentation and review by the user or automatic electronic transfer to a metrology tool 36.

The metrology tool uses the measurement recipe (e.g. one or more measurement site locations and tool parameters such as where a profile scan is to begin and end) to direct where to measure 39 on a wafer 37 that is processed by one or more process steps (e.g. a process flow) 38. An optional application 40 of this system can repeatedly store any errors between predicted and measured sites 41 to refine the models 42 and achieve better prediction. This may be useful to account for process drift that may occur after a tool has been calibrated. In some cases, process drift can be accounted for by tuning the model and not require a full re-calibration of the tool.

Illustrative embodiments of a method for measurement are described in the following sections. Section a. describes the extraction of layout parameters related to process variation as a method to transform the large design files into a manageable set of features. Layout extraction is not required but is useful. Section b. describes a desirable use of process and electrical models to characterize the impact of process variation on wafer-state specifications and electrical performance. Section c. describes how model based predictions are used to manually and automatically generate measurement plans for metrology tools. Section d. describes the construction and computational framework used to implement the dynamic measurement system as well as the operation of the system and methods by users.

a. Layout Parameter Extraction

A layout is a set of electronic files that store the spatial locations of structures and geometries that comprise each layer of an integrated circuit. It is known that process variation, which negatively impacts the planarity of processed films, is related to the variation in spatial densities and linewidths of a given design. To characterize this relationship, our method uses layout extraction, in which linewidth and density features are extracted spatially across a chip from the geometric descriptions in layout files. The extracted information may then be used to determine areas of the chip that exceed design rule criteria regarding designed linewidth and density.

The layout parameters used to compute dummy fill include the effective pattern density and linewidth. Although the dummy fill method works with extracted densities and linewidths, it is useful to include the extracted linespace, as well as linewidth and density.

Figure 4:
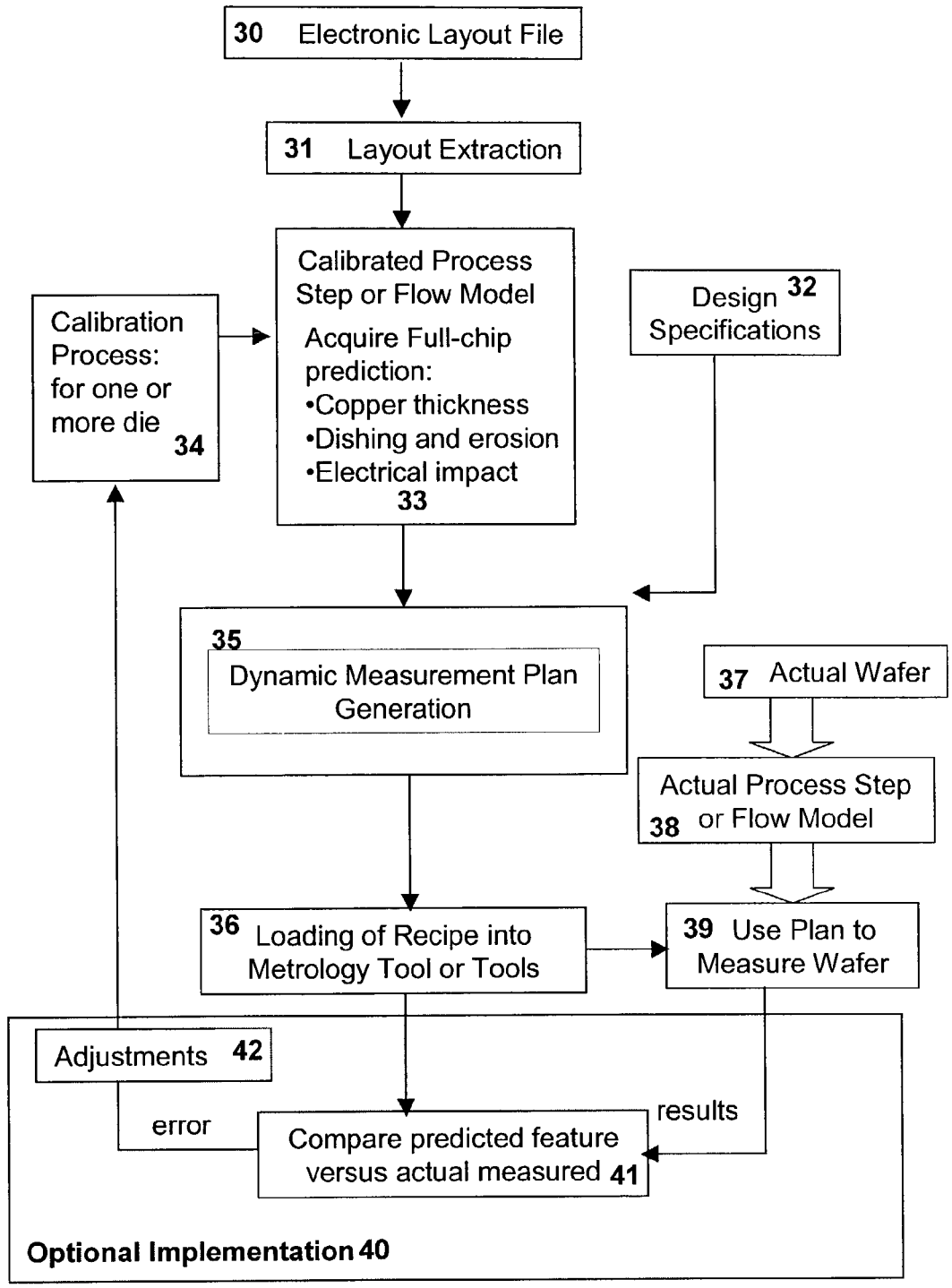
FIG. 4 provides a high-level flow diagram of the method
Figure 5A:
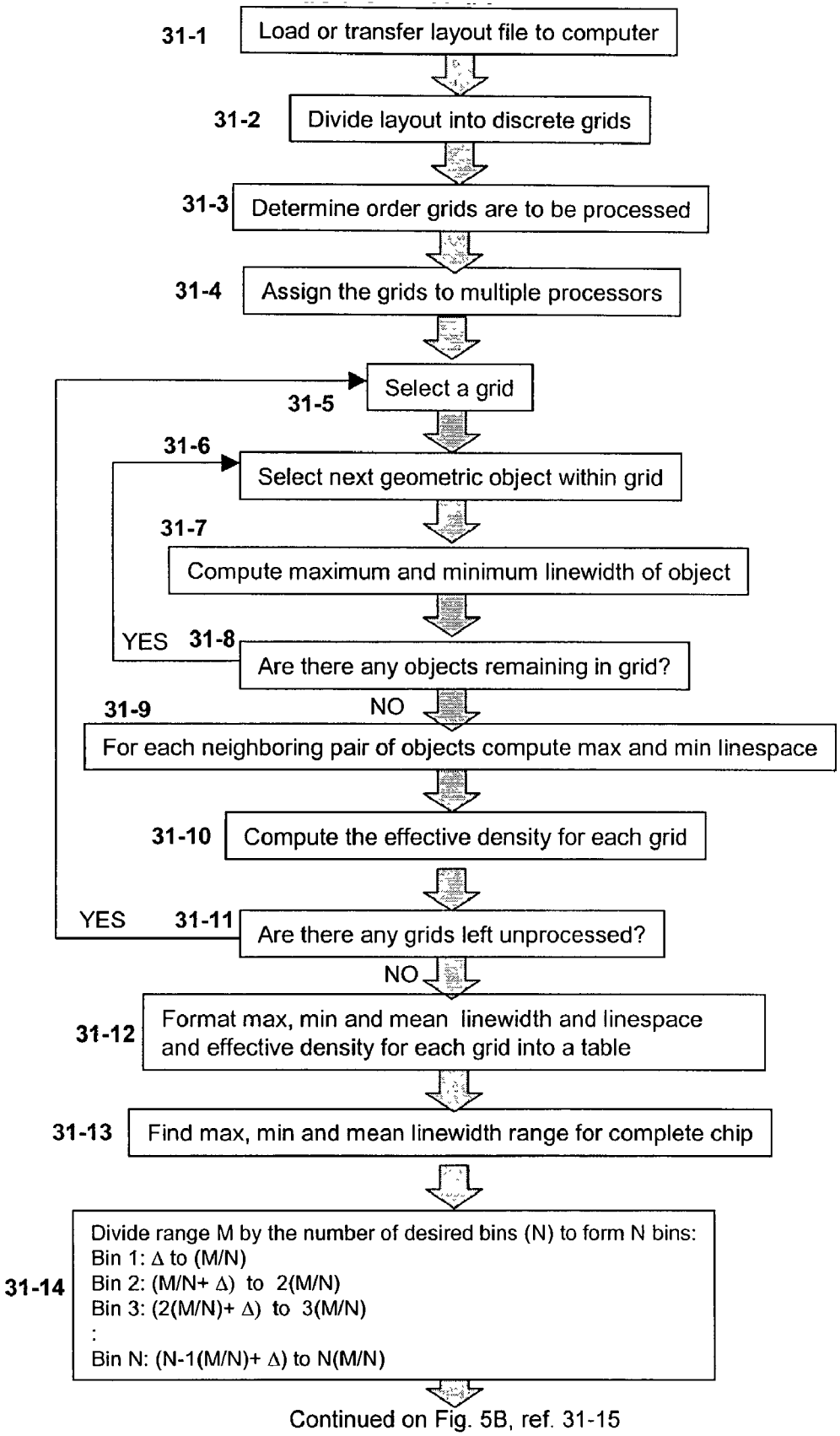
FIG. 5A illustrates the steps involved in layout extraction.
Figure 5B:
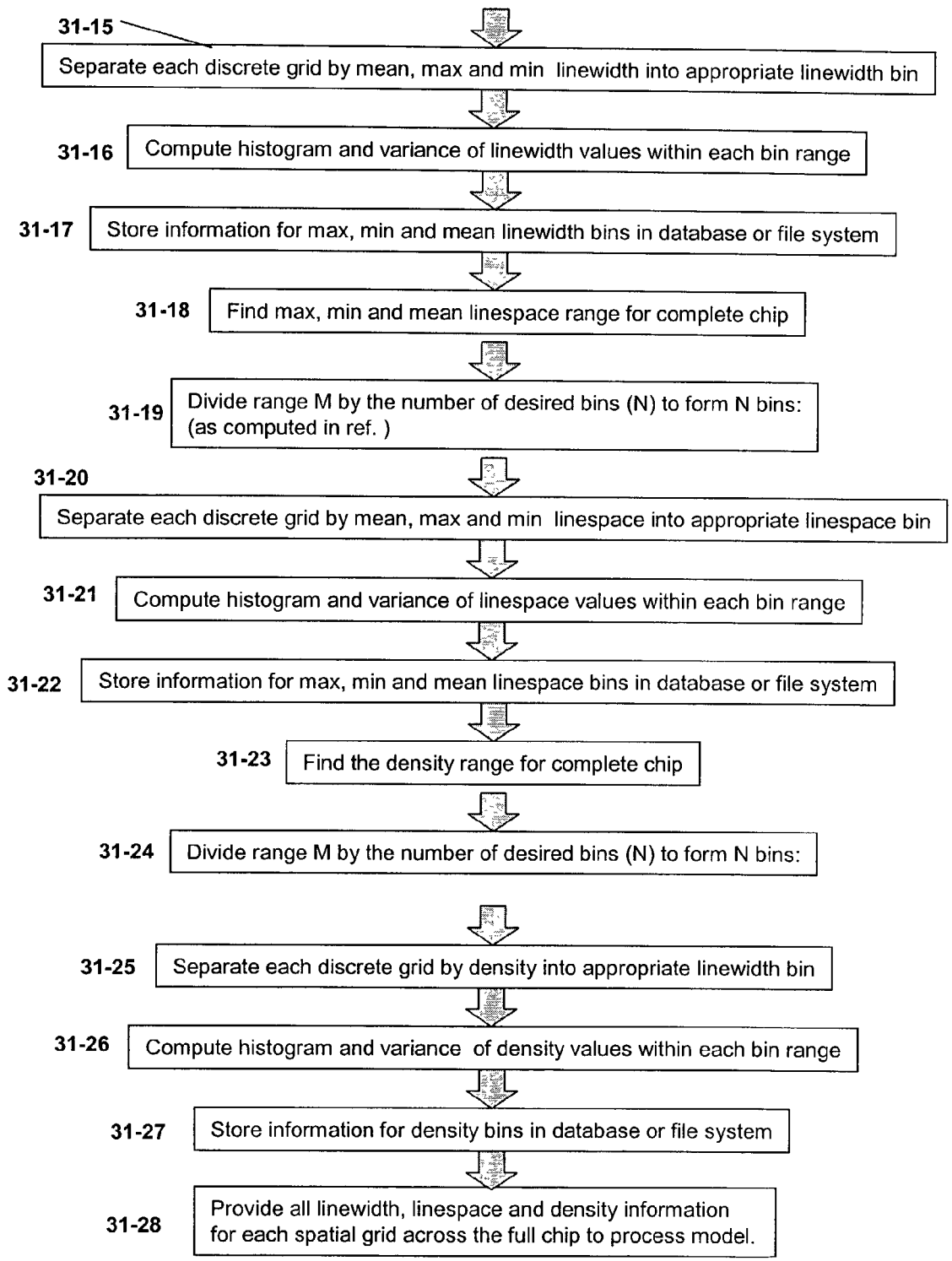
FIG. 5B illustrates a continuation of the steps involved in layout extraction.

The flowchart in FIGS. 5A and 5B provides a detailed flow of the layout extraction component 31 of FIG. 4. In FIG. 5, the layout file is transferred or uploaded to the dummy fill system 31-1. The layout is divided into discrete grids, small enough so that aggregate computations of mean, maximum and minimum features can be used to represent the structures in the grid and still allow accurate dummy placement 31-2. A typical grid size could be 40 µm×40 µm. The grids are ordered or queued for processing 31-3. One desirable approach is to use multiple processors to compute the grids in parallel 31-4. A grid is selected 31-5 and within that grid the linewidth of each object 31-6 is computed 31-7. This process is repeated for every object within that grid 31-8. For each set of neighboring objects (e.g. adjacent objects or objects within some defined distance) the maximum, minimum and mean linespace is computed 31-9. The effective density for the entire grid is then computed 31-10. This process is repeated for all the remaining grids 31-11. Once all the grids are processed, the extracted features such as linewidth, linespace and density are re-assembled from the different processors 31-12.

A table is then created and the maximum, minimum and mean linewidth, linespace, and density for each grid are placed in it as well as the maximum, minimum and mean linewidth for the whole chip 31-13. The minimum and maximum linewidths for the whole chip used to compute a range.

Bins are useful for computing statistical and probabilistic distributions for layout parameters within the range specified by the bin. The linewidth range (M) for the chip is divided by a number of desired bins (N) 31-14 to determine the relative size of each of the N bins. For example the first bin would be the minimum linewidth or small nonzero value $\Delta$ to the linewidth (M/N) and continue until the $N^{th}$ bin which will span the linewidth from min $LW_{BinN}=(N-1)\cdot(M/N)$ to max $LW_{BinN}=(N)\cdot(M/N)$, which is also the maximum linewidth. The limits for these bins may also be set manually by the user. There are three sets of bins, a set of bins for each of maximum, minimum and mean linewidth. Each grid is placed in the appropriate bins according to its max, min and mean linewidth 31-15. A histogram is also created for each bin showing the distribution of values within that bin 31-16. This information is stored in the database and fed into process models, for example, ECD models, as well as the dummy fill rules generation 31-17.

The maximum, minimum and mean linespace ranges are computed for the full chip 31-18. The linespace range (M) is divided by the number of desired bins (N) 31-19 to determine the relative size of each of the N bins. For example the first bin would be the minimum linespace or small nonzero value $\Delta$ to the linespace (M/N) and continue until the $N^{th}$ bin which will span the linespace from min $LW_{BinN}=(N-1)\cdot(M/N)$ to max $LW_{BinN}=(N)\cdot(M/N)$, which is also the maximum linespace. The limits for these bins may also be set manually by the user. There are three sets of bins, a set of bins for each of maximum, minimum and mean linespace for the full chip. Each grid is separated into the appropriate bins according to its max, min and mean linespace 31-20. A histogram is also created for each bin showing the distribution of values within that bin 31-21. This information is stored in the database and fed into process models, in particular ECD models, as well as the dummy fill rules generation 31-22.

The density range is computed for the full chip 31-23. The density range (M) is divided by the number of desired bins (N) 31-24 to determine the relative size of each of the N bins. For example the first bin would be the minimum density or small nonzero value $\Delta$ to the density value (M/N) and continue until the Nth bin which will span the density from min $LW_{BinN}=(N-1)\cdot(M/N)+\Delta$ to max $LW_{BinN}=(N)\cdot(N/M)$, which is also the maximum density. The limits for these bins may also be set manually by the user. There is one set of bins for density. Each grid is assigned to the appropriate bins according to its density 31-25. A histogram is also created for each bin showing the distribution of values within that bin 31-26. This information is stored in the database and fed into process models, in particular ECD models, as well as the dummy fill rules generation 31-27. Finally all the linewidth, linespace and density information are stored either in the database or on the file system 3-17, 3-22 and 3-27 for later use in process model prediction 31-28.

Figure 6:
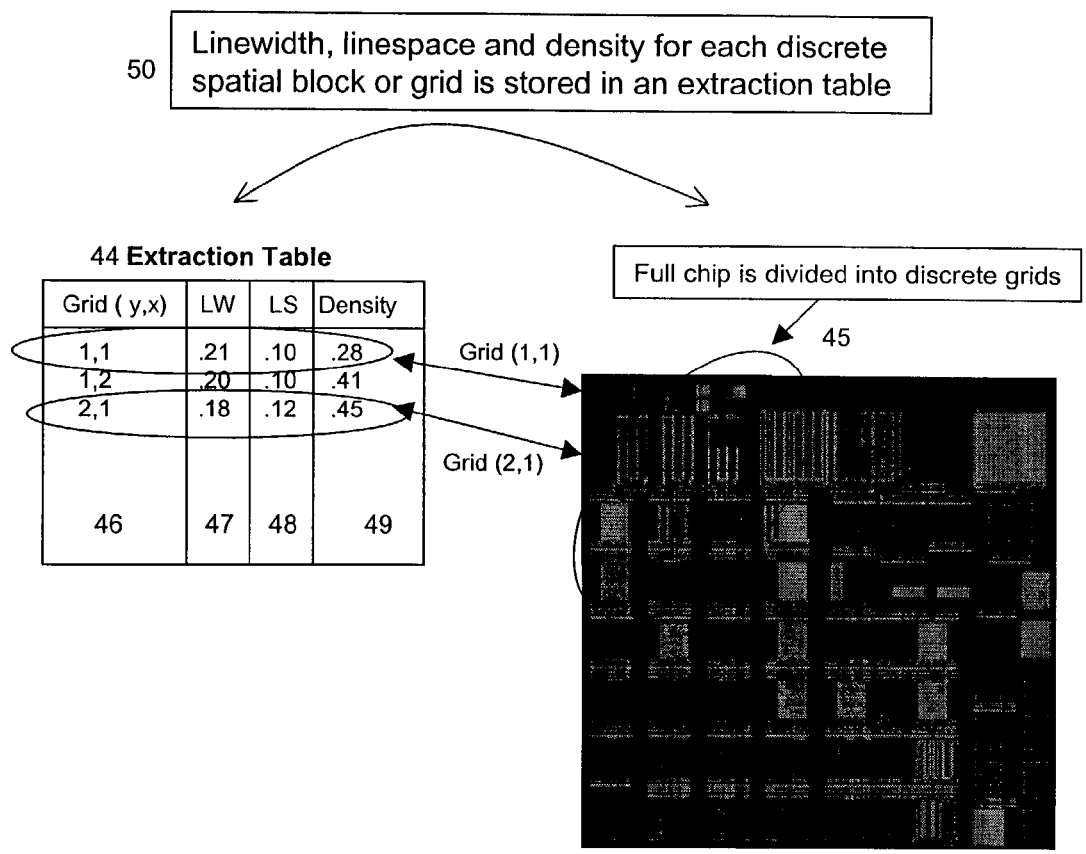
FIG. 6 illustrates the relationship between spatial regions across the chip and the creation of a layout extraction table.

An illustration of how an extraction table 44 (for all the grids across the full-chip or die) is generated is shown in FIG. 6. The chip or die 43 is segmented into discrete grids 45 and the extraction procedure, described in FIG. 5, is used to compute the linewidth 47 linespace 48, and density 49 for each grid element 46. FIG. 6 also illustrates how the linewidth (LW) 47, linespace (LS) 48 and density 49 values placed 50 in an extraction table relate to the grid 45 at (yx) coordinate (1,1) and the grid at (y,x) coordinate (2,1). In many cases, the max, min and mean of the features within each grid are stored in the table 44 as well.

b. Process and Electrical Models

A process model or a series of models (i.e. a flow) can be used to predict the manufactured variation in physical and electrical parameters from an IC design. By characterizing the process variation relative to IC structures, the appropriate measurement sites can be determined to characterize those sites where physical and electrical parameters are likely to exceed desired values.

Figure 7A:
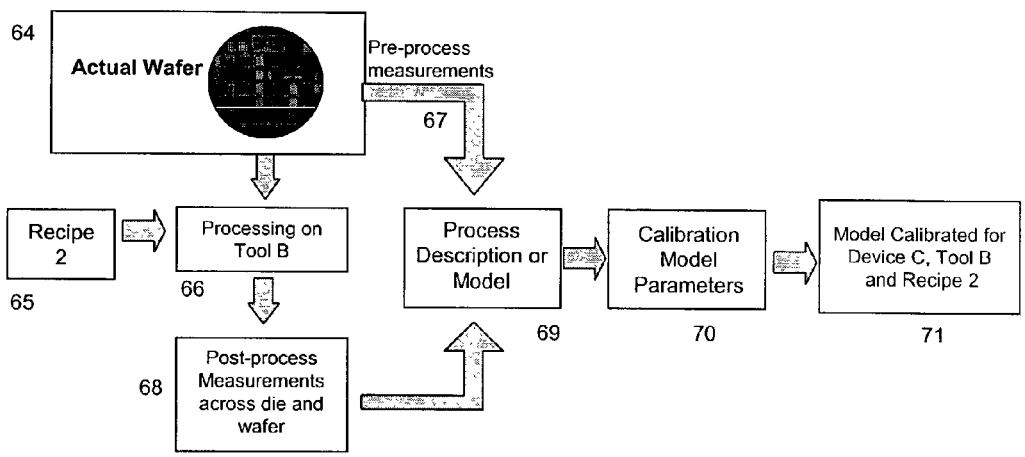
FIG. 7A illustrates the use of product wafers in calibrating a tool for a particular recipe.

Each process tool generally has unique characteristics and thus a model needs to be calibrated to a particular recipe and tool. It is common practice to process a given IC design to determine the impact of processing on physical and electrical parameters and to develop or calibrate process models specific to a particular tool or recipe, as shown in FIG. 7A. In FIG. 7A, the actual product wafer 64, 37, is processed using a recipe 65 on a particular tool 66. The pre-process wafer measurements 67 and post-process wafer measurements 68 are used to fit model parameters 69. A semi-empirical model is used to characterize pattern dependencies in the given process. The calibration model parameters or fitting parameters 70 may be extracted using any number of computational methods such as regression, nonlinear optimization or learning algorithms (e.g. neural networks). The result is a model that is calibrated to this particular tool for a given recipe 71.

Figure 7B:
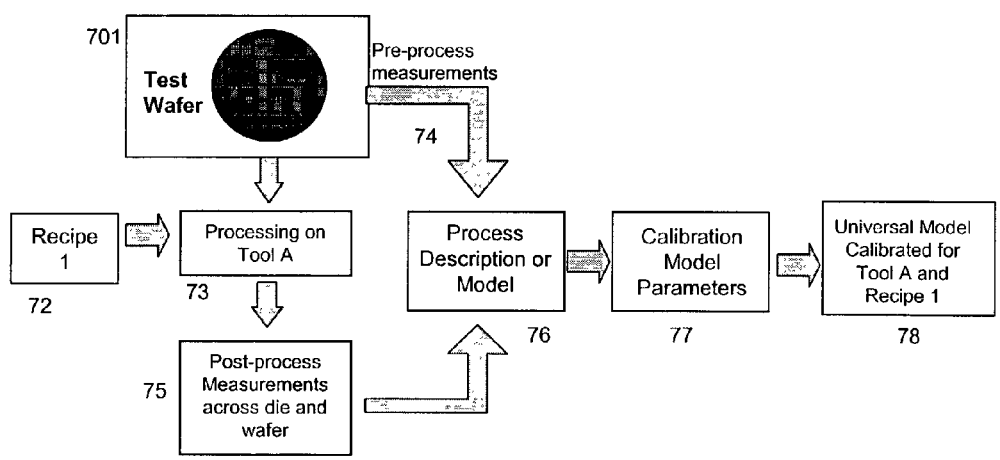
FIG. 7B illustrates the use of test wafers in calibrating a tool for a particular recipe.

Certain IC characteristics such as feature density, linewidth and linespace are directly related to variation in topography for plating, deposition, and CMP processes. Test wafers that vary these features throughout some range across the die can be used to build a mapping from design parameters (e.g. linewidth, linespace, density) to manufacturing variation (e.g. film thickness, dishing and erosion) for a given tool and recipe. Test wafers are an attractive alternative for assessing process impact in that they are generally less expensive to manufacture and one test wafer design can be used to characterize any number of processes or recipes for a wide range of IC designs. As shown in FIG. 7B, a test wafer 701 can be also be used to generate a calibrated process model or multiple process models or a process flow. The calibration model parameters may be computed using the same method in FIG. 7A. One difference is that the pre-process measurement, 74, may be conducted by the test wafer manufacturer and retrieved in an electronic form, such as via the internet, email, disc or CD or paper form. Another difference is that the resulting calibration 78 normally spans a much larger range of linespace, linewidth and density features and thus is more applicable to a broad range of devices.

Figure 8A:
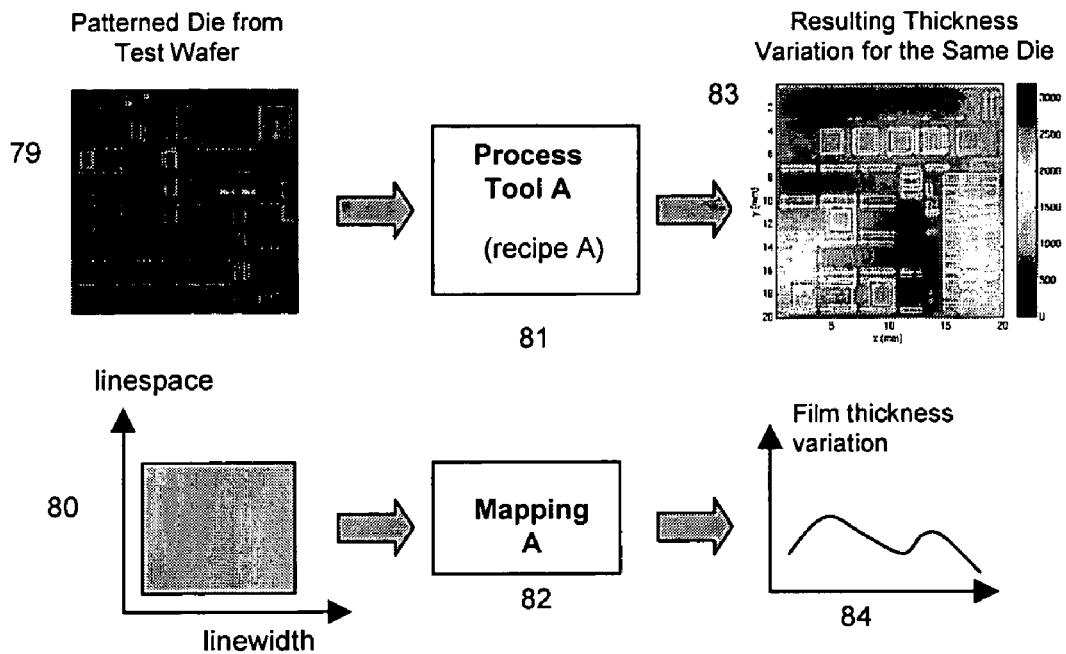
FIG. 8A illustrates how a calibration is used to map layout features to film thickness variation.
Figure 8B:
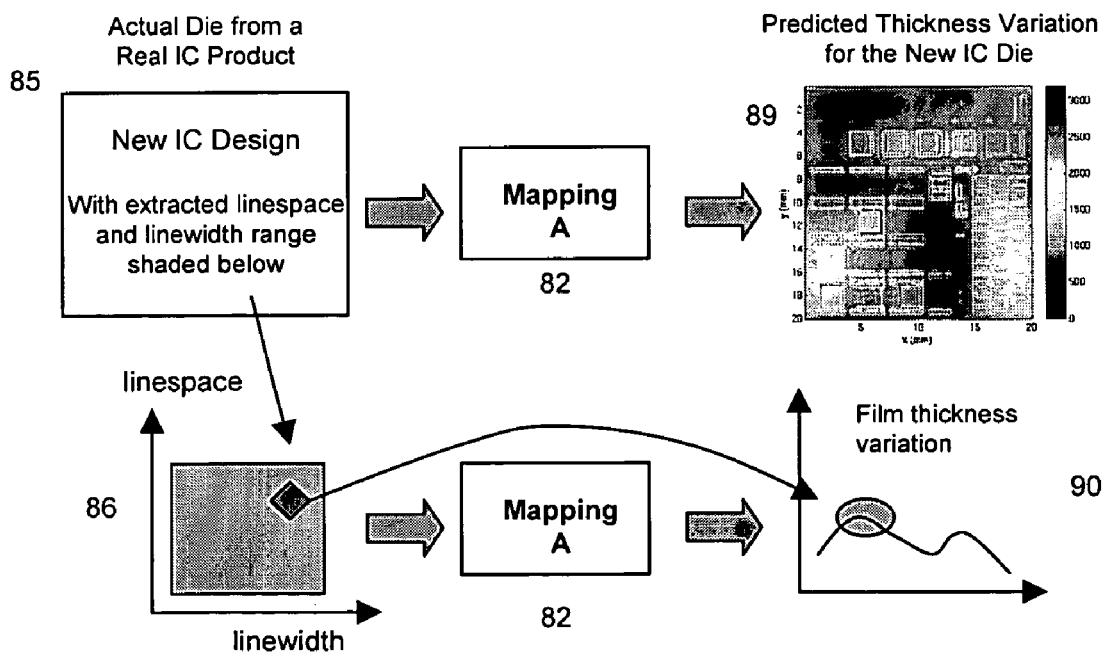
FIG. 8B illustrates the use of the calibration mapping to predict film thickness variation for a new IC design.

More details regarding the use of test wafers in calibrating a process are provided in FIG. 8A. A test wafer die 79 is patterned with a range of linewidth and linespace values 80. The test wafer is processed (e.g. by CMP, ECD or deposition) on a tool using a given recipe 81 and the resulting variation in a parameter is measured across the chip 83 using a metrology tool (e.g. film thickness, 84). This mapping may be considered a model that maps a wide range of linewidth and linespace values to a particular film thickness variation for this tool and recipe. These mappings are useful for predicting process variation for new IC designs, as shown in FIG. 8B. Linewidth and linespace features that fall within the range 86 spanned by the test die and wafer are extracted 85 from anew IC layout. The extracted linewidth and linespace features for spatial locations across the chip 86 are input into the mapping 82 and an accurate prediction of film thickness variation across the chip 89 and 90 can be acquired for a given tool and a given recipe before processing of the new IC design.

Figure 8C:
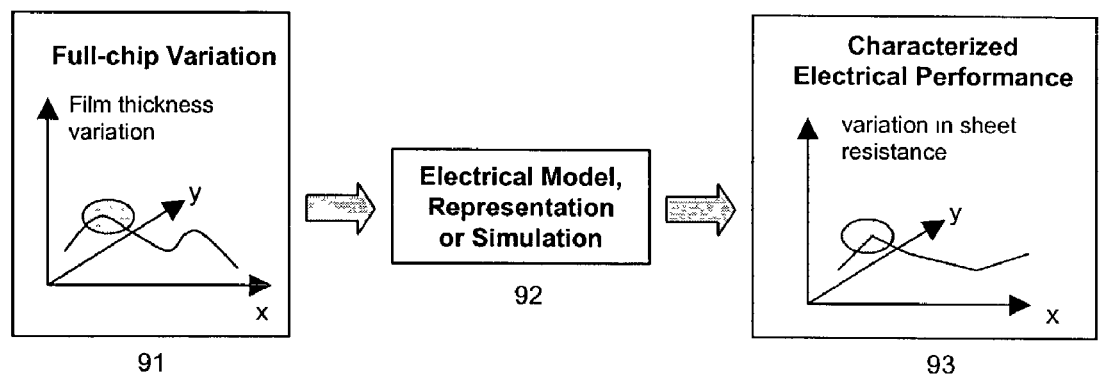
FIG. 8C illustrates how wafer-state parameters, such as film thickness variation, can be used to predict electrical parameters.

As shown in FIG. 8C, the predicted process variation 91 can be fed into electrical models or simulations 92 to assess the impact of processing on the electrical performance of the chip 93. Some of the electrical parameters that may be computed using the models include variation in sheet resistance, resistance, capacitance, interconnect RC delay, voltage drop, drive current loss, dielectric constant or crosstalk noise. These predictions can be used to determine the appropriate locations for measuring.

The following paragraphs and figure descriptions provide a detailed flow of the use of process and electrical models to characterize variation, as implemented for dummy fill.

Figure 9:
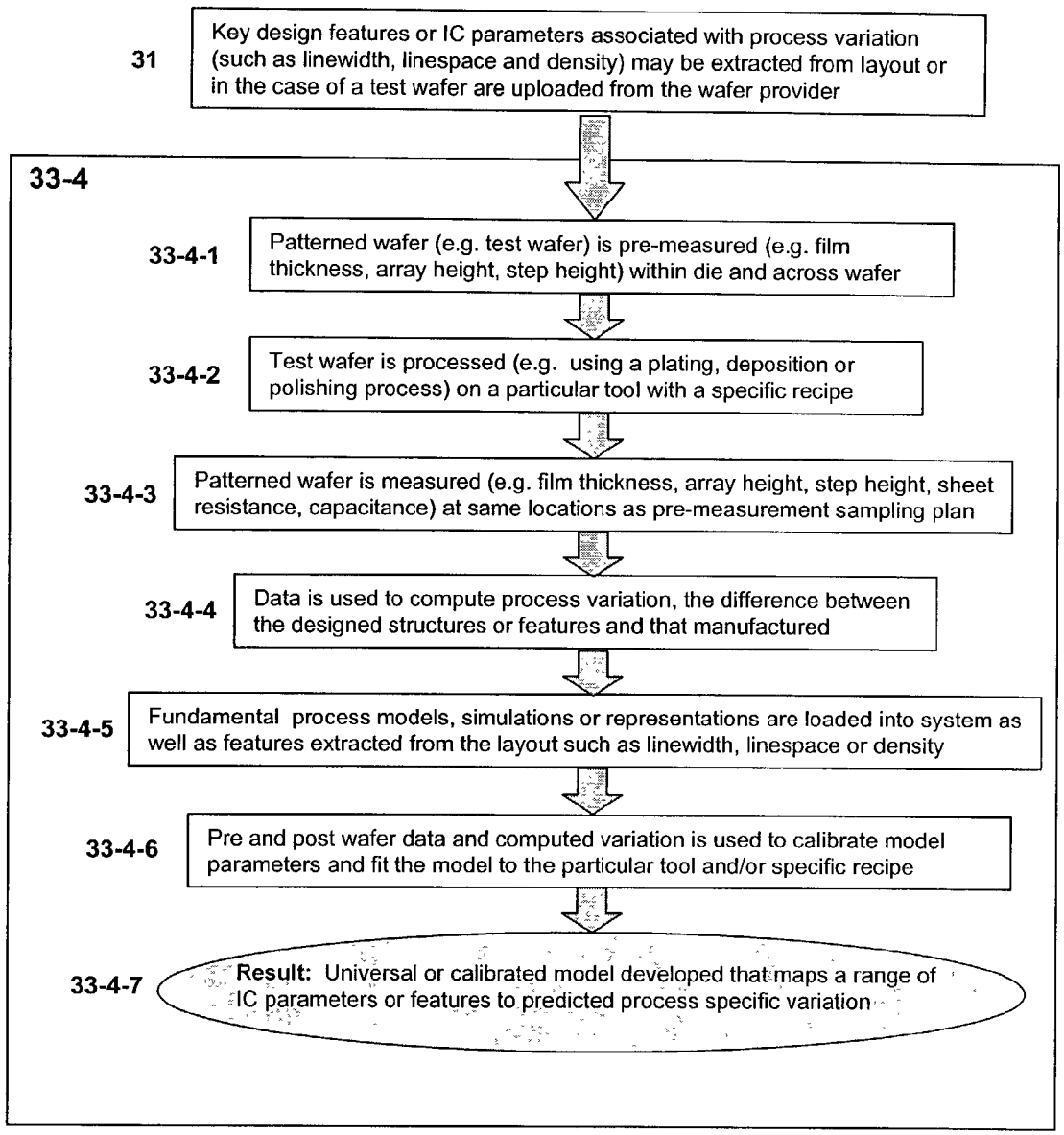
FIG. 9 describes the flow of steps used to calibrate a process step and generate a model.

FIG. 9 describes the steps involved in calibrating a process model to a particular tool or recipe. As described in FIG. 5, 31 layout extraction parameters are computed, or in the case of test wafers, uploaded from the wafer provider.

The second step 33-4-1 pre-measures the wafer using metrology equipment. These measurements may include film thickness and profilometry scans to acquire array and step heights. The third step 33-4-2 processes the test wafer using the particular process or process flow that is to be characterized. Such processes or flows may include plating, deposition and/or polishing steps. It is particularly useful to calibrate on individual processes and also to calibrate on sections of the flow as a way to capture any coupling of variation between subsequent process steps in a flow. It is also recommended to calibrate the model for different recipe parameters such as time. The processed wafers are measured 33-4-3 at the same locations as the pre-measurements; such measurements may include film thickness, profilometry, or electrical; and the variation for the given process may be characterized 33-4-4. Process models or representations are uploaded in 33-4-5 and the pre and post measurements as well as computed variation may be used to calibrate or fit the model or representation to a particular tool and/or recipe or recipes. These models may be formulated and uploaded by a user or selected from a library of models on the modeling computer system. The pre and post measurements and computed process variation are used to fit the model or simulation parameters for the given tool and recipe 33-4-6. The result 33-4-7 is a process model calibrated to a particular tool and recipe or recipes. The result may also include a series of calibrated process models that can be used to simulate a process flow.

FIG. 10 describes the steps involved in using calibration models to predict the impact of process variation and subsequent variation in electrical parameters and performance. A new layout or set of layout files as well as desired IC features, geometries and design rule information are loaded into the system 30. The second step performs layout extraction 31 to extract a description or set of features relevant to process variation for a number of locations across the chip. One common approach is to discretize the layout into a number of grids and compute the structure density for each grid element. However, our approach computes the effective linewidth and linespace for each grid element as well. The calibrated process models are uploaded or assembled to simulate processing 33-4. The extracted layout parameters for each spatial location are fed into the model and the resulting process parameters are computed, such as film thickness, dishing, erosion, array and step heights 33-1. The difference between the target and predicted IC parameters are used to compute the process variation. The predicted process parameters may also be fed into electrical models or simulations to characterize the electrical performance of the IC, which when compared with the desired performance allows for the electrical variation to be computed 33-2. Some of the electrical parameters that may be computed include variation in sheet resistance, resistance, capacitance, interconnect RC delay, voltage drop, drive current loss, dielectric constant or crosstalk noise. Some of the electrical models and simulators that may be used include electrical timing, extractor and other IC related CAD software components.

Our approach is particularly suited for measuring sites in interconnect layers. Thus, interconnect metrics (R,C,L variation) are used as general metrics for all areas of the chip, as shown in the following table. Other critical areas may require simulating the circuit performance effects, including the addition of dummy fill. For example, a metric for the signal delay variation may be imposed in addition to a percentage RC variation to ensure that timing constraints of critical paths meet the circuit specifications. Similarly, clock skew and crosstalk noise simulations may be used to determine whether or not the circuit will function properly. This way, RC (or RLC) criteria can be used as a first pass estimate of where to add the dummy fill. Then the dummy fill placement can be fine tuned in the next iteration by selectively performing circuit simulations for specific signals or certain areas of the chip. Once dummy fill is finally placed and the circuit manufactured the predicted critical variation locations are then selected for in-line or in-situ measurements. In other words, the dynamic measurement system is then used to determine how the chip should be measured or tested to confirm this. The term dynamic includes the use of measurement data from test wafers and the models to determine measurement sites for a new IC layout. The term dynamic also includes the use of the same prior measurement data and models but adds feedback from prior metrology tool measurements on a production wafer to determine measurement sites for the current production wafer. For example, predictions of variation in sheet resistance in a location may prompt a profilometry scan over that feature to measure dishing and erosion.

TABLE 1

Electrical performance metrics for dummy fill adjustment

| Performance Metric | Metric Type | Example Application |
|---|---|---|
| Resistance (R) | Interconnect | ECD, oxide dummy fill |
| Capacitance (C) | Interconnect | ECD, oxide dummy fill, metal dummy fill |
| Inductance (L) | Interconnect | High frequencies (ECD, oxide and metal fill) |
| Signal Delay | Circuit | Routing, Buses, Critical Paths |
| Skew | Circuit | Clocks |
| Crosstalk Noise | Circuit | Low swing/noise sensitive circuits |

The result of models and simulations described in this section is a full-chip prediction of process and electrical parameters and performance for a new IC design, as well as prediction of how these parameters may be impacted with the addition of dummy fill 33-3. The next section describes how these parameters are input into the measurement plan generation component which compares them with the design specifications and requirements and determines which sites to measure and with which tool.

c. Dynamic Measurement Plan Generation

Figure 11A:
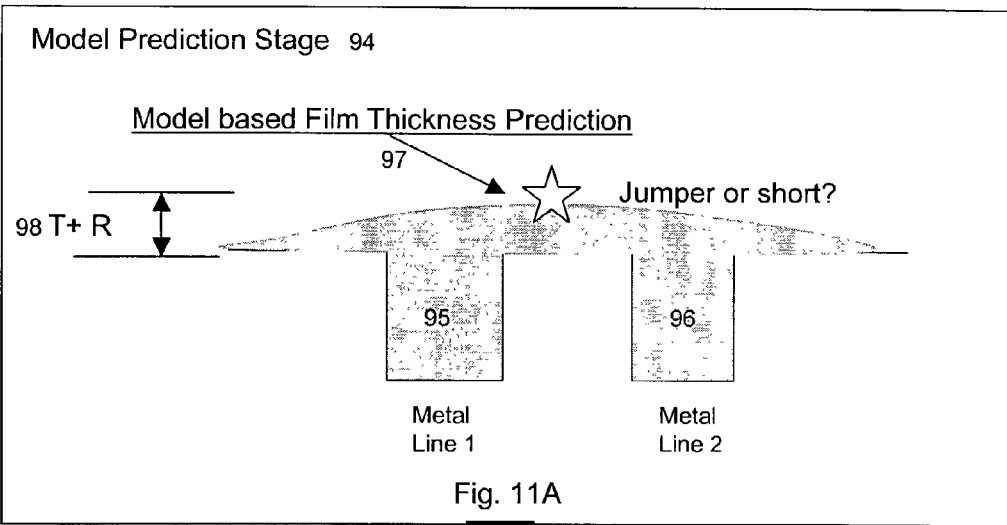
FIG. 11A illustrates how model based predictions are used in the method.

As shown in FIG. 4, the dynamic sample plan generation component 35 compares predicted wafer-state parameters such as film thickness and electrical parameters such as sheet resistance with design specifications or requirements. The locations of the chip that exceed or are sufficiently close (e.g. as defined by the user, in that different circuit designs may dictate different distances) to a particular design constraint are used to generate a measurement plan for a particular metrology tool. The generation of a measurement plan is illustrated in FIG. 11. FIG. 11A shows the model prediction of film thickness 94 over two metal lines 95 and 96 as a result of copper polishing. Residual copper across the two lines results in a jumper or short 97 at that location. Although the target thickness is T, the location where the jumper or short exists has a thickness of T plus an additional thickness of copper of R. The result of the model prediction stage is a computation of film thickness or electrical parameters such as sheet resistance for the complete chip.

The model may predict that the thickness bounds or shorts may not be a problem, but the measurement site locations of the thickest and thinnest spots may also be predicted from the model such that the measurement tool can actually measure those locations.

Figure 11B:
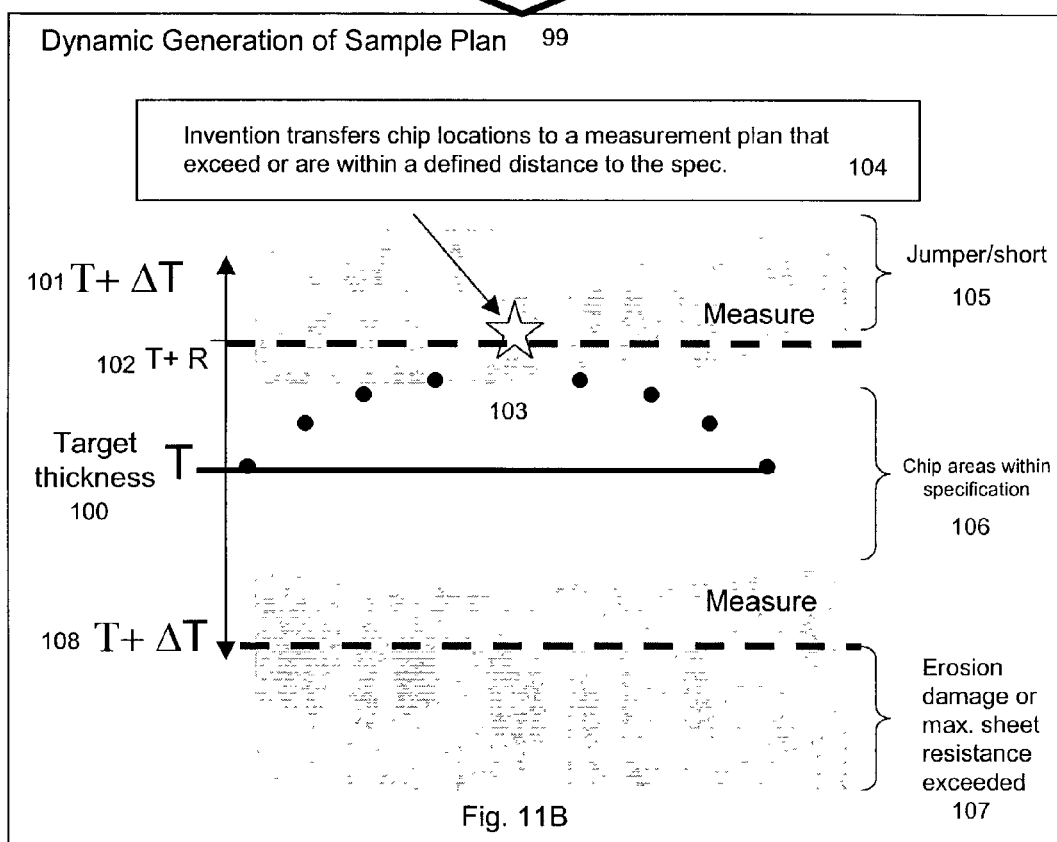
FIG. 11B describes how the method uses predictions and design specifications to select measurement locations across the chip.

The use of the model prediction to determine locations for measurement is illustrated in FIG. 11B. The design specifications for the chip are used to determine the tolerances on prediction parameters such as film thickness variation. For example, a large positive variation or increase in film thickness, due to CMP, would result in jumpers 105. A large negative variation or reduction in copper thickness, due to CMP, results in the dishing of lines and a subsequent increase in sheet resistance 107. When predicted film thicknesses reach some pre-defined amount or exceed such thickness variation levels, the location is selected for measurement. It is likely that the locations selected for measurement would include the maximum and minimum variation levels associated with a particular wafer or electrical parameter and in the case of FIG. 11, this parameter is film thickness.

In this case, the maximum copper film thickness variation (where jumpers are likely to occur) is defined as T+ΔT 101. The predicted film thickness over the metal lines, as illustrated in FIG. 11A, is plotted in FIG. 11B and the maximum height, 103, where the jumper occurs has the height, T+R 102. In this case, the location of the point where the jumper occurs, 103, would be entered into the sampling plan for film thickness measurement. This is one example of a threshold based cost function but other types of cost functions may be used to help determine which sites are to be selected.

The types of measurements and tools used also have an impact on which parameters are monitored. For example, dishing, which impacts interconnect sheet resistance, is normally measured with a profilometry tool whereas copper film thickness is normally measured with a film thickness tool. So the measurement plans generated may be specific to the particular tool type or types indicated by the user as available. Once the measurement plan is generated, it may be displayed to the user through a graphical user interface (FIG. 11C) and the user may choose to manually load in the measurement sites. The measurement plan may be automatically transferred and loaded into a particular measurement tool.

Figure 11C:
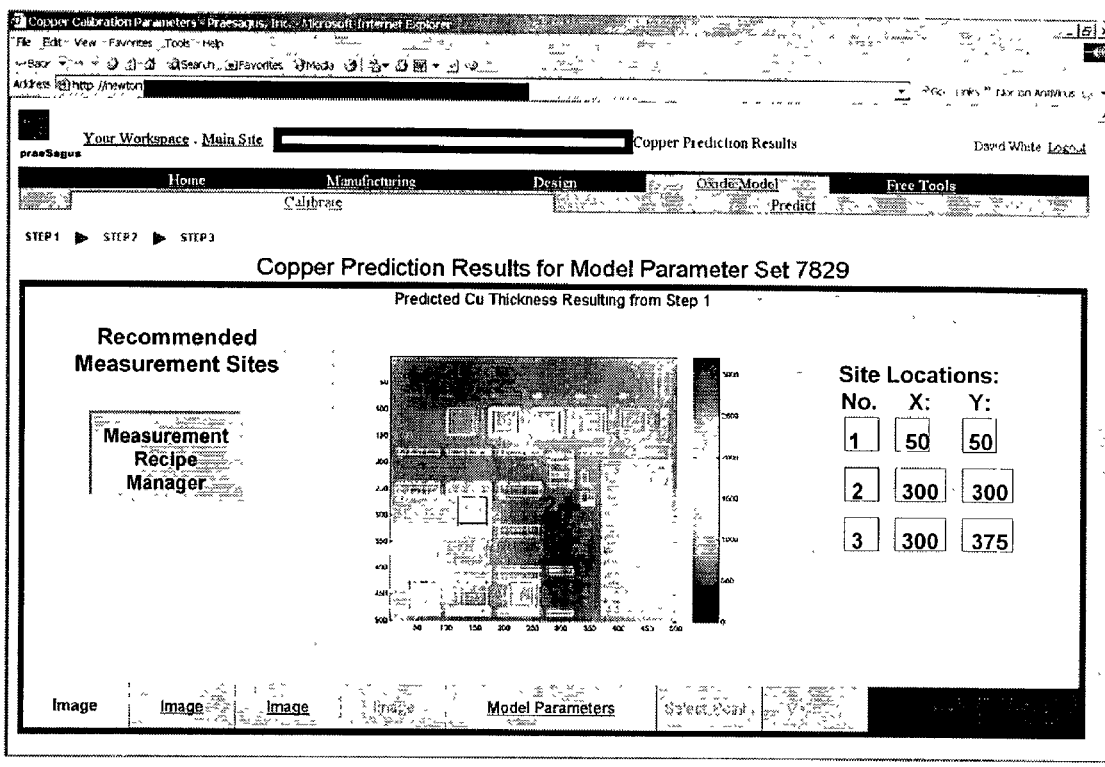
FIG. 11C shows a display screen of a measurement plan.
Figure 12:
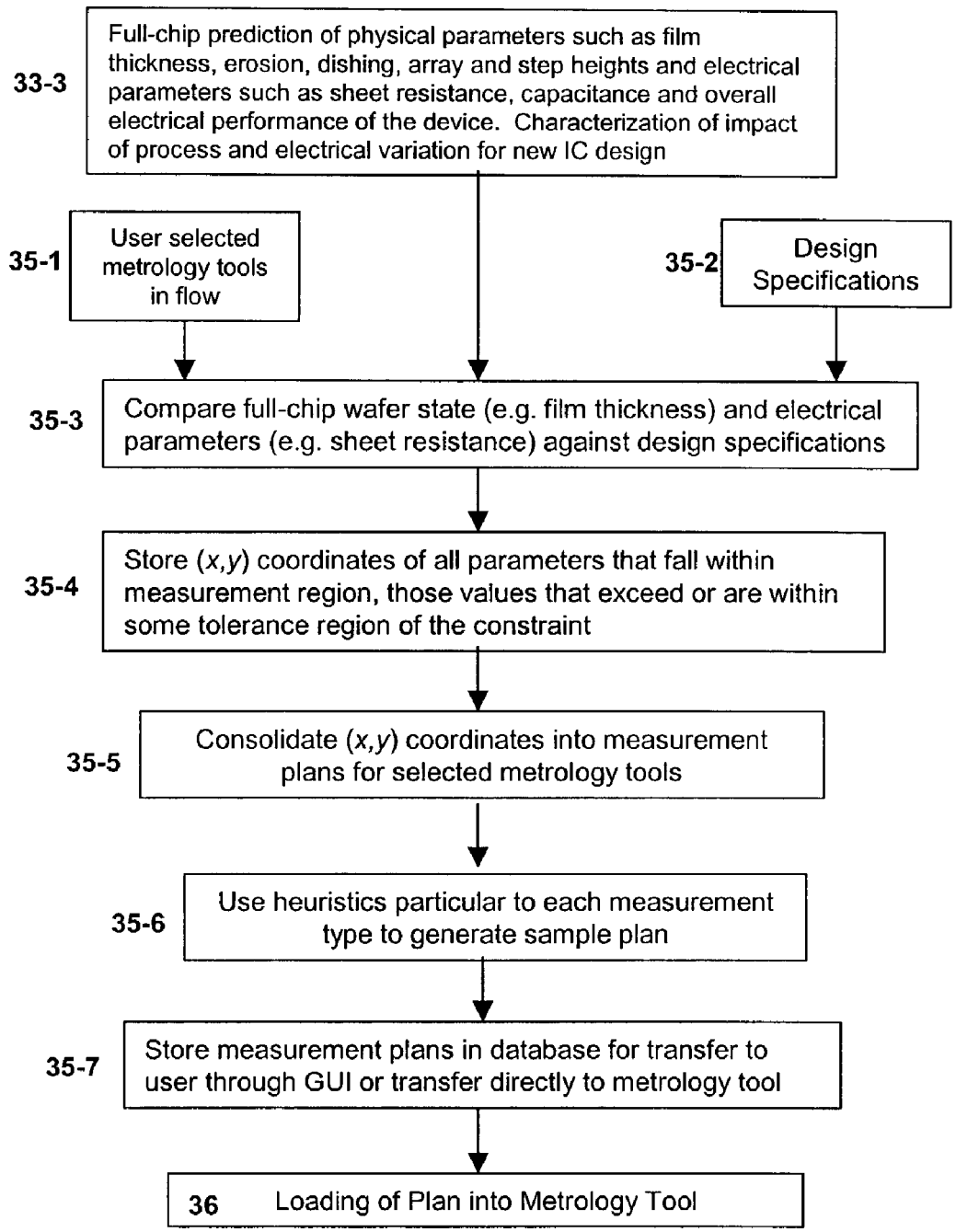
FIG. 12 provides detailed steps of how the method generates full-chip measurement plans.

The steps involved in generating the measurement plan are described in the flow diagram of FIG. 12. Full-chip predictions of wafer-state and electrical parameters, 33-3, are input along with chip design specifications and requirements, 32, and the selected metrology tools, 35-1. The full-chip wafer and electrical parameters are against the design specifications and requirements, 35-3. As described in FIG. 11, the design constraints are used to set up thresholds on the predicted wafer-state and electrical parameters. Also a tolerance region is defined where if a particular prediction is within some distance, for example 15% of the limit, or exceeds the constraint, that location is flagged and stored. A tolerance region is preferred in that predictions may be off by 10–15% depending upon the amount of drift in the process. As such, some modeling error needs to be accounted for. The tolerances may also be defined statistically so that there is a limit on the number of measurements to be taken and the most likely locations to create problems are given higher priority. This computation could also be extended to hypothesis testing and other statistical fault diagnostic methods where the probabilistic likelihood of a particular location or feature impacting chip performance is maintained.

The x and y coordinates of all the measurement locations are consolidated 35-5 and heuristics are used to generate measurement plans for selected metrology tools 35-6. For example, severe dishing which results in higher sheet resistance may be measured using a profilometry tool whereas residual copper that may result in a jumper could be measured using a film thickness metrology equipment. Measurement tools require recipes and as such, the heuristics are used to generate the measurement recipes and format it appropriately for a given tool.

The measurement site plans and recipes are stored in the database 35-7, which allows for transfer to the user via the GUI or electronic file transfer 35-7. It is useful to automatically transfer 35-7 and load 36 the measurement plan and recipe to the metrology tool. It is possible to supply the metrology tool with a measurement plan consisting of a number of sites to measure and metrology tool settings, in which the plan is generated based only upon model prediction outputs. As stated previously, the approach may also generate measurement recipes for more than one metrology tool, as in the example of using both thickness and profilometry to measure copper erosion. In such cases, the measurement recipes for both tools may be stored in the database 35-7.

The advent of computer controlled measurement decision systems also allows the method to be used dynamically, that is to iteratively provide measurement site and recipe information to direct measurements and use the results of those measurements to generate additional measurement sites or recipes. Measurement data often indicates drift in a manufacturing process and as such the model used for prediction needs to be tuned or a more accurate calibration acquired. In such cases, there is little value in continuing to make measurements until a more accurate prediction and measurement directive is obtained. A more accurate prediction may be acquired with a model calibrated for a different process state and may be selected from other calibration models 257, 260 and 263 in a database 274, as described in more detail later in FIGS. 24 and 25.

Figure 13A:
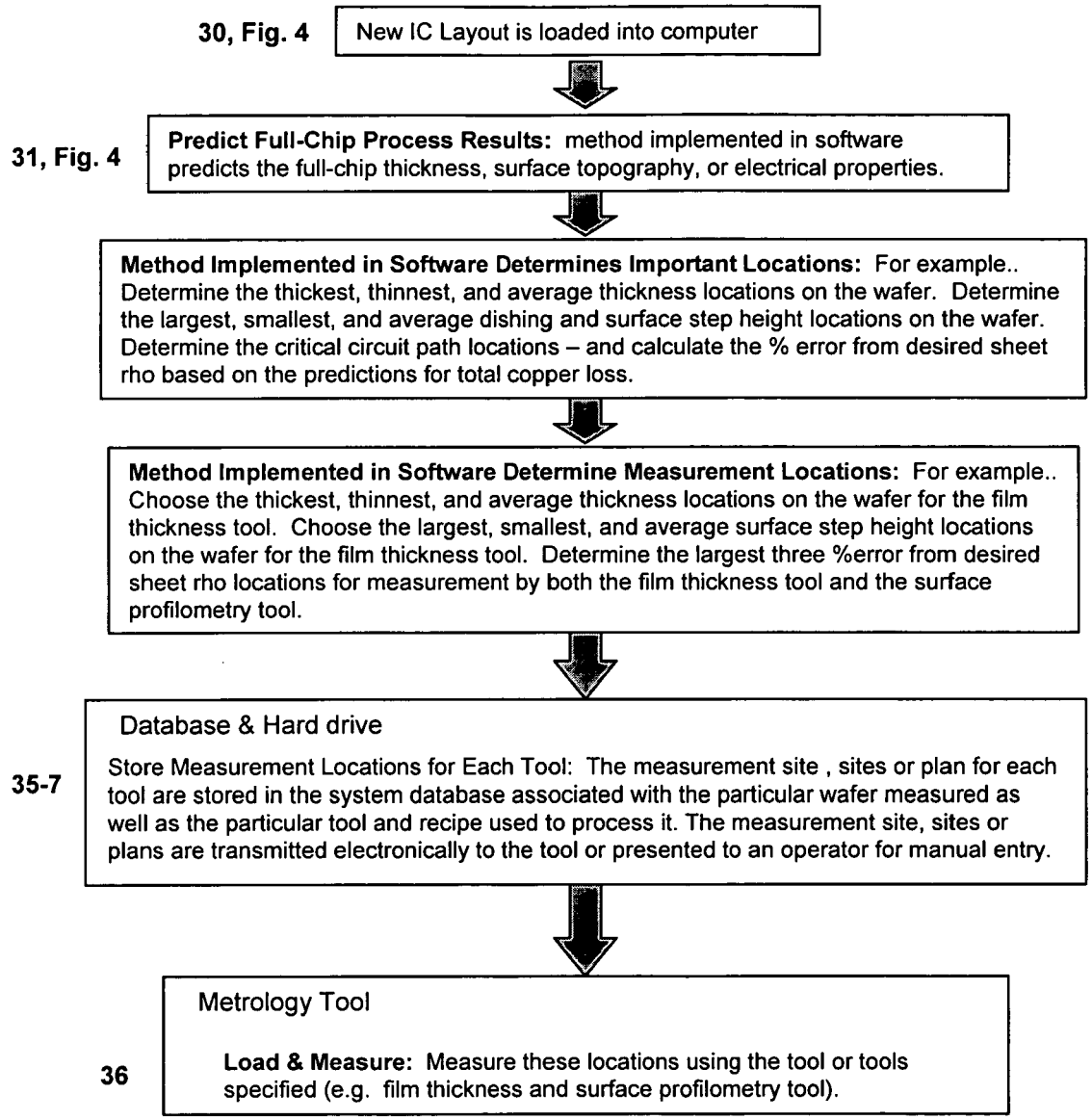
FIGS. 13A and 13B provides a table of heuristics for how specific measurement plans may be generated.
Figure 13B:
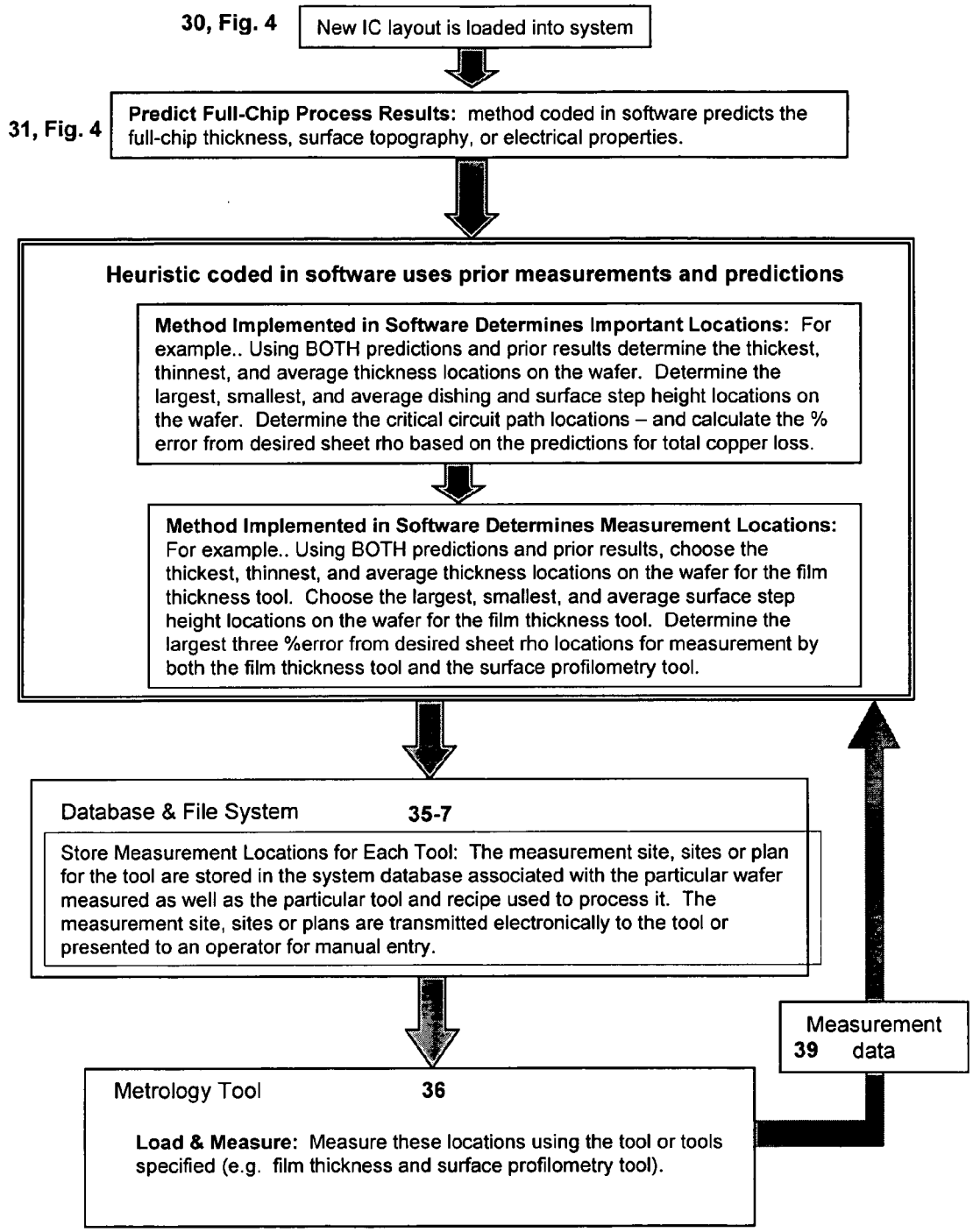

A heuristic may use the method to measure one site at a time, for example maximum thickness variation, to check where the copper may not have cleared in a CMP process. Another heuristic may supply measurement sites to the tool and based upon the actual measurements, select another calibrated model that better fits the current state of the process. FIGS. 13A and 13B provide examples of the some of the heuristics the system may use for post-CMP measurements in damascene process flows. In FIGS. 13A and 13B, heuristics are illustrated for the serial approach where the measurement plan is generated from the model prediction only (FIG. 13A) and for the iterative approach where the heuristic uses iterative measurements along with the full-chip prediction to select the next measurement site or sites (FIG. 13B).

Thus, the method may be used with any number of heuristics to determine problematic areas across the chip or wafer. An application of the method for dynamic measurement and graphical description of several heuristics are described later.

d. Implementation and Operation

A common use of the method is to direct metrology tools where to measure within a die and within one or more dies across a wafer. This direction is primarily based upon the effects of pattern dependencies on processing at the die and wafer level. The method may be used any kind of metrology too, including with film thickness, resistivity, ellipsometry, profilometry, atomic force microscopy, optical measurement equipment, electrical capacitance and resistance testers, or electrical material property testers (e.g. four-point probe sheet resistance testers). The method may be used in any mode of operation of metrology tools, for example, in an off-line, in-line and in-situ manner.

Figure 14A:
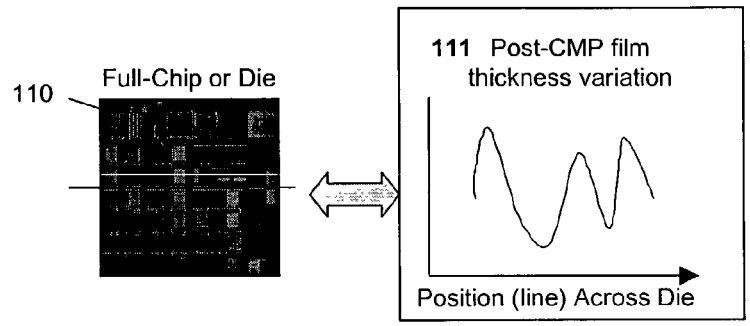
FIG. 14A illustrates the method used to characterize full-chip or within-die variation a linear plot of film thickness variation is shown.
Figure 14B:
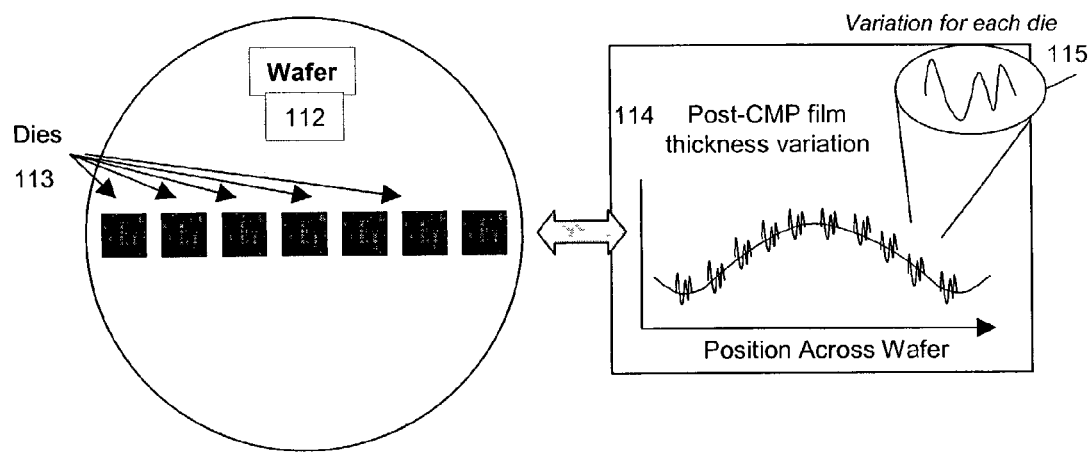
FIG. 14B illustrates the method used to characterize wafer level variation by selecting and characterizing multiple die across the wafer. The linear plot of within die variation is shown relative to a linear plot of wafer level variation.
Figure 14C:
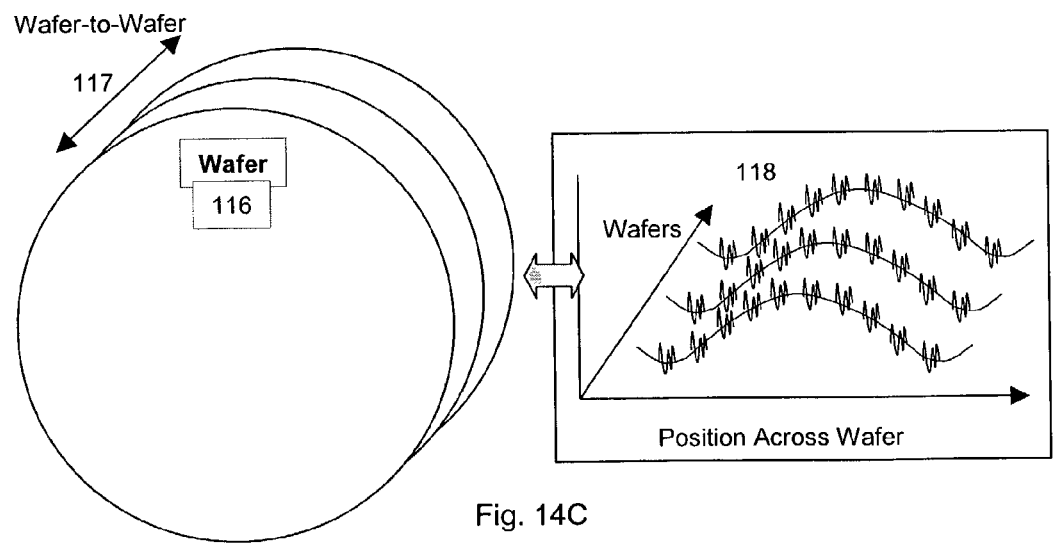
FIG. 14C illustrates the method used to characterize wafer to wafer variation by selecting and characterizing multiple die across the wafer and performing this for multiple wafers at different times in the process life cycle.

FIGS. 14A through 14C describe implementations of the method to characterize variation at the die and wafer level, as well as, wafer-to-wafer. As shown in FIG. 14A, the method may be used to determine measurement locations across a full-die 110 based upon wafer-state or electrical variation across the die 111. As shown in FIG. 14B, the method also allows for multiple die 113 to be characterized across the wafer 112 by using models calibrated for each die location, see 34 in FIG. 4. In this application, the model predictions are generated for each die 115. The individual and aggregate die variation 114 is compared against design specs and measurement plans generated accordingly, see 35 in FIG. 4. Variation at the wafer level is often radial, so normally three die are used; one at the edge of wafer, one at the center of the wafer, and one at some distance in-between. As shown in FIG. 14C, the method can be used to characterize and direct measurement across multiple wafers 117. Often process drift results in changes in how a wafer is processed. By utilizing a drift component with the process models, model based prediction can be used to identify problematic areas that require measurement or that may be drifting toward a design specification or constraint. In this approach, models calibrated at different times in the process life cycle are used to predict how variation will behave from wafer to wafer 118. This characterization can be used to direct the metrology tool on which areas need to be measured and potentially add problematic sites as drift gets worse.

Figure 15A:
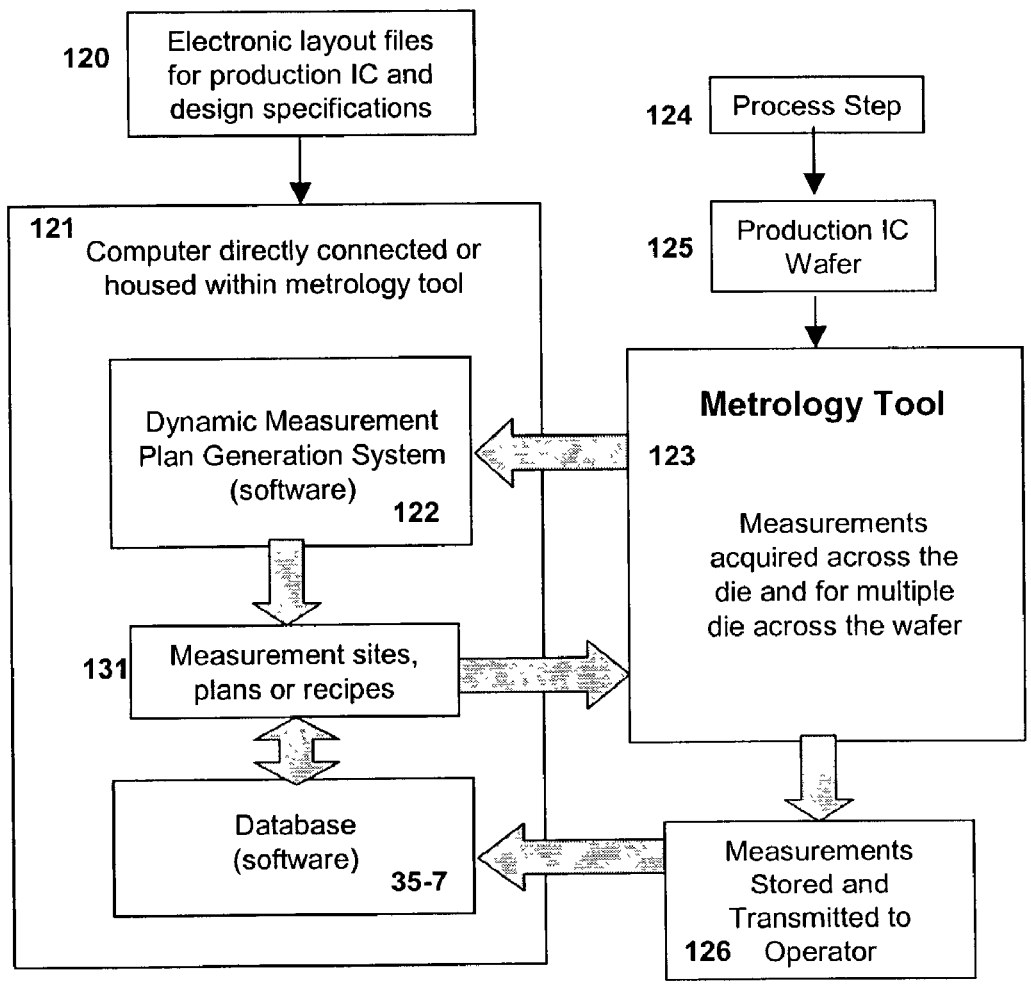
FIG. 15A shows application of the method for use with a metrology tool

There are different ways in which to interact with the metrology tool, as shown in FIG. 15A. One approach is to have the system 122 reside on a computer 121 directly connected to the metrology tool 123 or housed within the computer control system of the metrology tool. The design specifications and layout files (if extraction has yet to be done) or layout extractions 120 for the production wafer are input into the method. The system 122 processes the design and generates a measurement plan, which is communicated to the software that actually commands the measurement process. After a particular process step 124 such as CMP, the wafer 125 is measured by the tool 123. The measurements are normally stored on electronic media and may be transferred to the operator or process engineer via a GUI 126. An optional approach is for the method to reside on a computer that is connected to the metrology tool via a network connection. A network may include electrical or optical communication via an extranet, intranet, internet or VPN.

Another implementation of the method uses the optional component (see 40 in FIG. 4) to tune the models when errors occur between the predicted variation and the actual measurements. In this approach, shown in FIG. 15B, the design specs and layout information 120 are provided to the dynamic measurement method 129. The method 129 may reside on a computer 121 connected to the metrology tool or housed within the computer control system inside the metrology tool 123. The design specifications and layout files (if extraction has yet to be done) or layout extractions 120 for the production wafer are input into the method. The method 129 processes the design and generates a measurement plan, which is communicated to the software that actually commands the measurement process. After a particular process step 124 such as CMP, the wafer 125 is measured by the tool 123. The measurements are normally stored on electronic media and may be transferred to the operator or process engineer via a GUI 133. The actual measurements are also communicated back to the method where the errors between the predicted and actual measured parameters are used to tune or recalibrate the models and thus improve prediction for subsequent wafers 134.

Figure 15B:
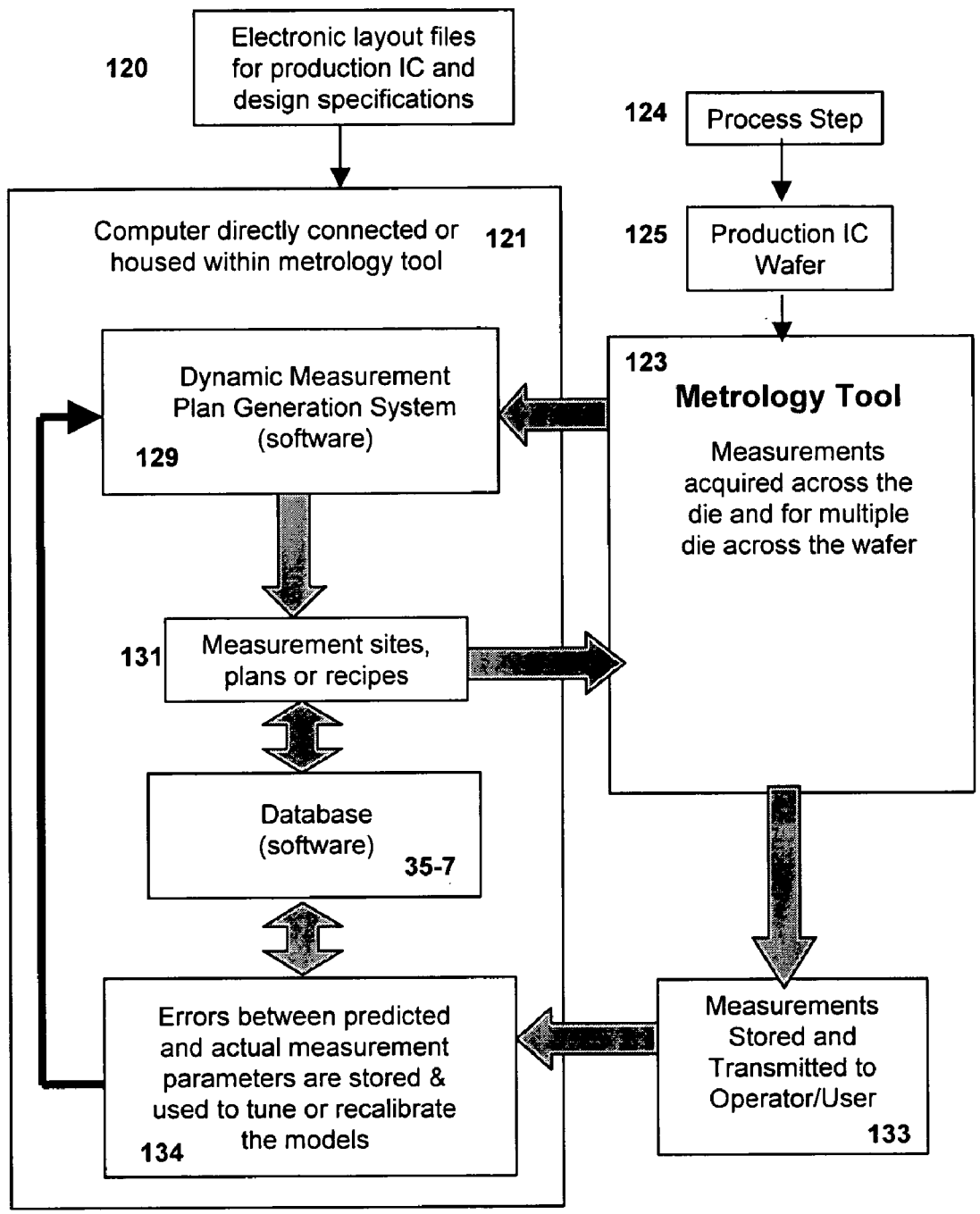
FIG. 15B shows application of the method for use with a metrology tool using feedback from measurement tool to tune or recalibrate process models.
Figure 15C:
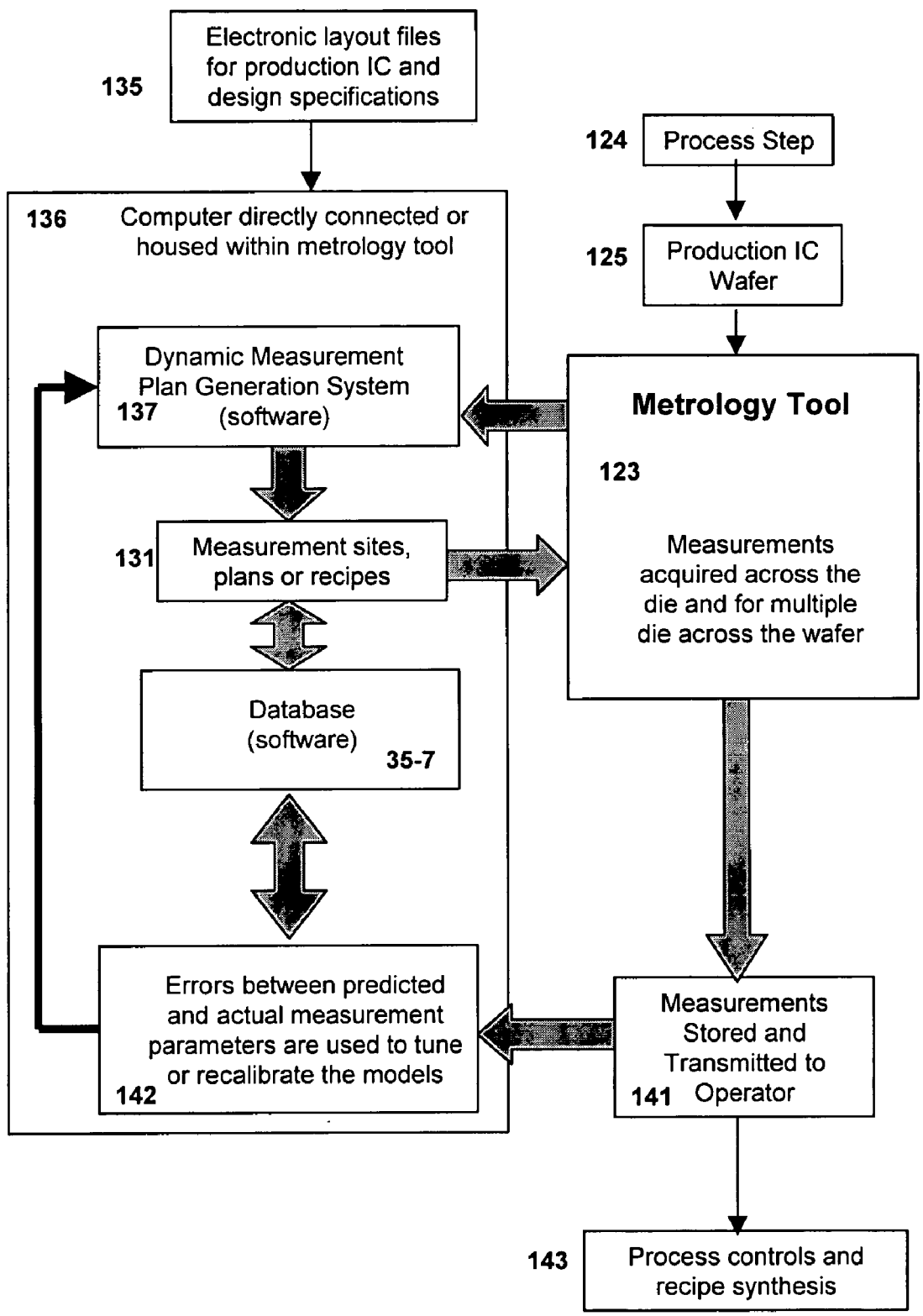
FIG. 15C shows application of the method for use with a metrology tool using feedback from measurement tool to tune or recalibrate process models.

Another implementation, shown in FIG. 15C, uses the same approach described in FIG. 15B but adds a component 143 that provides feedback to a process control system or to tools for optimizing process settings and performing recipe synthesis.

Figure 15D:
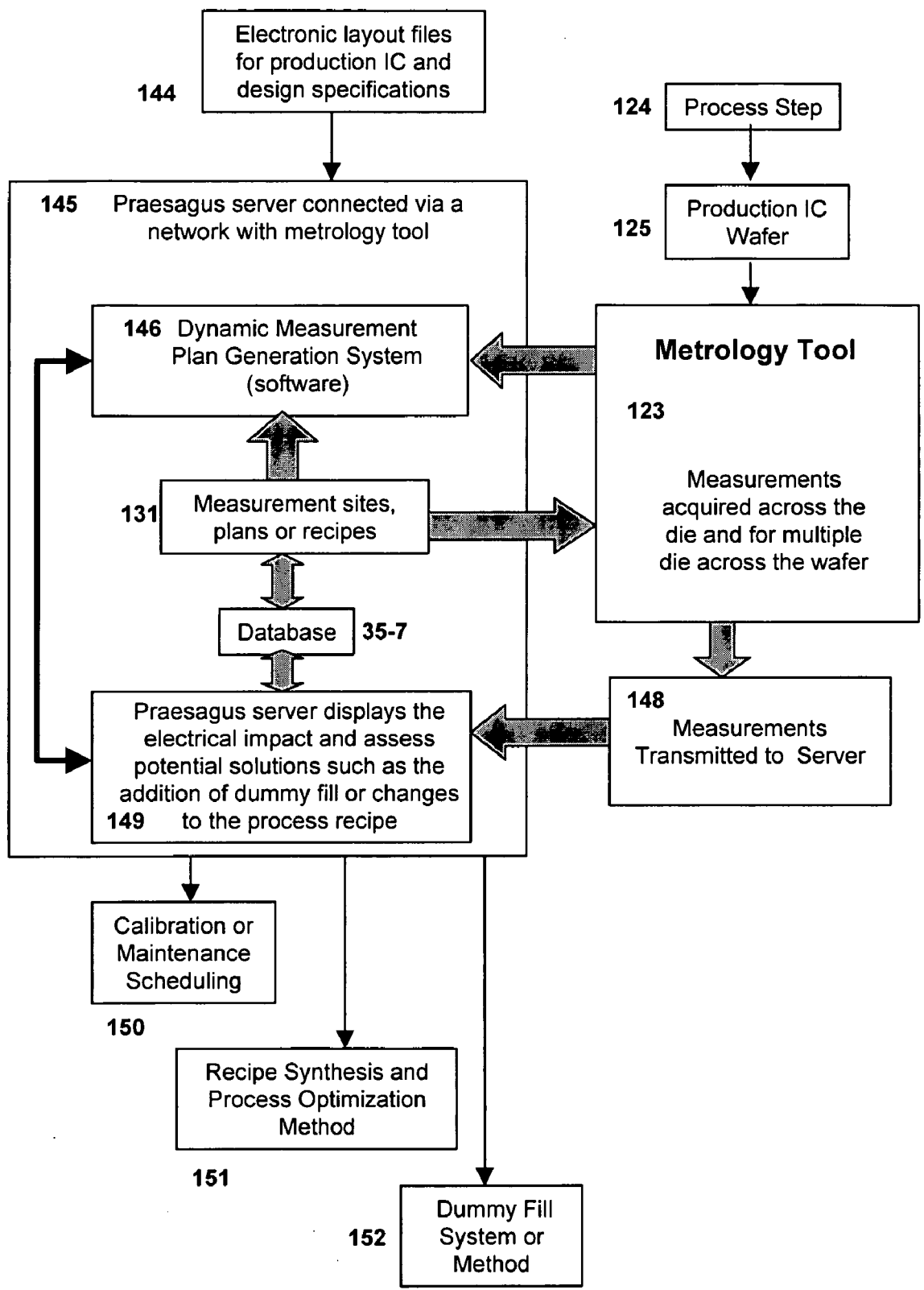
FIG. 15D shows application of the method for use with metrology tool providing feedback to a process control or process optimization or recipe synthesis system as well as providing feedback to a dummy fill tool.

Another implementation, shown in FIG. 15D, uses the same framework show in FIG. 15C, but also adds a component 149 that communicates measured variation to components or other systems, such as dummy fill tools 152 or process optimization methods 151 for minimizing the variation. Dummy fill tools modify the IC design to minimize the measured variation while process optimization seeks to adapt process conditions to minimize process effects that cause variation. An additional component 150 may also use the measurement feedback to schedule calibration and maintenance of the process tool.

The components that comprise the method are constructed in software (e.g. Java, Tcl, Basic, SQL) and modularized such that the method may or may not use all the components in the generation of measurement plans. For example, the method may only use process models to generate film thickness variation, compare this with design specifications and determine those locations that are most likely to violate the specification. The following descriptions will attempt to provide the general computational framework for the method.

Figure 16:
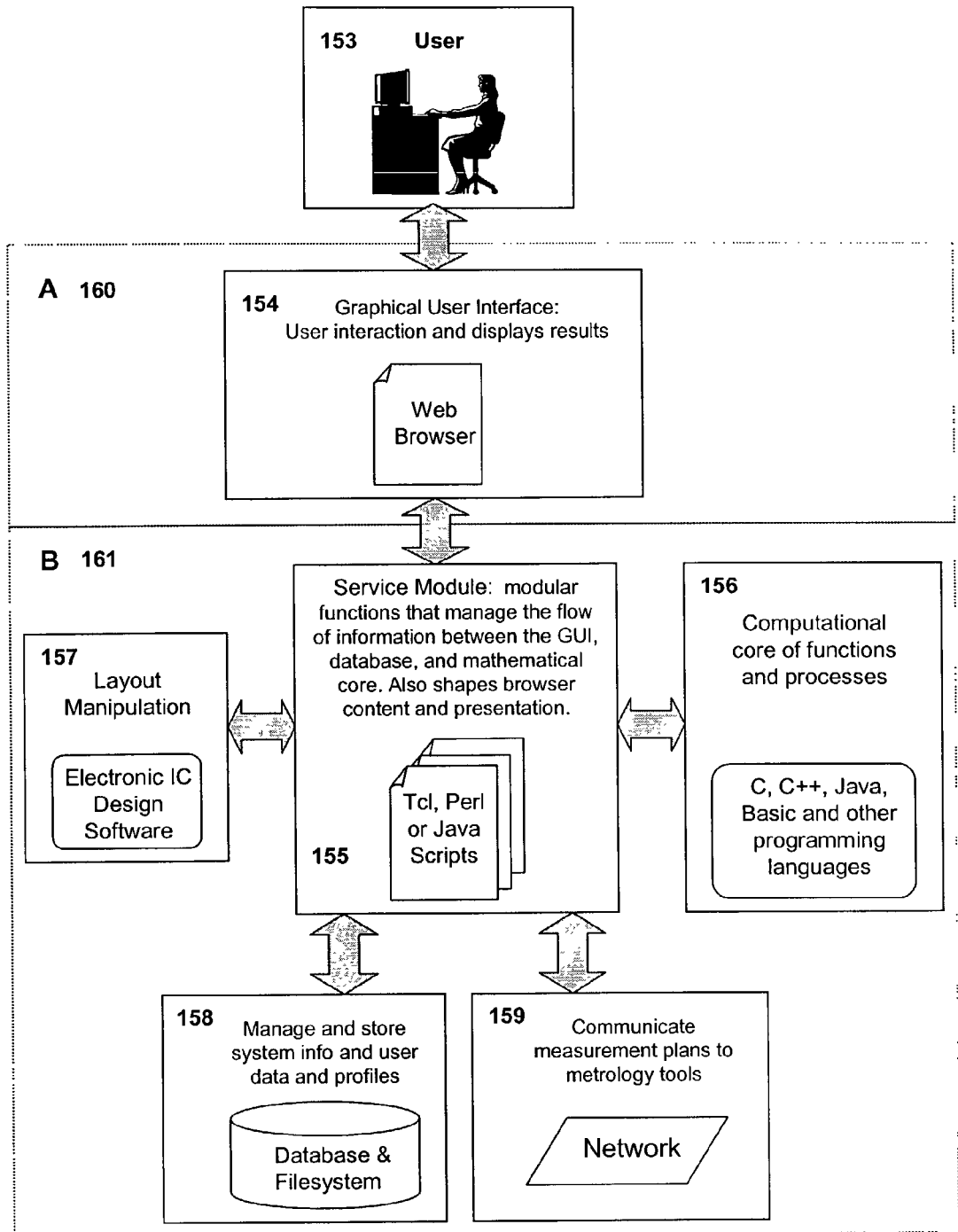
FIG. 16 describes a computer architecture for implementing the method

FIG. 16 shows a useful software architecture described in the following paragraphs. The user 153 communicates to the system through a graphical user interface (GUI) 154, such as a web browser. The GUI 154 allows the user to choose and upload electronic layout design files into the system and view measurement plans and measurement results. When the system is housed within a metrology tool, as described in FIG. 15, the user may be a tool operator, and the system may reside on the tool's command and control computer. The GUI may also reside on a computer monitor or touch screen built into the tool. An example of a GUI is shown in FIG. 11C.

In general the GUI, as defined and used throughout this section, allows the user to choose, upload or transfer from another form of electronic media, the desired design rules and electrical performance for the particular device described by the design files. The user may also use the interface to select process and electrical models from a server or transfer or load models from another electronic media source or computer. The user may also use the interface to monitor the selection of measurement sites and manually add sites to generated measurement plans. The user may also use the interface to review the results of tool measurements and direct how those measurements may be used to generate process recipes or improve dummy fill. These results may be in the form of, for example:

histograms and other statistical plots,
full-chip images of wafer-state or electrical parameters at some point in time,
movies of full-chip film thickness, dishing, erosion progression during a process step or flow,
movies of full-chip electrical parameter variation such as sheet resistance and capacitance, and
tables of values.

The GUI 154 communicates with a series of software components, services or functions 155 (referred to here as the service module) that manage the flow of information throughout the system to the database and file system 158 and computational core processes 156 as well. The services 155 are modular and serve to initiate the computational core processes 156 that execute portions of the method and to assemble and format the content for display in the GUI. The modules may be created as Java or Tcl scripts which enable easier interaction with the database using embedded SQL code and with the GUI using HTML, XML or dynamic HTML interpretation. These components also allow the ability to initiate mathematical processes that perform the computation necessary to determine the correct placement of dummy fill within the layout.

The service module 155 communicates with the computational core of processes and functions 156 that execute computational steps of generating measurement plans and heavy computational processes such as the process and electrical models and simulations. This core also does the effective pattern density computation. This communication may include instructions, data, model parameters, prediction results in tabular, image or movie forms and pointers to files in the file system.

The service module 155 also communicates with electronic IC design software or layout manipulation software 157 to manipulate layout information during extraction or to communicate measured variation to assist in the addition of dummy fill.

The database 158 communicates with the service module 155 via SQL commands to manage system data such as measurement sites and locations, user profiles that specify permissions and preferred content and presentation, user data which may include layout extraction data, design specifications and rules, model parameters for particular tools and processes and full-chip prediction results such as surface topology, resistance and capacitance. Examples of databases that may be used include Oracle, Informix, Access, SQL Server and FoxPro. The file system retrieves and stores information saved as files, typically too large to efficiently store in the database.

The system may communicate measurement plans directly with the control software that directs the measurement tool where to measure. This communication may be done via a computer network 159 or computer bus.

If the functionality shown in boxes A 160 and B 161 resides on one computer then the system is configured as stand-alone. If A and B reside on different computers and communicate across a network, the system is normally considered a client-server configuration. A network may include electrical and optical communication via an extranet, intranet, internet or VPN. In some cases both A and B will be part of the metrology tool and the user, 153, is the tool operator.

Figure 17A:
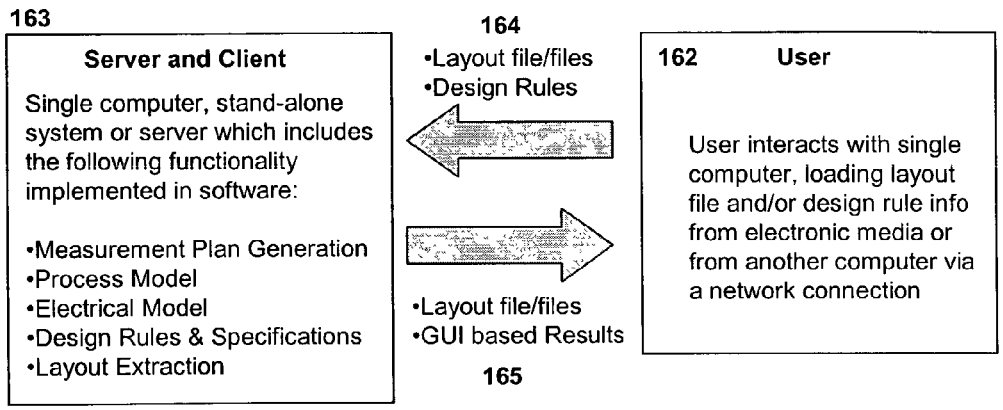
FIG. 17A describes stand-alone operation of the method
Figure 17B:
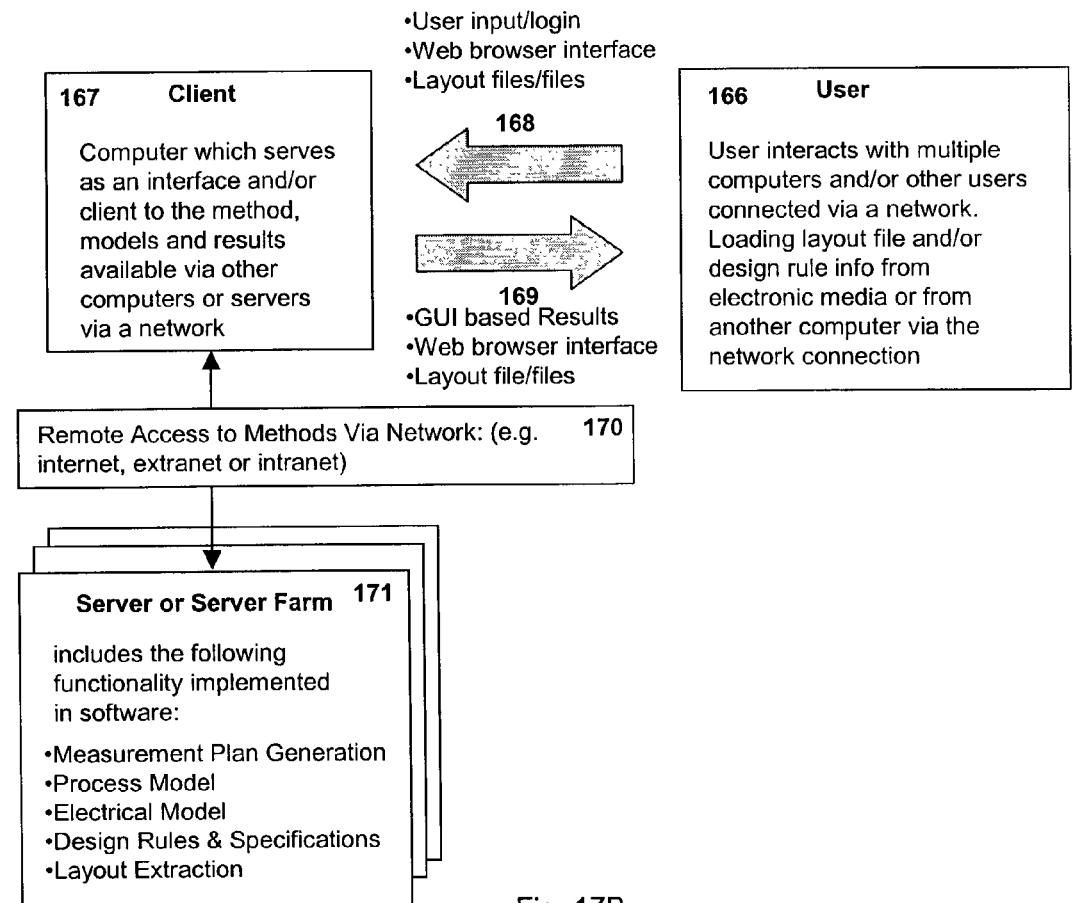
FIG. 17B describes client-server operation of the method

Here we describe a few useful operational frameworks for applying the system with a dummy fill method. Other frameworks are also possible. There are three basic computational frameworks described in this section that constitute good methods of operation and delivery of the functionality based upon a user's needs. The first framework presented is a stand-alone configuration, shown in FIG. 17A, where all the components (154–159 of FIG. 16) reside in 163 and data in and out 164 and 165 are accessed from a single computer. The second framework is a client-server configuration, shown in FIG. 17B, where the GUI resides on a client computer 167 also shown as box A in FIG. 16, which accesses, via a network 170 the other components, shown as box B in FIG. 16, residing on a server or multiple servers, a server farm 171. The communication could be done via internet, intranet or extranet networks 170 and the server may serve one or more clients or users.

Figure 17C:
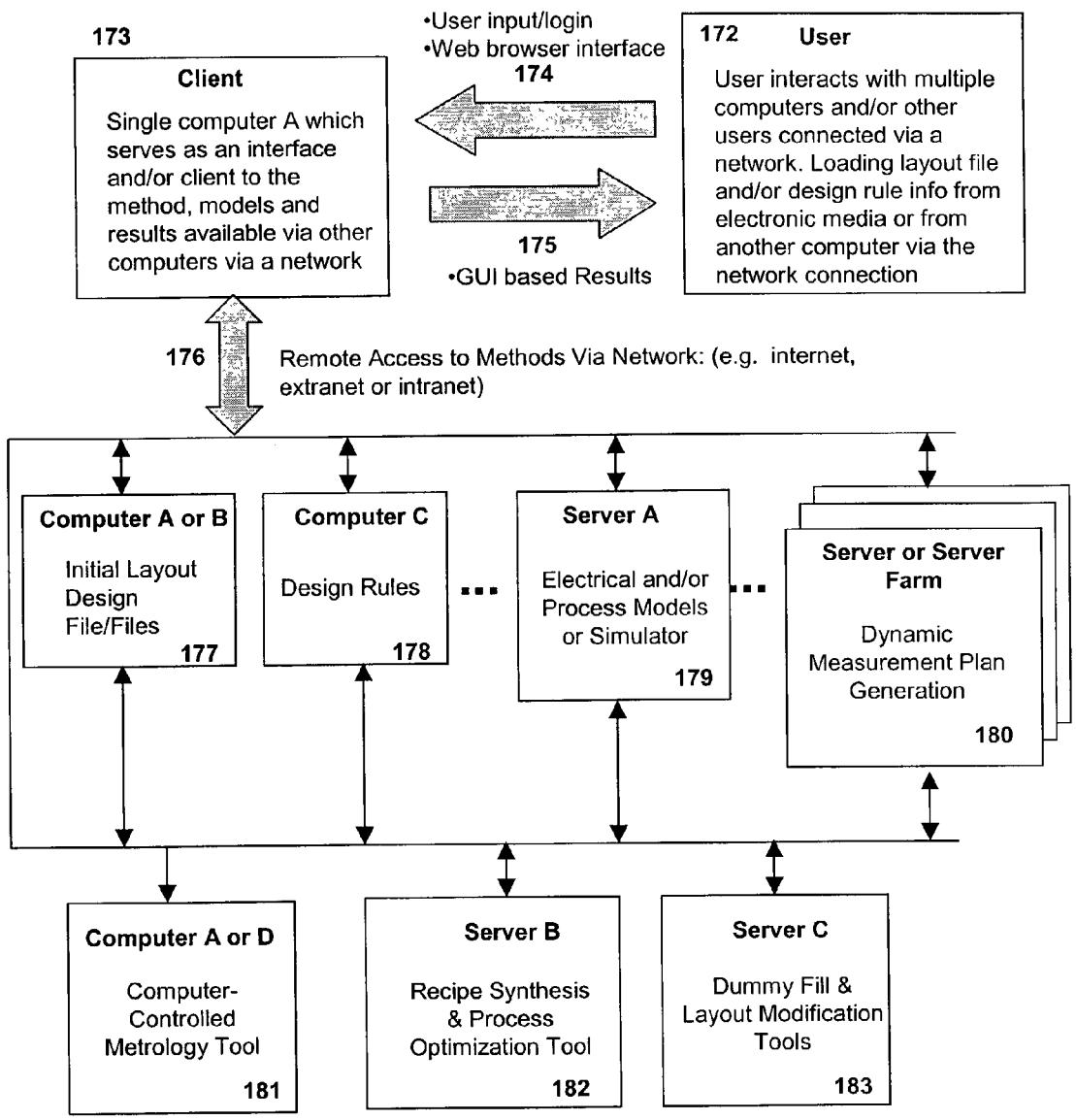
FIG. 17C describes network operation of the method

The third framework, FIG. 17C, is an extension of the client-server model that includes communication via a network 176 with additional computers that may contain one of more components (177–183) of the system. For example, a design house may utilize the dynamic measurement plan generation via the server 180 but remotely utilize separate computers which house process models or model parameters 179 and design specifications and constraints 178 that are provided by the fab or a process development group. This framework also includes the transfer of measurement plan data to control computers on metrology equipment 181 the return of actual measurements to the server 180 and the use of measurement functions by servers that contain tools to improve process recipe selection 182 or place dummy fill 183 via a direct network connection or internet connection 176.

Figure 18:
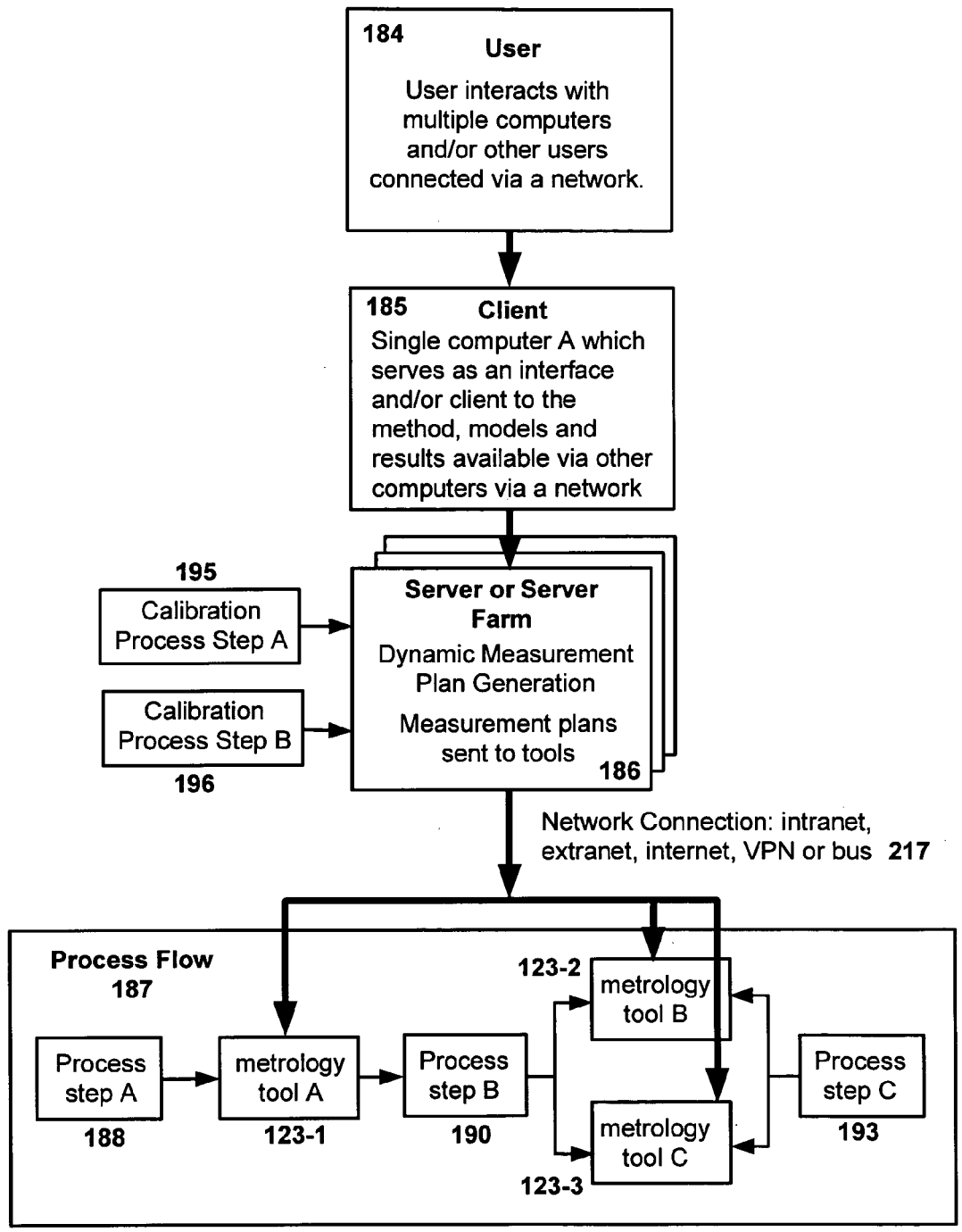
FIG. 18 describes operation of the method with multiple metrology tools in a process flow.
Figure 22A:
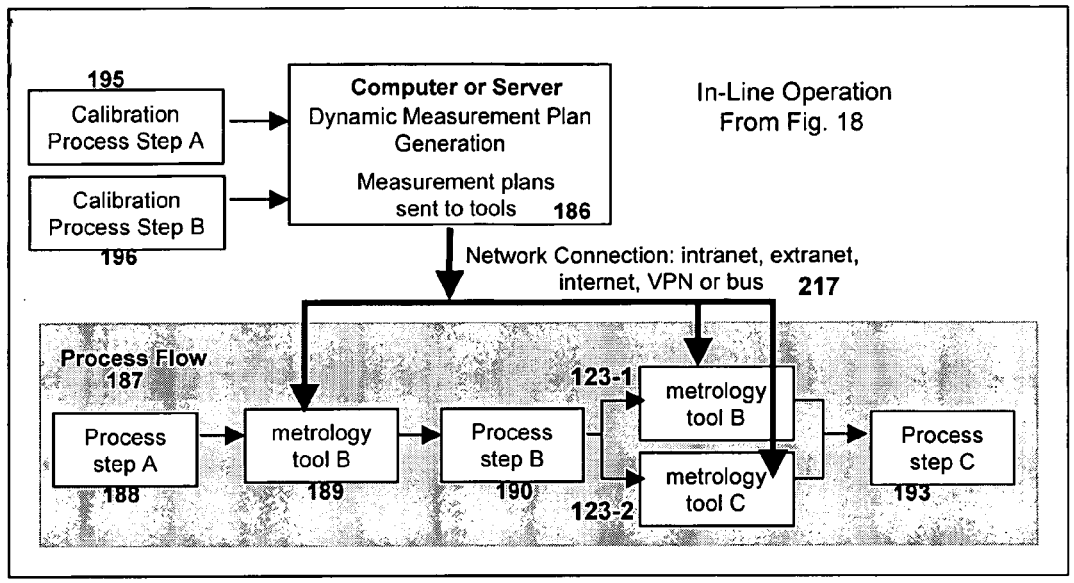
Figure 22B:
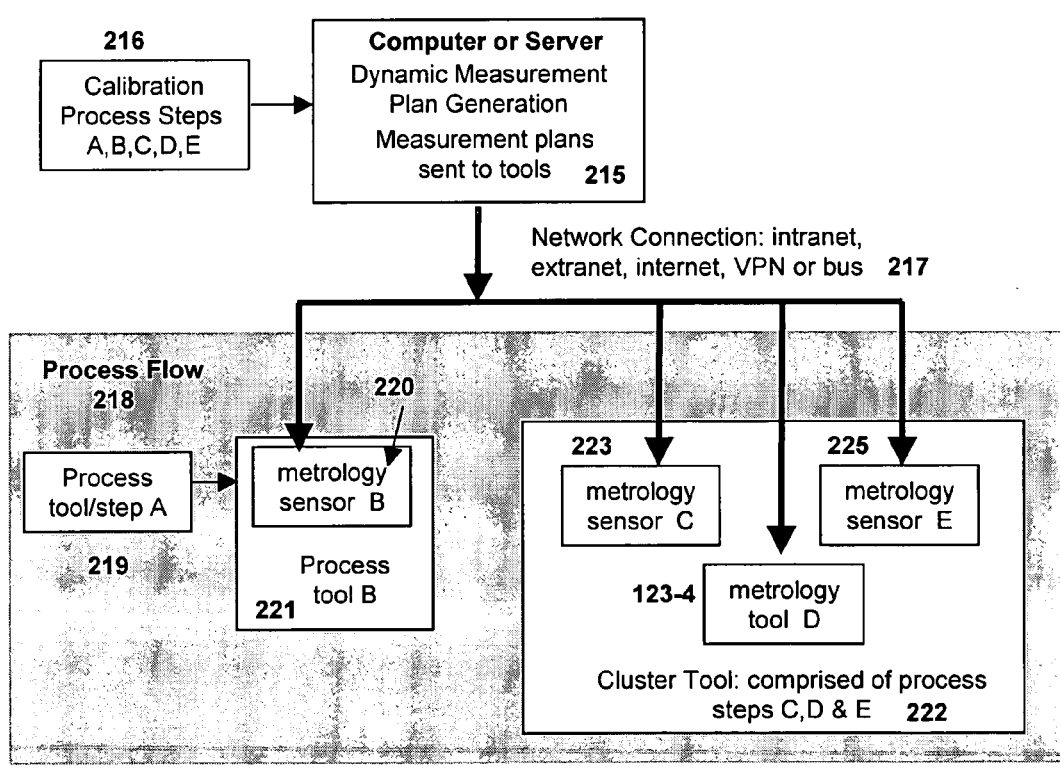

The frameworks shown in FIGS. 16 and 17 can be used with multiple metrology tools, where the dynamic measurement software resides on a server and communicates with the metrology tools via a network 217 (FIG. 22B). A network may include electrical or optical communication via an extranet, intranet, internet or VPN. This configuration is shown in FIG. 18 where the user 184 and client 185 communicate to the method residing on a server or utilizing a server farm 186. Models are calibrated for each process step in the process flow 187. In this example, calibrations 195 and 196 are performed on models for process steps A 188, B 190, and possibly C 193. The calibrated process models are used as part of the method, shown in FIG. 4, and the server 186 generates measurement plans for the metrology tools A 123-1, B 123-2, and C 123-3. In this framework, all the functionality described in FIG. 17C, such as the use of measurement data as feedback for process optimization and dummy fill, is available.

e. Applications of Method

The method may be applied to a wide range of metrology applications. The implementations described above may be particularly useful for the development of interconnect structures and processes as well as the introduction of low-k materials. Metrology efforts will transition from measurement of test structures in scribe lines to measurement of active areas. This is particularly true for copper and low-k interconnect.

Interconnect technology poses challenges in the introduction of copper damascene and low-k dielectric materials. Copper damascene processes may require metrology to determine the local and global planarity of electrically chemically deposited and chemically mechanically polished films. The largest variation in thickness is due to pattern dependencies and this variation is exacerbated as more interconnect (metal) levels are added. Film thickness may be measured using profilometry, optical reflectance, ellipsometry and future methods (e.g., measuring multiple-film layers may include laser stimulation of acoustic and thermal waves).

In particular, the method may be applied to determine measurement sites and sample plans based upon a prediction of film thickness variation in electrically chemically deposited (ECD) film thicknesses and dishing and erosion in chemical mechanical polished films. These wafer-state parameters may be used with electrical models to predict electrical impact across a chip and thus identify potential problematic areas for measurement.

The electrical performance of a circuit can be determined by the electrical characteristics of its interconnect, and the interconnect is often the limiting factor in high performance designs. These electrical parameters include the interconnect resistance and capacitance. Circuit performance metrics such as signal delay, clock skew, and crosstalk noise are functions of the interconnect resistance and capacitance. The interconnect resistance is a function of the wire resistivity, metal thickness, interconnect length, and linewidth. The interconnect capacitance is a function of the metal thickness, interconnect length, linewidth, linespace, and dielectric constant of the insulator (oxide) between the wires. The geometry of the interconnect structures impact their electrical properties. Therefore, significant variation in the geometry may affect the electrical performance metrics and thus may require in-situ measurement during fabrication.

Figure 19:
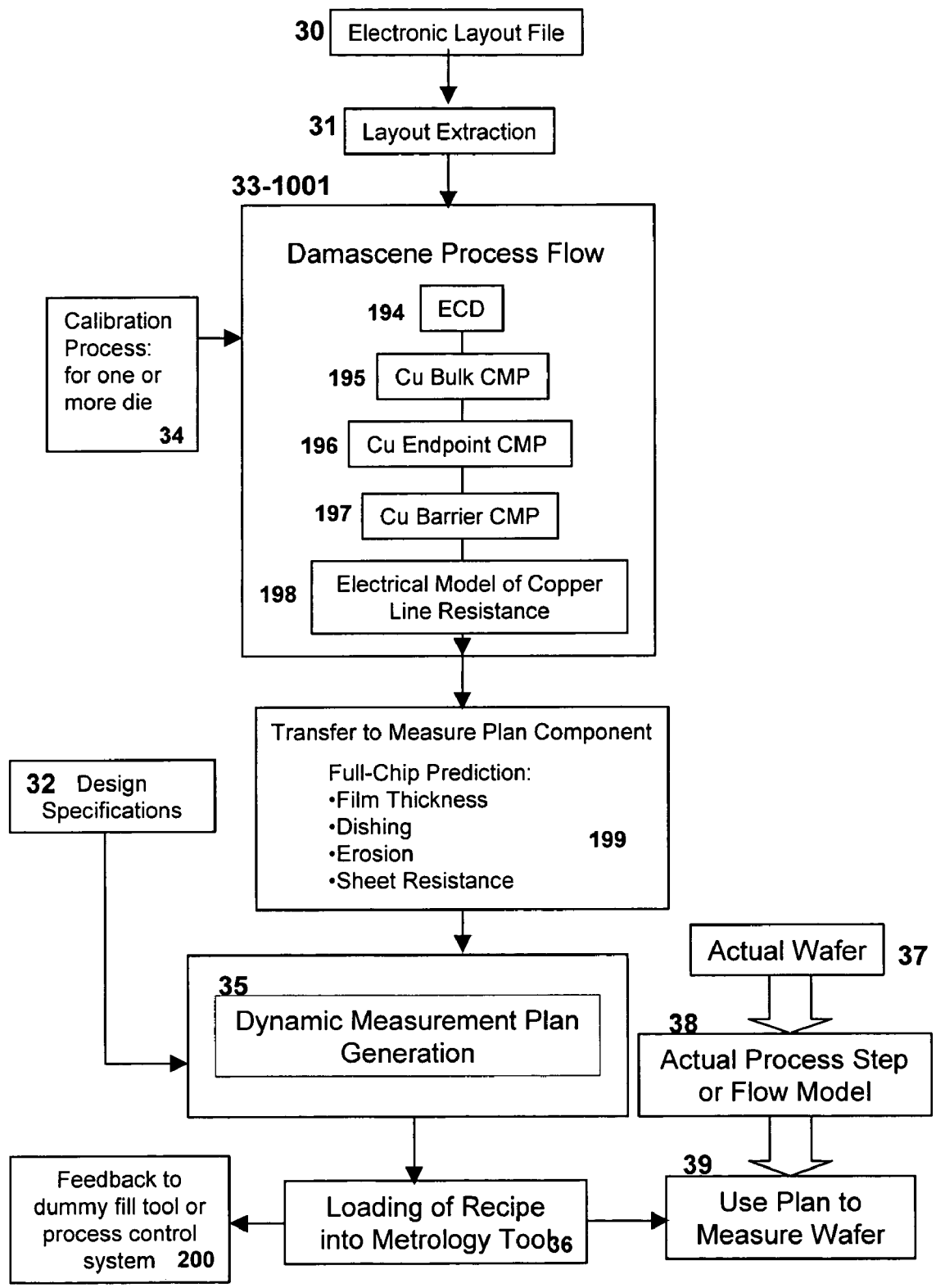
FIG. 19 describes the operation of the method with a damascene process flow

A flow diagram for how the method may be applied to a damascene process is described in FIG. 19. Similar to the steps shown in FIG. 4, pattern dependent models 33-1001 are calibrated 34 for the ECD 194, CMP bulk removal 195, CMP endpoint 196 and CMP barrier removal 197 process steps and used to generate full-chip film thickness, dishing and erosion 199. Electrical models 198 are used to generate full-chip sheet resistance variation 199. Some of the electrical parameters that may also be computed include variation in capacitance, interconnect RC delay, voltage drop, drive current loss, dielectric constant or cross-talk noise. The measurement plan generation component 35 receives design specifications and requirements that are compared with full-chip parameter variation and as described in section c., those parameters that fall within some specified tolerance or that exceed the design constraints are flagged for measurement and their location stored. The measurement sites and sample plan are uploaded into the appropriate metrology tool 36, either directly or via a network. Architectures for how the method or the system may operate with a metro logy tool are described in the prior section d. and in the FIGS. 15 through 18.

The most common metrology tools for determining planarity use profilometry and optical methods. The most common tools for determining electrical parameters use probe based current measurement in electrical structures. The measurement sites may also be used as feedback to a dummy fill tool or process control system 200, illustrated in FIG. 15D and described in Section d. Note the method may also be used to determine measurement sites for intermittent metrology between the process flow steps shown in 33. Such an implementation is shown in FIG. 18.

Figure 20:
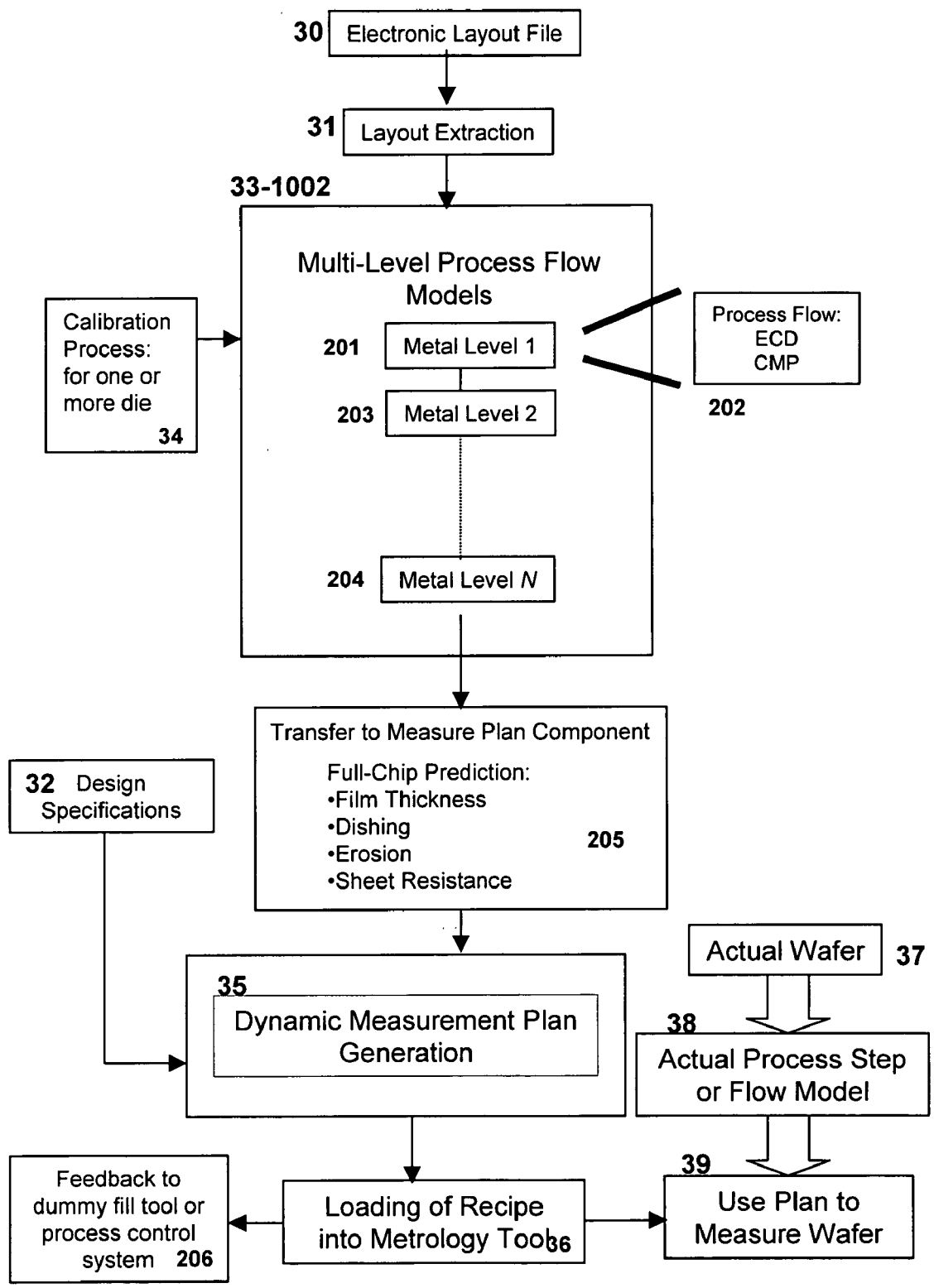
FIG. 20 describes the operation of the method for multi-level process flow

The damascene process flow described in FIG. 19 is for one interconnect layer. Often pattern dependencies and film thickness variation in a lower interconnect level propagate to higher interconnect levels. The method may be extended to characterize and identify problematic areas of a chip or wafer due to multi-level pattern effects. As shown in FIG. 20, process flow models may be extended to predict multi-level effects and the method may be used to determine the associated measurement sites that may violate design specifications. FIG. 20 illustrates that multi-level pattern dependent models may be used to capture effects between metal levels 1 201, metal level 2 203 to some higher metal level N 204. In this case, each level is represented by pattern-dependent process flow models 202. The method may be used to characterize multi-level effects and identify measurement sites after each subsequent metal level has been created. The measurement plans 131 are transferred 36 to a metrology tool or a user or operator and can be used to direct the tool to measure the wafer after processing 38.

The thinning of low-k dielectric material during CMP is a concern with regard to structural and electrical properties of the integrated circuit. There are several challenges for introducing low-k dielectrics into a damascene process flow. It is not only difficult to create a quality low-k film but also to maintain the dielectric constant after all the integration steps such as etch stop layers and barrier caps on copper and CMP stop layers. Many low-k yield problems are related to copper CMP where the softness of the low-k films results in CMP damage, dishing and erosion and subsequent electrical defects.

The method may be used with process steps calibrated for low-k materials to ensure local and global planarity. In particular this method may be used with stylus profilers and scanned probe microscopes to reduce the amount of necessary measurements and input throughput of low-k process flows. This method may be used with optical measurement tools as well.

Figure 21:
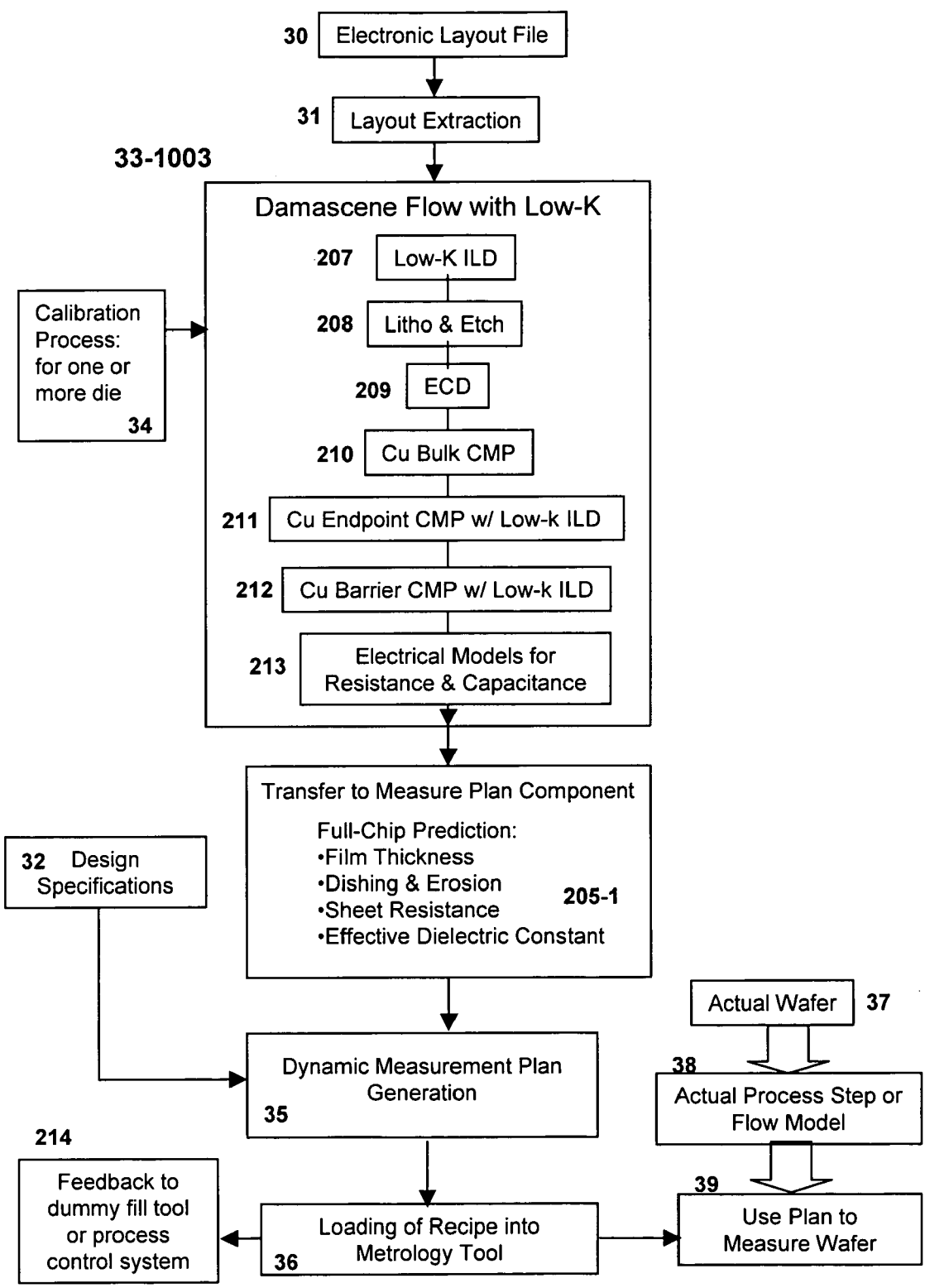
FIG. 21 describes the operation of the method with a damascene process flow that includes the introduction of low-k materials FIG. 22A describes the operation of the method with in-line metrology tools FIG. 22B describes the operation of the method with in-situ metrology tools FIG. 23A describes the operation of the method when the measurement recipe is loaded a priori to measurement of the wafer FIG. 23B describes the operation of the method when the measurement recipe or site locations are adjusted iteratively as measurement are taken FIG. 24A describes the operation of the iterative or dynamic measurement method using multiple process models that predict parameters according to some priority or heuristic FIG. 24B describes the operation of the iterative or dynamic measurement method using multiple process models that represent different stages of a process FIG. 25 describes the operation of the method when actual measurements are used to select a process model from a library to generate measurement recipes FIG. 26A describes the operation of the method to generate a measurement recipe for adapting design rules FIG. 26B describes the operation of the method to utilize a measurement recipe and subsequent measurement data for adapting design rules or specifications FIG. 27 describes the operation of the method with plasma etch processes to generate measurement recipes for CD and film thickness metrology tools FIG. 28A describes the operation of the method to provide feedback for adapting plasma etch recipes or control settings FIG. 28B describes the operation of the method to provide feedback for adapting CMP recipes or control settings FIG. 28C describes the operation of the method to provide feedback for adapting lithography recipes or control settings

A flow diagram is provided in FIG. 21 illustrating how the method can be used with low-k process introduction into a damascene process flow 33-1003. In this mode, the method is used to select measurement sites throughout the process flow with regard to problematic areas that result from low-k material and process introduction. This application requires the addition of process models that capture film thickness variation and related electrical and structural impact. Low-k material properties and the process steps in forming the ILD is modeled, added to the flow by the user and calibrated for a particular tool 207.

The ILD layer is patterned using a combination of lithography and etch 208. Dummy fill materials may be inserted in low-k films to adapt structural properties of these films with the intent of achieving a desired effective dielectric constant and reducing capacitance spatially across the full-chip when integrated into an interconnect process flow.

Metal or copper films are electrochemically deposited 209 and CMP is used to polish the metal film, often using a three-step CMP process composed of bulk removal 210, endpoint 211 and barrier removal 212. Pattern dependencies resulting from this process may be characterized relative to changes in the effective dielectric constant (including the use of wafer-state models and electrical parameters) and other capacitance effects. These pattern dependencies are used to extract full-chip variation in effective dielectric constant as a function of film thickness uniformity, dishing or erosion. Often electrical models 213 for resistance and capacitance are used to transform structural properties such as film thickness variation, dishing and erosion to full-chip electrical characterization. Some of the electrical parameters that may be computed include variation in sheet resistance, resistance, capacitance, interconnect RC delay, voltage drop, drive current loss, dielectric constant or crosstalk noise. Information is assembled and transferred to measurement plan component 205-1.

The predicted variation is compared against design specifications and requirements and measurement sites are appropriately selected 35 using approaches described in section c. The measurement sites and sample plan are uploaded into the appropriate metrology tool 36 either directly or via a network. Architectures for how the method or the system may operate with a metrology tool are described in the prior section d. and in FIGS. 15 through 18.

The method may also be used to enable active-area metrology with new processes to better enable process integration and improve film thickness uniformity. Most conventional bulk copper fill is done using electrochemical deposition where various chemical schemes that use additives, such as accelerators, leveler or suppressors, are used to improve planarity of metal film. The addition of dummy fill structures may be used with these various chemical improvements to achieve better planarity. Equipment makers are also looking to mechanical approaches to improve uniformity. NuTool has proposed such an approach that rotates the wafer and uses a pad to introduce the electroplating solution. The advantage of this contact plating technology is that the plated Cu film may be both locally and globally planarized. Another advantage is that this approach results in a thinner overburden of Cu that reduces the amount of CMP required in the next process step. This method may applied to any electrochemical mechanical deposition (ECMD) process by introducing a calibrated full-chip ECMD model into the process flow using methods described in the flow diagrams of FIG. 4.

The described functionality could be achieved with any process where a model of full-chip pattern dependencies is available. Current work in developing models that capture full-chip pattern-dependencies in plasma etch and lithography could be integrated into the process model flows of FIGS. 19, 20 and 21. The method may be used as shown in FIG. 18 to identify problematic areas after process steps in the process flow. However the method may also be used with in-situ metrology and cluster tools containing multiple process steps.

The described functionality could be achieved using in-situ metrology sensors and cluster tools where several tools and process steps are combined into one large piece of equipment. The similarity between application to on-line metrology tools and application of the method for in-situ sensing and cluster tools is illustrated in FIG. 22. For comparison purposes, FIG. 22A shows a section of FIG. 18 where the method is applied for use with in-line metrology tools within a process flow. (The flow is described in section d. description of FIG. 18.) FIG. 22B illustrates how the method similarly be used with in-situ metrology sensors and cluster tools. In this application, the method is implemented on a computer 215 which performs calibrations 216 on process models A, B, C, D and E. Pattern-dependencies are extracted and used to predict full-chip wafer-state and electrical parameters, which are compared against design specifications as described in section c. Measurement sites and measurement plans are chosen using steps described in section c. The computer communicates with the appropriate sensors or tools using a network or directly through a bus 217. A measurement plan is communicated to the in-situ metrology sensor 220 embedded in process tool B, which takes data at chosen measurement sites during processing. Measurement plans are also communicated to in-situ metrology sensors C 223 and E 225, which are embedded in a cluster tool 222. The cluster tool assembles multiple process steps and tools into one piece of equipment where metrology may be done either in-situ or in-line. In this example, a measurement plan is also communicated to an in-line metrology tool D 123-4, which is part of the cluster tool 222.

Figure 23A:
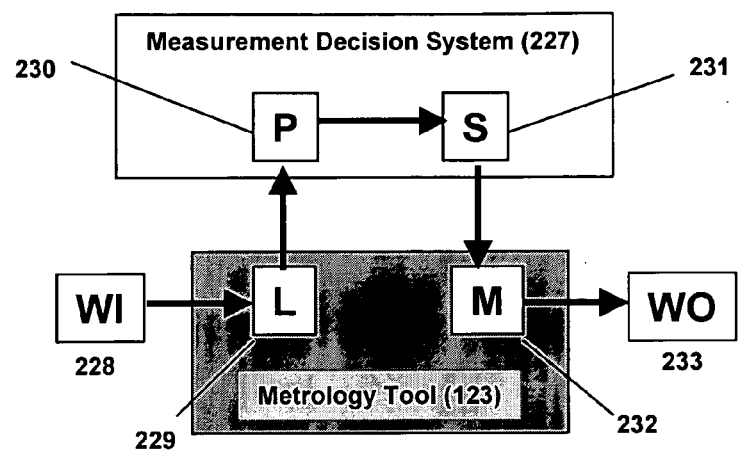

The applications described in this section may be used with any number of heuristics that determine the proper measurement plan. As shown in FIG. 23A, this measurement plan, consisting of one or more sites, may be generated from the full-chip predictions from one or more die across the wafer and transmitted to the metrology tool. In this application the processed wafer 228 is loaded 229 into a metrology tool 123. The method, as part of the tool's measurement decision system, generates a full-chip prediction for one or more die across the wafer. A heuristic is used to determine which sites to measure 231, for examples associated with a copper damascene process flow see FIG. 13A. The tool performs measurements 232 based upon the selected site or sites 231. The wafer is output and continues processing, 233. This application shows the metrology tool as in-line with production flow but someone skilled in the art can directly apply the same approach to use in-situ metrology as well. The measurement decision system may be integrated within the metrology tool or communicating via a network or bus.

Figure 23B:
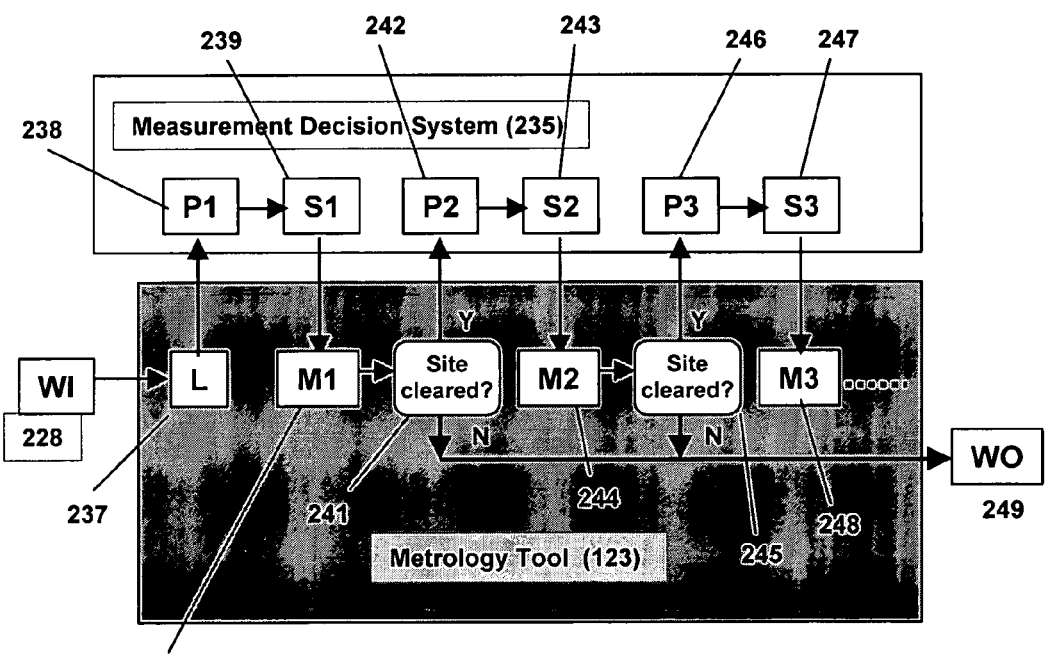

As shown in FIG. 23B, the method may used to generate dynamic measurement directives to the metrology tool. In this application, the measurement decision system iteratively directs measurements based on prior measurements of a given wafer. The incoming wafer 228 is loaded 237 into the metrology tool 234. The method, implemented within the measurement decision system 235, generates a prediction 238 and selects sites 239 based on a heuristic as defined in FIGS. 13A and 13B. The metrology tool 234 measures 240 those sites. Software that is part of either the tool or the measurement decision system determines 241 whether the measured site meets the design specifications, in this case the check is to see whether all the copper has been cleared or polished from the measured site. If the site does not meet the specifications or has not cleared, then it is output and either reprocessed or scrapped. If the site does meet the specifications, other likely problematic areas may be predicted 242 and selected 243 for measurement. The next chosen site or sites 243 are measured 244 and the process may repeat (245-248) according to the heuristic defined in the measurement decision system 235 until the wafer is finally output for further processing 249. This application shows the metrology tool as in-line with production flow but the same approach can be applied directly to use in-situ metrology as well. The measurement decision system may be integrated within the metrology tool or communicate via a network or bus. Integrating within the metrology tool allows for a more automated and perhaps shorter metrology step.

Any number of heuristics can be used with the method to generate measurement sites, either in a static or serial implementation, FIG. 13A or in an iterative or dynamic implementation, FIG. 13B. FIG. 24 illustrates two of the more useful heuristics for generating dynamic measurement schemes, using the three prediction blocks, P1 238, P2 242, and P3 246, shown in FIG. 23B.

Figure 24A:
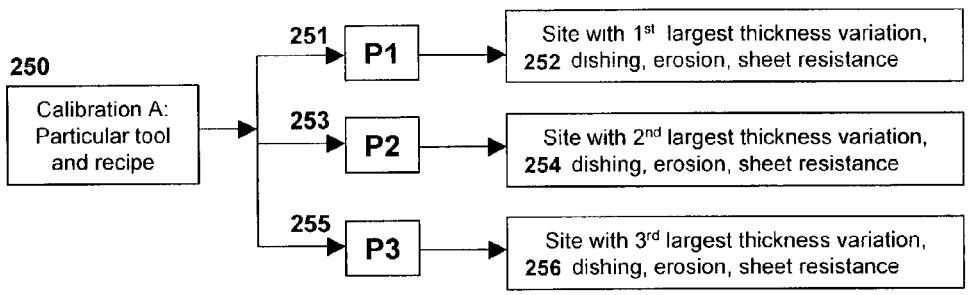
Figure 24B:
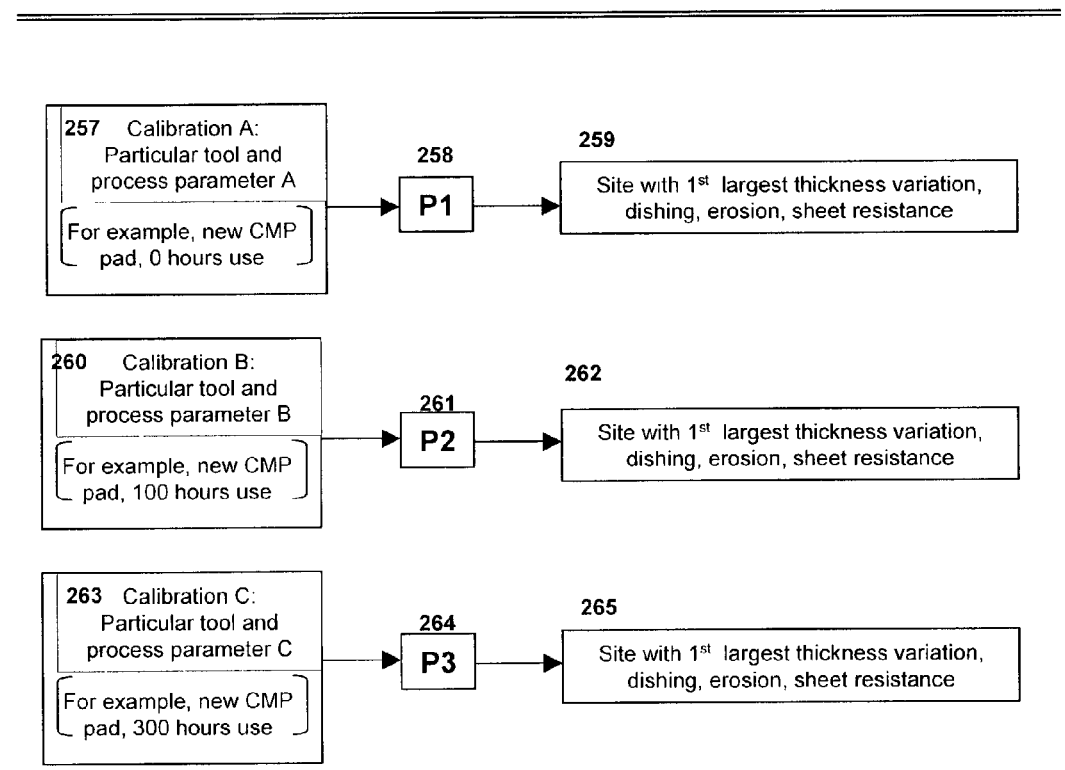

In the heuristic shown in FIG. 24A, a single model 250, calibrated for a particular tool and recipe setting, is used to generate full-chip predictions 251 for one or more dies across the wafer. A site is selected for measurement 252 based upon maximum variation. The measurement information from that site and the prediction model 253 may be used to select another site 254 for measurement. A measurement model, P2 253, may be the same as P1 251, or slightly tuned to accommodate process drift measured in sites 252. (This option is why it is shown as a different model in this application.) This process may continue using sites 252 or 254 to tune the model 255 and predict sites for the next measurement 256. One of the more simple cases is illustrated in this figure, where the measurement tool steps through site-by-site or die-by-die, by order of highest variation until the heuristic concludes the measurement for this wafer.

Process drift occurs when some element of a manufacturing or measurement process changes as a function of operating hours and re-calibration. For CMP, drift often occurs as a result of wear of the polishing pad. In some cases, pad wear requires a simple change to the effective removal rate in the CMP model, however in other cases a new calibration may be required. A robust measurement approach may be used based upon predictions and site selection for multiple models, calibrated for different tool conditions such as pad wear or for different recipe conditions such as slurry flow rate. One way to implement the robust measurement approach is to calibrate models based upon data taken at different points in the operational cycle of a process. In the case shown in FIG. 24B, three calibrations, 257, 260 and 263, are shown which have been done at 0, 100 and 300 hours for a particular pad. The calibrated models are used to generate three predictions, 258, 261 and 264 and the appropriate sites 259, 262 and 265 are measured. This approach allows the heuristic to span a range of operating parameters to ensure that drift is taken into consideration. Another option is for the heuristic to use the selected measurements from a model P1 258 to determine whether significant drift has occurred (e.g. predictions do not match the actual measurements for those sites) and if so, load another model P2 261 and make further measurements until the proper model is determined.

Figure 25:
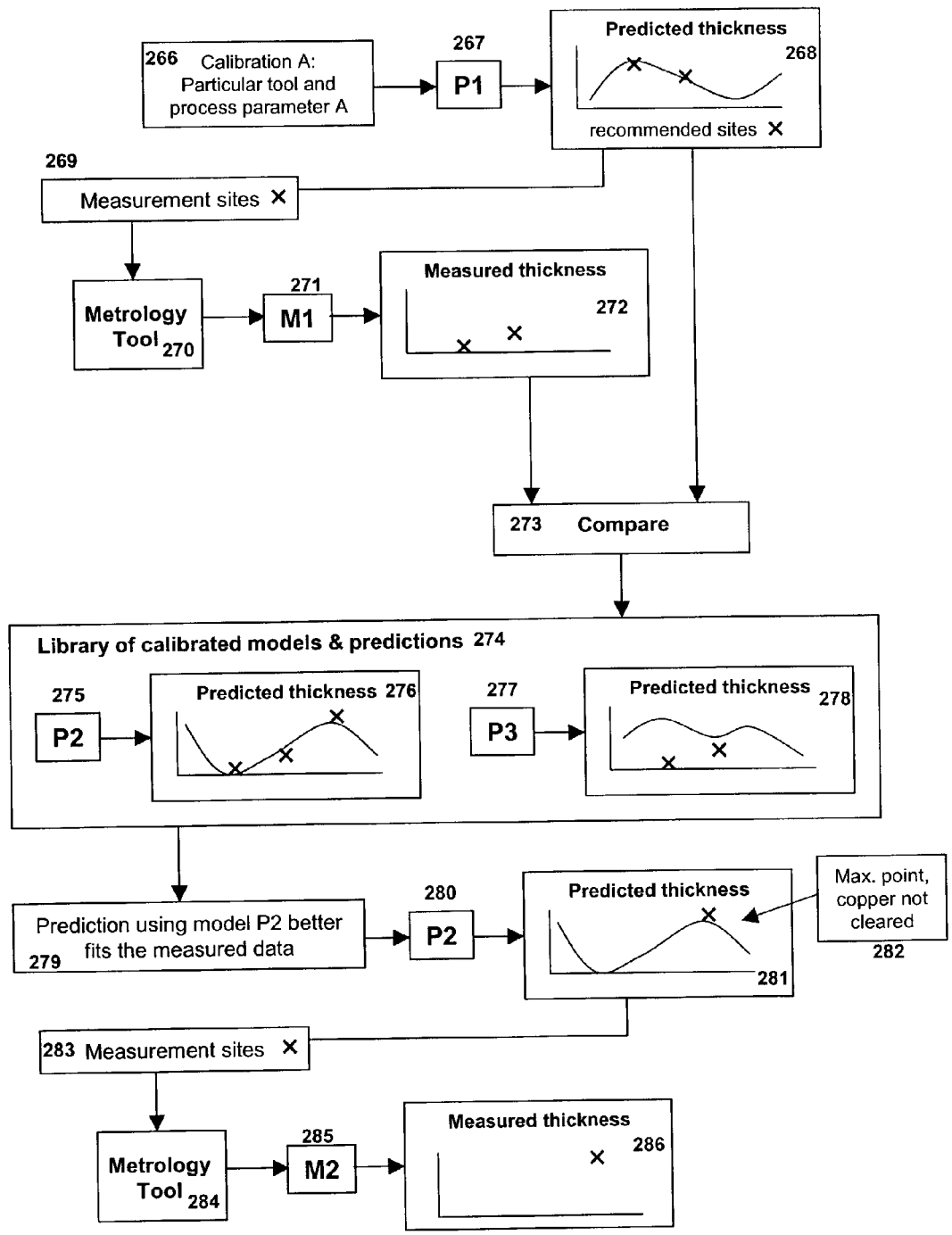

A more complete illustration of the robust approach is illustrated in FIG. 25. A calibrated model 266 is used to generate a full-chip prediction for one or more die 267. The predicted thickness 268 is used to recommend measurement sites 269 to a metrology tool 270. The measurements 271 are made and the measured thickness 272 is compared 273 with the predicted thickness 268. If the error is below some threshold then the calibrated model 266 is continually used to direct measurements. If the error is above some threshold, then the measured thickness 272 is compared to a library 274 of predicted thickness 276 and 278 for the same measurement sites but using other models 275 and 277 that have been calibrated for different process stages or recipes. This may be determined by least squares fit of the measured and predicted data sites or through some other mathematical or visual inspection method. The prediction that provides a best-fit 279 is used to generate a new prediction of the chip 280. Based upon the newly predicted chip topography, other maximum variation thickness sites may be selected 281. (For example, other areas are determined as likely locations where copper has not cleared 282.) The site or sites 283 are used to direct the metrology tool 284 to make a new measurement 285. The measured thickness 286 can be compared to the predicted thickness 281 to determine the validity of the model and whether further measurement may be necessary.

Figure 26A:
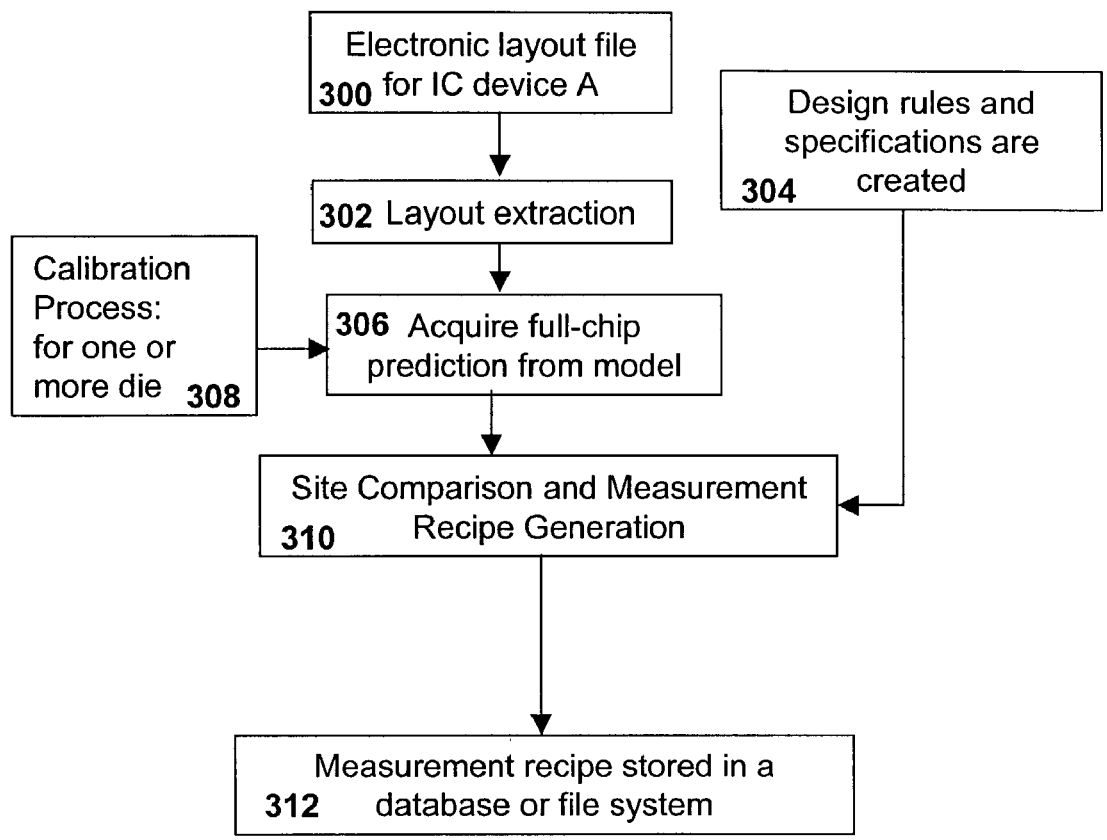
Figure 26B:
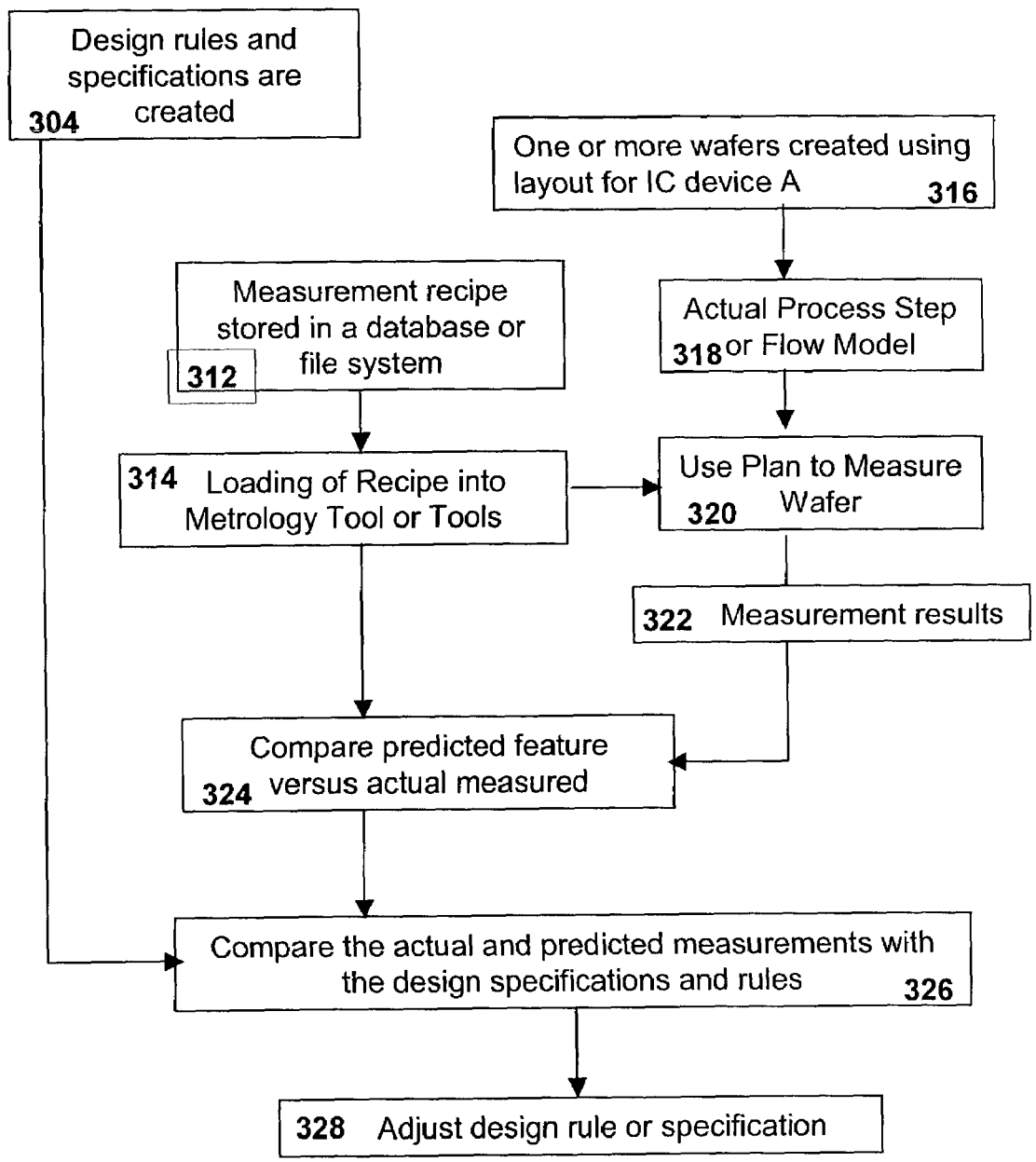

The approaches may also be used with IC related CAD software components to refine design rules based upon the physical measurement of film and electrical properties. Design rules for a new IC design are often extracted from test wafers and prior production devices. Since there is little or no prior manufacturing data for a new design, the control bands on design parameters are often conservative in nature (i.e. much larger than necessary to accommodate unknown variation). The approaches may be used to confirm or refine design rules for a newly manufactured device, as illustrated in FIGS. 26A and 26B. In this application, a new design is uploaded 300 to the system and layout extraction 302 is performed. The extracted parameters are input into calibrated 308 process and electrical models to acquire film thickness and electrical properties 306. These properties may be used alone or used within a more extensive circuit simulator to predict variation in circuit performance 306. The predicted parameters are compared 310 against current design rules 304 to determine those parameters well within the design rule bounds. The metric for determining how far within the design rule bounds a parameter must be to be selected for measurement may be selected by the user. For example, this metric may be a statistical threshold such as standard deviation.

The measurement sites and recipes are stored in the system database or file system 312. Those chip features or site locations well within design limits are selected for measurement to confirm the predicted values. These may be used in the same recipe as the sites where the variation exceeds the design rules, which may provide a distribution for one or more parameters (e.g. sheet resistance). The site locations are used to form a measurement recipe for one or more metrology tools. The measurement recipe is transferred 314 to in-line or in-situ metrology tool or tools (e.g. optical reflectance, profilometry or CD measurement equipment).

The device is physically processed (i.e. made) on the tools associated with the calibrated models used for prediction. Actual wafers are processed 318 with the IC layout for device A 316. In certain cases, more than one wafer is processed to acquire a statistical distribution of measured parameters. The measurement recipe 314 is used to measure the processed wafer or wafers 320. The measurements are transmitted to a component which evaluates whether the predicted physical and electrical parameters are supported by actual measurements. The measurement results 322 are compared 324 with the predicted features using the approach 324. If the measured results do not match the prediction, it is recommended that the procedures illustrated in FIGS. 24 and 25 be used to search for a better calibrated model within the system library to improve future predictions.

If the predicted parameters are confirmed, the measured parameters are compared to design rules and specifications 326. The results are used to adapt the design rules according to the predicted and measured variation to improve the performance or manufacturability of the device 328. The approach may also be used in this manner to modify design parameter control bands to provide designers with more flexibility for the measured device or future generations of similar devices.

Figure 27:
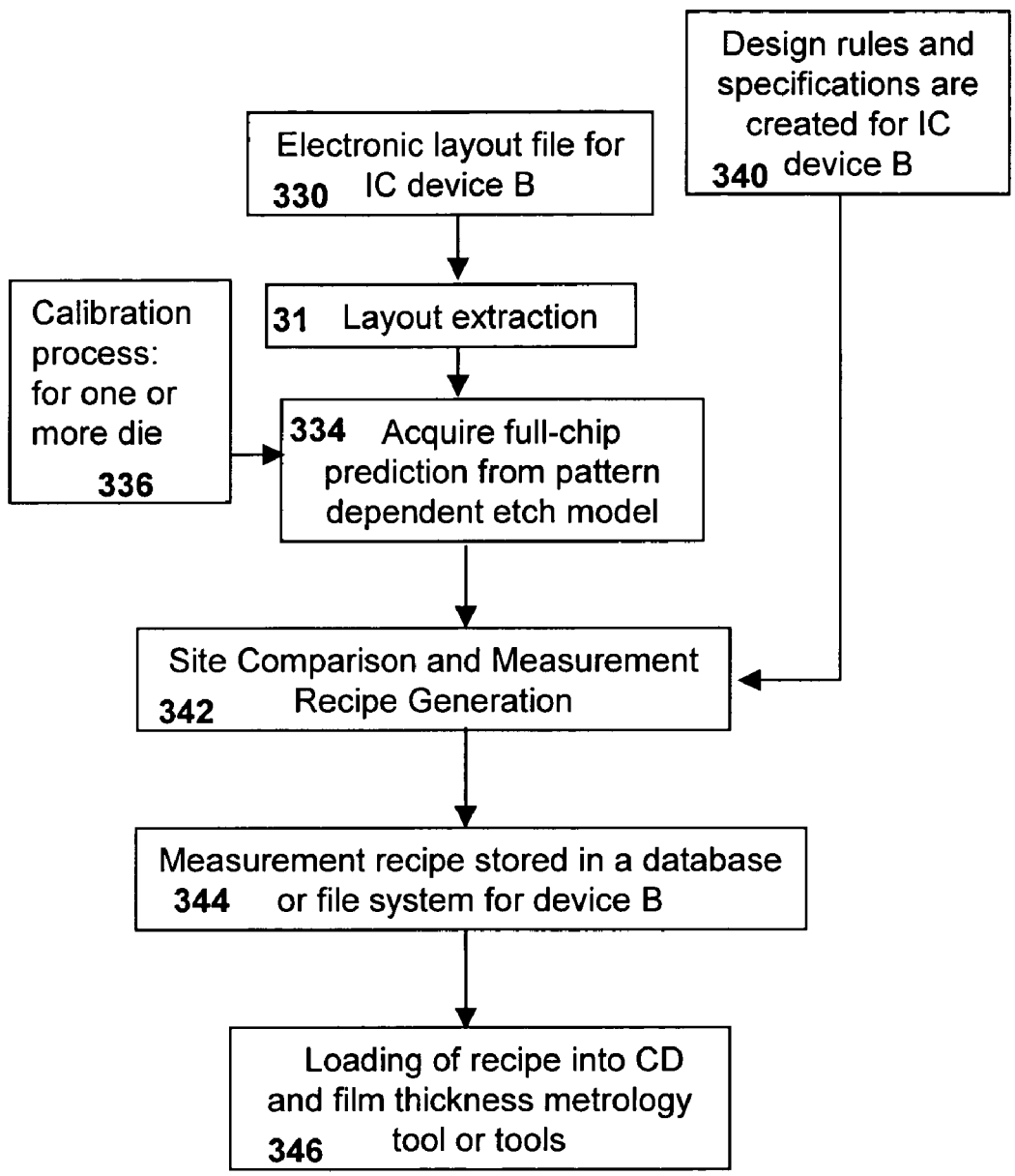

As stated earlier in this section, the approaches may be used to shape feedback control for a number of processes, in particular for damascene process flows. The following paragraphs and figures describe a few control implementations in more detail. This description begins with the application of the approach with pattern dependent etch models for generating measurement recipes for CD and film thickness tools. The process is similar to that described in FIG. 4 using pattern dependent plasma etch models. As shown in FIG. 27, the layout for a IC device is uploaded into the system 330. Layout extraction is performed to extract feature characteristics associated with etch pattern dependencies (e.g. trench width and depth, aspect ratio). These characteristics are used with a calibrated pattern dependent etch model 336 or a flow containing an etch process model. The full-chip topographical surface is acquired and may be used to compute the associated electrical characteristics as well 334. The design rules and specifications (e.g. CD requirements) for the device and wafer are uploaded 340 and compared 342 against the predicted chip and wafer parameters.

Based upon the comparison, the measurement recipe is generated. The metrics for which sites are selected are determined using heuristics and thresholds by the user. For example, one heuristic may only select for measurement those parameters that exceed the design parameters or are within some predefined distance from a design constraint. This heuristic is illustrated in FIGS. 11A and 11B. Another heuristic may also select sites where predicted parameters fall well within the design parameters and where an opportunity may exist to sharpen control bands within the design rules. This heuristic is described in the preceding paragraphs and in FIGS. 26A and 26B. The resulting measurement recipe is stored in a database or file system 344 and transmitted to the appropriate metrology equipment such as CD and film thickness measurement tools 346.

Figure 28A:
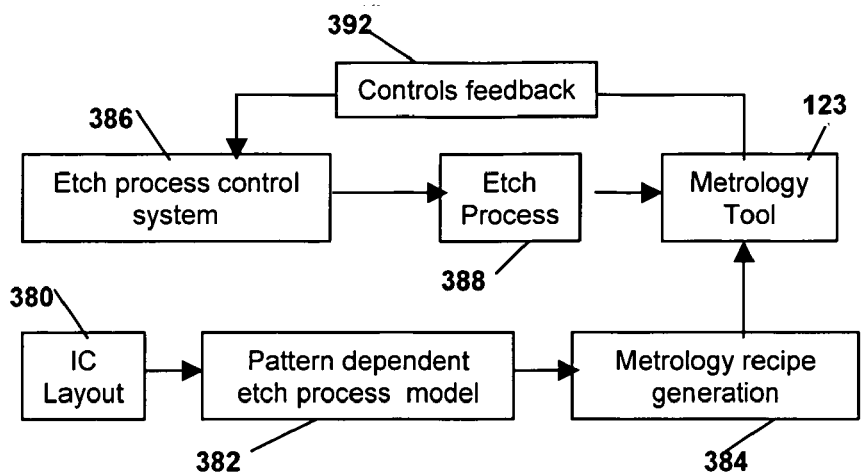

This same process is used in FIG. 28A to illustrate how the dynamic generation of measurement recipes can be used to determine the feedback for process control systems. In this application, the etch pattern dependent approach described in the prior paragraph 382 is used to generate a measurement recipe 384 for CD and film thickness metrology tools 390. The plasma etch process control system 386 supplies recipe settings (e.g. etch bias) for the etch tool 388. The metrology tool 390 uses the approach generated measurement recipe to measure sites on the chip and wafer. The measurement results which represent sites where chip features (e.g. aspect ratio) and wafer (e.g. endpoint uniformity) parameters are fed to the process control system 386. The controls feedback 392 may be the raw measurements or it could also be some aggregate statistic or calculation such as using a number of thickness measurements to compute a radial uniformity metric. The process control system 386 adjusts the recipe settings and updates the etch process tool 388.

Figure 28B:
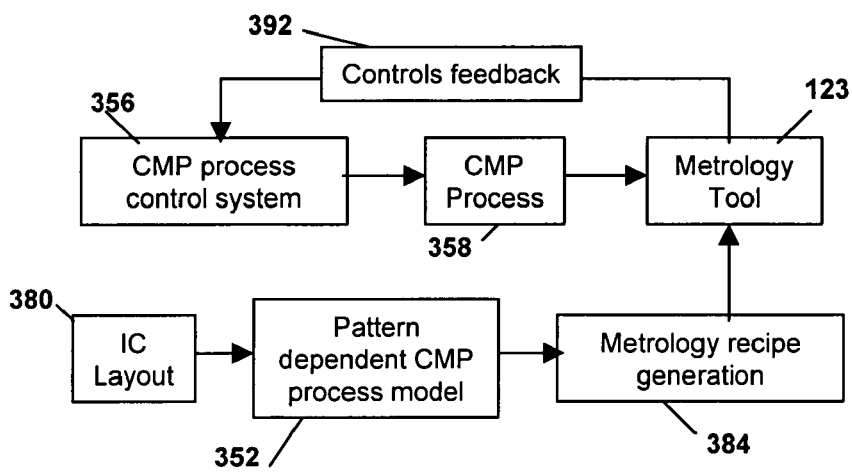

Similarly the approach can be used to shape feedback for control of CMP processes, as illustrated in FIG. 28B. In this application, a pattern-dependent CMP model or a model flow that may include ECD or HDP and CMP are used 352 to generate the metrology tool recipe 354. The CMP process control system generates a recipe that may include pressure, slurry flow rate or polish time. The CMP process polishes a wafer which is measured by the metrology tool 360 using the recipe 354. The metrology tool or tools 360 may include optical reflectance or profilometry. The measurements are used as controls feedback 362 to the process control system 356. For example, the approach may be used to predict film thickness within die or radially across the wafer, which could be used to adjust the polish time to achieve better clearing. Often in CMP, the process will polish the center of the wafer faster than the edge or vice-versa. CMP polish heads now allows for the radial pressure in the polishing head to be adjusted to compensate for this non-uniformity. The approaches could also be used to adjust radial pressure in CMP polishing head to compensate for non-uniformity where the metrology tool 360 could be an in-line or in-situ measurement of remaining film thickness.

Figure 28C:
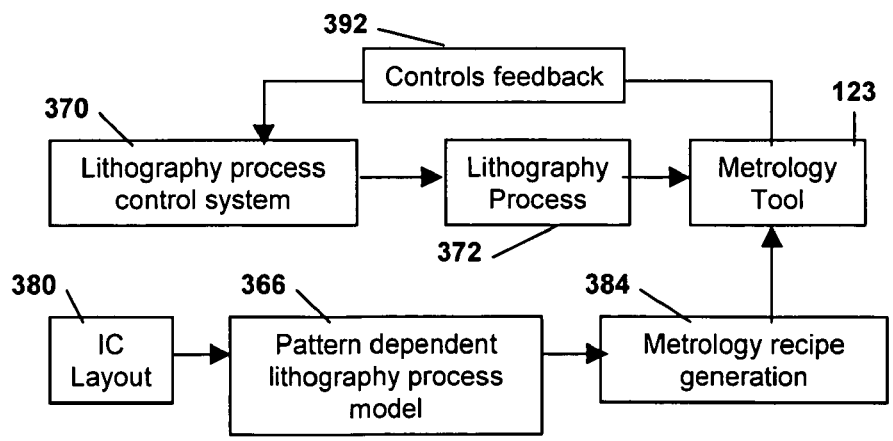

Similarly the approach can be used to shape feedback for control of CMP processes, as illustrated in FIG. 28C. In this application, a pattern-dependent lithography model (e.g. a model that characterizes the effects of feature density on resulting printed linewidth) is used 366. The approach is used to generate a metrology recipe 368 for the metrology tool 374. The lithography process control system changes exposure controls and steps 370 for the lithography process 372. Lithography is performed and the resulting wafer measured using the metrology tool 374. The measurements of printed line and feature dimensions are provided as controls feedback 376 to the lithography process control system 370 which adjusts the recipe for the lithography process.

The approaches may also be used to design test structures or devices for devices or relate predicted topography and features with test structures, in particular for designs where measurements are difficult to acquire. In this application, the approach is used to predict chip topography. The approach determines those chip features that result in the greatest variation away from the design specifications, as described in prior sections. These features can be used to design test structures or devices or direct the measurement tool to measure existing test structures or devices already on the chip.

Although some implementations have been described above, other implementations are also within the scope of the following claims.

The invention claimed is:

1. A computer-based method comprising
selecting sites to be measured on an integrated circuit that is to be fabricated using at least one fabrication process, the sites being selected based on:
(a) dimensional or geometric characteristics of features or patterns within an integrated circuit design for the integrated circuit, and
(b) at least one of topographic, thickness and width dimensions of features or patterns determined using a pattern-dependent model that characterizes interactions between (i) the dimensional or geometric characteristics of features or patterns within the integrated circuit design and (ii) dimensional or geometric characteristics of features or patterns within the integrated circuit that would result from using the at least one fabrication process.

2. A computer-based method comprising
selecting sites to be measured on an integrated circuit that is to be fabricated using at least one fabrication process, the sites being selected based on:
(a) dimensional or geometric characteristics of features or patterns within an integrated circuit design, and
(b) at least one of topographic, thickness and width dimensions of features or patterns determined using a pattern-dependent model that characterizes interactions between (i) the dimensional or geometric characteristics of features or patterns within an integrated circuit design and (ii) dimensional or geometric characteristics of features or patterns within an integrated circuit that would result from using the at least one fabrication process, and
(c) analysis of the electrical impact of the determined features or patterns in the integrated circuit design.

3. The method of claim 1 also including selecting the sites based on an electrical impact analysis of the process.

4. The method of claim 1 in which the process comprises chemical mechanical polishing.

5. The method of claim 1 in which the selecting of sites is based on a measurement strategy.

6. The method of claim 1 in which the selected sites are part of a measurement recipe.

7. The method of claim 1 in which the selected sites correspond to a measurement strategy.

8. The method of claim 1 in which the process comprises electrical chemical deposition.

9. The method of claim 1 in which the process comprises two or more stages.

10. The method of claim 9 in which the two or more stages comprise two or more processes.

11. The method of claim 9 in which the two or more stages comprise two or more steps of a single process.

12. The method of claim 9 in which the two or more stages comprise deposition and chemical mechanical polishing.

13. The method of claim 9 in which the selected sites include within-die and die-to-die measurement sites within a single wafer.

14. The method of claim 9 in which one of the two or more stages comprises lithography.

15. The method of claim 9 in which one of the two or more stages comprises plasma etch.

16. The method of claim 1 also including
using patterned test wafers or test semiconductor devices to calibrate the model with respect to a preselected tool or process recipe.

17. The method of claim 1 in which the -model determined dimensions include at least one of: resulting film thickness, film thickness variation, dishing, or erosion.

18. The method of claim 2 in which the analysis of electrical impact includes at least one of sheet resistance, resistance, capacitance, crosstalk noise, voltage drop, drive current loss, dielectric constant, and effective dielectric constant.

19. The method of claim 1 or 2 also comprising
using a cost function to determine which sites to measure.

20. The method of claim 1 or 2 in which the selection of sites is based on more than one pattern-dependent model of a fabrication process,
the multiple models including at least one of (a) models of the fabrication process calibrated to multiple die across a wafer, and (b) models of multiple fabrication processes that combine to produce pattern-dependent variation within an integrated circuit and are calibrated to the same die location on the wafer.

21. The method of claim 19 also comprising
using the cost function to select sites to measure an impact of dummy fill.

22. The method of claim 1 or 2 also comprising
at an internet server, receiving from a client a layout file and design specifications for the integrated circuit,
selecting the sites at the server, and
returning information identifying the selected sites from the server to the client.

23. The method of claim 1 or 2 also comprising
making available to a user on a network a service that enables the user to cause the selection of sites with respect to a semiconductor design, a fabrication process, and a metrology device.

24. The method of claim 1 in which the sites are selected with respect to a single interconnect level of the integrated circuit.

25. The method of claim 1 in which a measurement plan is generated with respect to multiple interconnect levels of the integrated circuit.

26. The method of claim 1 in which the integrated circuit comprises at least one of a semiconductor wafer or a semiconductor chip within a wafer.

27. The method of claim 1 or 2 in which the selecting of sites includes using dummy fill objects to improve a structural integrity of low-K dielectric features.

28. The method of claim 1 or 2 in which the selecting of sites includes using dummy fill objects to maintain or improve an effective dielectric constant of low-K dielectric features.

29. The method of claim 27 in which an effective dielectric constant is maintained through all steps of a damascene process flow.

30. The method of claim 28 in which the effective dielectric constant is maintained through all steps of a damascene process flow.

31. The method of claim 1 or 2 in which the selecting of sites includes using dummy fill objects to facilitate integration of low-k dielectric materials into a damascene process flow.

32. The method of claim 1 or 2 also comprising
maintaining a library of sites,
making the library available for use in connection with generating measurement strategies, and
updating the library with respect to new or improved metrology tools.

33. The method of claim 1 or 2 also comprising
storing calibration information with respect to at least one of the following: process tools, recipes, and flows, and
updating the calibration information to reflect changes in the process tools, recipes or flows.

34. The method of claim 1 or 2 also comprising enabling a user to select sites for a integrated circuit using a single click of a user interface device through a user interface.

35. The method of claim 1 or 2 also comprising
enabling a user to obtain selection of sites for a integrated circuit using an internet connection using web services.

36. The method of claim 1 or 2 also comprising
making available to a user on a network a service that enables the user to verify sites with respect to the integrated circuit and a fabrication process or flow.

37. The method of claim 1 or 2 in which the sites are selected to characterize variation in electrical parameters.

38. The method of claim 37 in which the electrical parameters comprise at least one of sheet resistance, resistance, capacitance, crosstalk noise, voltage drop, drive current loss, and effective dielectric constant.

39. The method of claims 1 or 2 also including
extracting pattern dependencies from a layout of the integrated circuit.

40. The method of claim 39 in which the pattern dependencies include dependencies with respect to at least one of the following dimensions or geometric characteristics: line spacing, line width or line density.

41. The method of claim 1 or 2 also including using the selected sites to provide feedback to a process control system or a recipe synthesis tool.

42. The method of claim 1 or 2 in which the sites are selected for a semiconductor die.

43. The method of claim 1 or 2 in which the sites are selected for one or more die within a wafer.

44. The method of claim 1 or 2 in which the sites are selected for one or more wafers within a lot.

45. The method of claim 1 or 2 in which the sites are selected for one or more lots within a production run.

46. The method of claim 1 or 2 in which the computer-based method used to select sites is embedded within or bundled with a metrology tool.

47. The method of claim 1 or 2 in which the sites are selected for use with a process control system.

48. The method of claim 1 or 2 in which the selected sites are electronically or optically communicated to the process or a metrology tool across an extranet network, intranet network, internet network or a virtual private network.

49. The method of claim 1 or 2 in which the sites are selected based on criteria for electrical parameter variation tolerances for at least one of the following: capacitance and resistance, sheet resistance, outputs delay, skew, voltage drop, drive current loss, dielectric constant or crosstalk noise.

50. The method of claim 1 or 2 in which the sites are selected based on criteria for wafer parameter variation tolerances for at least one of the following: film thickness, dishing and erosion.

51. A machine-based method comprising
selecting measurement sites for an entire semiconductor chip, the sites being selected based upon a pattern-dependent model for a single interconnect level of the chip, the pattern-dependent model characterizing a relationship between dimensional and geometric features and patterns within an integrated circuit design and dimensional and geometric features within an integrated circuit that would result from at least one fabrication process.

52. A machine-based method comprising selecting measurement sites for an entire semiconductor chip, the sites being selected based upon a pattern-dependent model for multiple interconnect levels of the chip, the pattern-dependent model characterizing a mapping among:

(a) dimensional and geometric features and patterns within an integrated circuit design, (b) dimensional and geometric features and patterns in at least one interconnect level within the integrated circuit that result from at least one fabrication process, and (c) dimensional and geometric features and patterns in at least one other interconnect level that result from at least one fabrication process.

53. A method comprising measuring wafer-state parameters in an integrated circuit during fabrication in accordance with a measurement plan that is based on a pattern-dependent model characterizing an interaction between dimensional and geometric features and patterns within an integrated circuit design and dimensional and geometric features and patterns that would result from a fabrication process, and verifying predicted variations in wafer-state parameters during fabrication, the wafer-state parameters including at least one of: minimum and maximum film thickness variation and minimum and maximum critical dimension variation within a specified area or block.

54. The method of claim 53 also including verifying predicted variations in electrical parameters during fabrication, the electrical parameters including at least one of the following parameters: capacitance and resistance, sheet resistance, outputs delay, skew, voltage drop, drive current loss, dielectric constant or crosstalk noise.

55. A machine-based method comprising measuring a device that has been subjected to a chemical mechanical polishing process in accordance with a measurement plan that is based on a pattern-dependent model, and identifying areas of the device in which the chemical mechanical polishing process resulted in incomplete removal of material, the pattern-dependent model characterizing the interaction between dimensional and geometric features and patterns within an integrated circuit design and the dimensional and geometric features and patterns that result from a fabrication process.

56. A method comprising measuring a semiconductor device in accordance with a measurement plan that is based on a pattern-dependent model of a process in order to identify characteristics of residual copper remaining on the device after processing, and using results of the measurement as feedback to a process control system, the pattern-dependent model characterizing the interaction between dimensional and geometric features and patterns within an integrated circuit design and dimensional and geometric features and patterns on an integrated circuit that result from a fabrication process.

57. A machine-based method comprising measuring a semiconductor device in accordance with a measurement plan that is based on a pattern-dependent model in order to identify characteristics of residual copper remaining on the device after processing, and using results of the measurement as feedback to a process for recipe synthesis, the pattern-dependent model characterizing the interaction between dimensional and geometric features and patterns within an integrated circuit design and dimensional and geometric features and patterns within an integrated circuit that result from a fabrication process.

58. The method of claim 1 in which the sites are selected as part of an automatic generation of a measurement plan, a measurement recipe, or a sample plan for metrology equipment.

59. The method of claim 58 in which the metrology equipment comprises optical metrology equipment.

60. The method of claim 58 in which the metrology equipment comprises profilometry metrology equipment.

61. The method of claim 58 in which the metrology equipment comprises electrical probe metrology equipment.

62. The method of claim 58 in which the metrology equipment comprises in-situ or in-line metrology equipment within cluster tools or stations.

63. The method of claim 62 also including enabling feedback process control within the cluster tools or stations.

64. The method of claim 1 in which the sites are to be measured in at least one of in-line metrology, in-situ metrology, or off-line metrology.

65. The method of claim 1 in which the process comprises part of a damascene process flow.

66. The method of claim 1 in which the process comprises introduction of low-k materials into a damascene process flow.

67. The method of claim 1 in which the process comprises introduction of low-k inter-level dielectric (ILD) materials into a damascene process flow.

68. The method of claim 1 in which the process includes use of dummy fill to improve structural properties of low-k inter-level dielectric (ILD) materials.

69. The method of claim 2 in which the electrical impact analysis comprises assessment of effective dielectric constant.

70. The method of claim 1 in which the sites are selected to characterize pattern dependencies in a plasma etch process or tool.

71. The method of claim 1 in which the sites are selected to characterize IC pattern dependencies in a lithography process or tool.

72. The method of claim 1 in which the sites are selected to characterize IC pattern dependencies in a chemical mechanical polishing process or tool.

73. The method of claim 1 in which the sites are selected to characterize IC pattern dependencies in a formation of interconnect structures.

74. A machine-based method comprising selecting sites to be measured on a semiconductor device that is being fabricated, measuring the sites, the sites being selected based on a pattern-dependent model of a process;

rejecting the device if the result of the measuring at least one of the site indicates that the device does not meet a requirement, selecting other sites to be measured on the semiconductor device, the sites being selected based on a pattern-dependent model of a process;

measuring the other sites, and rejecting the device if the result of the measuring at least one of the other sites indicates that the device does not meet a requirement, the pattern-dependent model characterizing the interaction between dimensional and geometric features and patterns within an integrated circuit design and dimensional and geometric features and patterns within an integrated circuit that result from a fabrication process.

75. The method of claim 74 also including repeating the steps of selecting other sites, measuring other sites, and rejecting the devices if the result of the measuring of the other sites.

76. The method of claim 74 in which the measuring the sites is performed in-line with respect to a processing step.

77. The method of claim 74 in which the measuring the sites is performed in-situ with respect to a processing step.

78. The method of claim 74 in which the measuring the sites is performed off-line with respect to a processing step.

79. The method of claim 74 in which the selecting sites is done by software included within a metrology tool.

80. The method of claim 74 in which the model is calibrated with respect to a particular tool for the process.

81. The method of claim 74 in which the model incorporates variation of the process over time, and the selecting sites is based on the model configured for a time associated with the time when the measuring of sites is to be done.

82. The method of claim 1 in which the sites are selected at a die level.

83. The method of claim 1 in which the sites are selected at a wafer level.

84. A machine-based method comprising selecting sites to be measured on a device that is to be fabricated using at least one fabrication process, the process including clearing of material from a surface of the device, the sites being selected based on a pattern-dependent model of the process to test whether clearing has occurred within an acceptable tolerance, the pattern-dependent model characterizing the interaction between dimensional and geometric features and patterns within an integrated circuit design and dimensional and geometric features and patterns within an integrated circuit that result from a fabrication process.

85. The method of claim 84 in which the process includes polishing and the acceptable tolerance includes clearance without overpolishing.

86. The method of claim 1 also including controlling a metrology tool in response to the selecting.

87. The method of claim 86 in which the metrology tool comprises a optical reflectance, CD, profilometry, acoustic or eddy current metrology tool.

88. The method of claim 1 also including characterizing full-chip or wafer-level parametric yield using measurements.

89. The method of claim 1 in which the sites are selected based oil minimum or maximum features that may violate design specifications of the device.

90. The method of claim 84 also including enabling feedback to adapt settings or recipe parameters in a chemical mechanical polishing tool.

91. The method of claim 84 also including enabling feedback to adapt settings or recipe parameters in an electrical chemical mechanical deposition tool or a flow including an electrical chemical mechanical deposition tool.

92. The method of claim 84 also including enabling feedback to adapt differential pressures in a chemical mechanical polishing tool head.

93. The method of claim 84 also including enabling feedback to adapt recipe parameters in a process step.

94. The method of claim 84 also including enabling feedback to synthesize recipe parameters in a process flow.

95. The method of claim 1 also including enabling a comparison and selection among best-known process methods and consumables.

96. The method of claim 1 also including enabling feedback to adapt settings or recipe parameters for a plasma etch process tool or a flow including a plasma etch tool.

97. A machine-based method comprising measuring a semiconductor device in accordance with a measurement plan that is based on a plasma etch pattern-dependent model in order to identify critical dimensions of IC features, the pattern-dependent model characterizing the interaction between dimensional and geometric features and patterns within an integrated circuit design and dimensional and geometric features and patterns within an integrated circuit that result from a fabrication process, the geometric features including but not limited to: critical dimensions, trench width, trench depth, and aspect ratio.

98. The method of claim 1 in which the pattern-dependent model maps pattern dependent features to wafer-state parameters that include at least one of resulting critical dimension (CD), film thickness, aspect ratio or trench width or trench depth.

99. The method of claim 1 also including enabling feedback to adapt settings or recipe parameters for a lithography tool or a flow including a lithography tool.

100. The method of claim 1 also including enabling an adjustment of design rules, design specifications or control bands.

101. The method of claim 1 also including enabling a design of test structures or devices.

102. The method of claim 1 also including enabling a correlation of chip parameters with existing test structures or devices.

* * * * *